(12) United States Patent
Hayashi et al.

(10) Patent No.: US 10,056,402 B2
(45) Date of Patent: Aug. 21, 2018

(54) SEMICONDUCTOR DEVICE

(71) Applicant: Renesas Electronics Corporation, Koutou-ku, Tokyo (JP)

(72) Inventors: Tomohiro Hayashi, Tokyo (JP); Hiraku Chakihara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/669,814

(22) Filed: Aug. 4, 2017

(65) Prior Publication Data

US 2018/0097008 A1    Apr. 5, 2018

(30) Foreign Application Priority Data

Sep. 30, 2016  (JP) ................................ 2016-192874

(51) Int. Cl.
| | | |
|---|---|---|
| *H01L 27/11568* | (2017.01) | |
| *H01L 27/11573* | (2017.01) | |
| *H01L 29/78* | (2006.01) | |
| *H01L 29/423* | (2006.01) | |

(52) U.S. Cl.
CPC .. *H01L 27/11568* (2013.01); *H01L 27/11573* (2013.01); *H01L 29/42344* (2013.01); *H01L 29/785* (2013.01)

(58) Field of Classification Search
CPC ......... H01L 27/11568; H01L 27/11573; H01L 29/42344; H01L 29/785
See application file for complete search history.

(56) References Cited

U.S. PATENT DOCUMENTS

| | | | |
|---|---|---|---|
| 7,504,689 B2 | 3/2009 | Hisamoto et al. | |
| 7,863,131 B2 | 1/2011 | Yasui et al. | |
| 2010/0065917 A1* | 3/2010 | Ohta | ..................... H01L 21/845 257/369 |
| 2014/0001572 A1* | 1/2014 | Bohr | ................. H01L 21/82382 257/401 |

FOREIGN PATENT DOCUMENTS

| | | |
|---|---|---|
| JP | 2006-041354 A | 2/2006 |
| JP | 2006-054292 A | 2/2006 |

* cited by examiner

*Primary Examiner* — Stephen Bradley
*Assistant Examiner* — Patricia Reddington
(74) *Attorney, Agent, or Firm* — Shapiro, Gabor and Rosenberger, PLLC

(57) ABSTRACT

Improvements are achieved in the characteristics of a non-volatile memory. In plan view, in a first isolation region which is an element isolation region surrounded by a first fin, a second fin, a memory gate electrode, and another memory gate electrode, a protruding portion is provided. In a second isolation region which is the element isolation region overlapping the memory gate electrode in plan view, a second isolation portion is provided to set the protruding portion higher in level than the second isolation portion. In a step of lowering a top surface of the element isolation region located between the first and second fins, a part of the element isolation region located between the first and second fins is covered with a mask film to form the protruding portion. Using the protruding portion, a short circuit between the memory gate electrodes due to a gate residue is prevented.

20 Claims, 58 Drawing Sheets

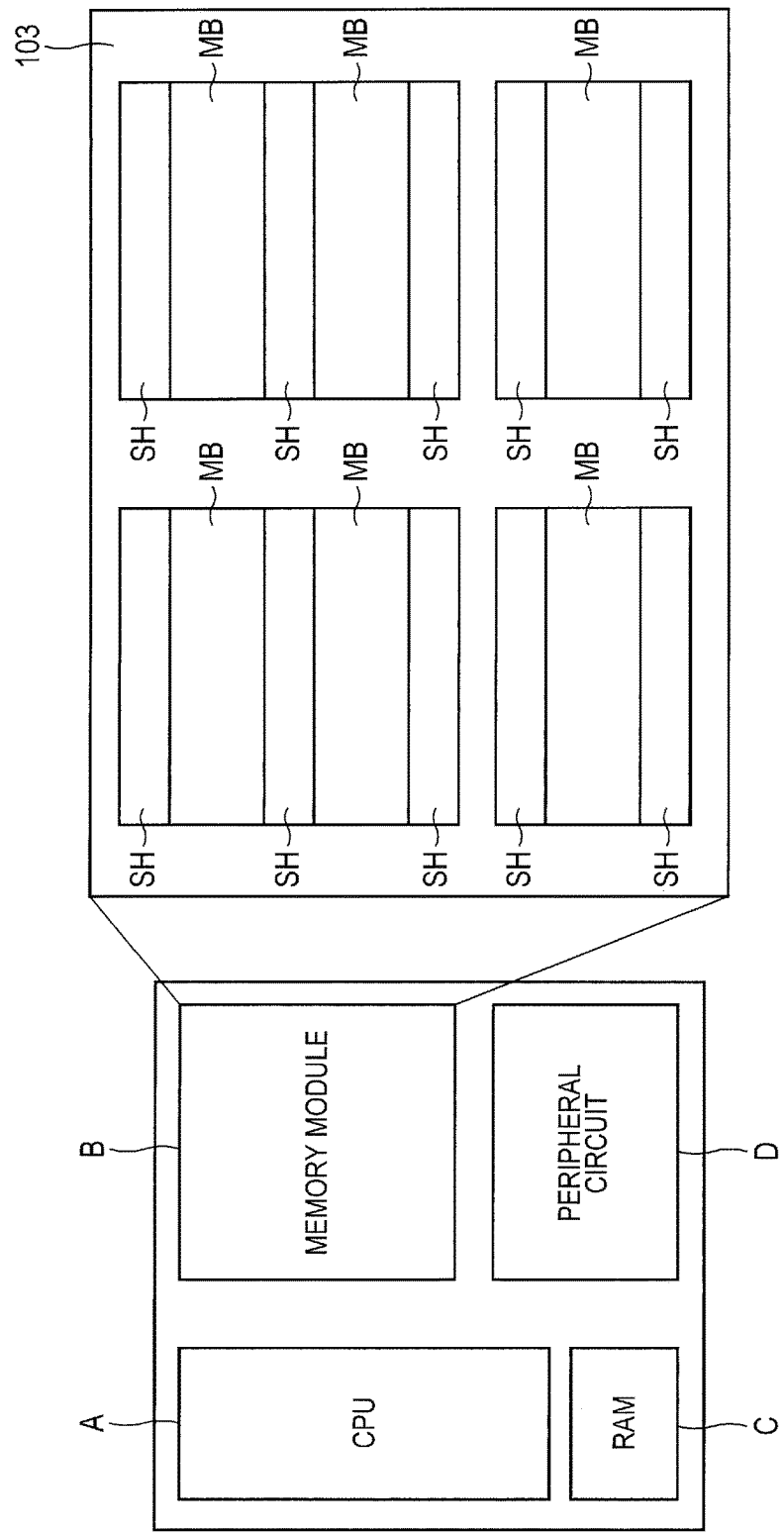

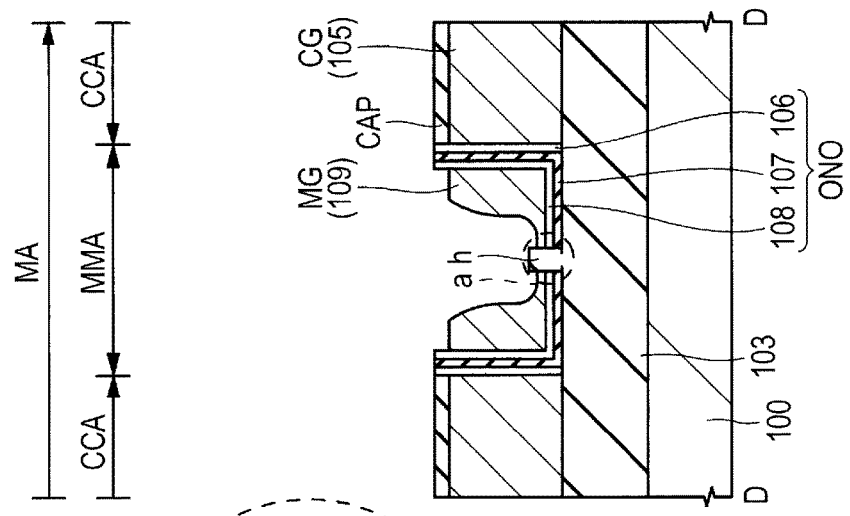
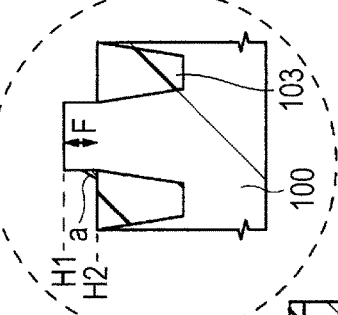
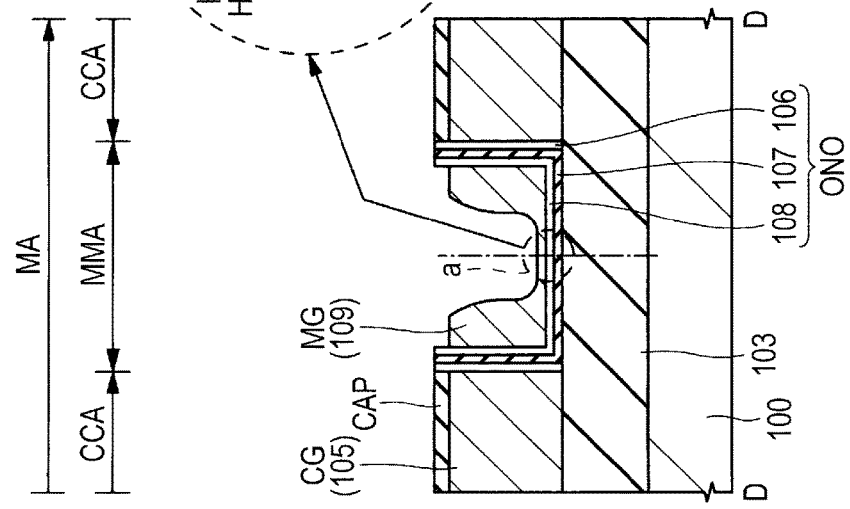

SEMICONDUCTOR DEVICE

CROSS-REFERENCE TO RELATED APPLICATIONS

The disclosure of Japanese Patent Application No. 2016-192874 filed on Sep. 30, 2016 including the specification, drawings and abstract is incorporated herein by reference in its entirety.

BACKGROUND

The present invention relates to a semiconductor device and can be used appropriately for a semiconductor device having, e.g., a FINFET.

In recent years, in an LSI (Large Scale Integration) using silicon, the sizes of MISFETs (Metal Insulator Semiconductor Field Effect Transistors) as the components thereof, especially the gate lengths of gate electrodes have been increasingly reduced. The size reduction of MISFETs has been pursued in accordance with the scaling law. However, as the generations of devices have passed on, various problems have been encountered, and it has become difficult to simultaneously suppress a short-channel effect in a MISFET and ensure a current driving force therefor. Accordingly, research and development on devices with novel structures which may replace conventional planar (plane-type) MISFETs has been actively promoted.

A FINFET is one of the above-mentioned devices with novel structures and uses the side surfaces of a FIN (active region) as channels to have an improved current driving force.

On the other hand, as one of nonvolatile memories, there is a memory cell made of a split-gate cell using a MONOS (Metal-Oxide-Nitride-Oxide-Semiconductor) film. The memory cell includes two MISFETs which are a control transistor having a control gate electrode and a memory transistor having a memory gate electrode. By applying a FIN structure also to these transistors, it is possible to improve the characteristics of the memory.

Japanese Unexamined Patent Publication No. 2006-41354 (Patent Document 1) discloses a technique in which, in a nonvolatile semiconductor device having a split-gate structure, a memory gate is formed over a protruding substrate and the side surfaces thereof are used as channels.

Japanese Unexamined Patent Publication No. 2006-54292 (Patent Document 2) discloses split-gate memory cells each having a selection transistor and a memory transistor and a technique which physically spaces the selection gate electrodes apart from each other over an isolation insulating film, forms an auxiliary pattern between the selection gates spaced apart from each other, and leaves sidewall electrodes between the auxiliary pattern and the selection gate electrodes. The sidewall electrodes are used to supply power to the memory gate electrodes.

RELATED ART DOCUMENTS

Patent Documents

[Patent Document 1]
Japanese Unexamined Patent Publication No. 2006-41354
[Patent Document 2]
Japanese Unexamined Patent Publication No. 2006-54292

SUMMARY

The present inventors have been engaged in the research and development of a semiconductor device having a nonvolatile memory cell as described above and have studied about further improvements achieved in the characteristics of the memory cell by using the foregoing FIN structure. In the process of the study, the present inventors have found that, to use a FIN structure for a nonvolatile memory cell, there is room for further improvements in the structure and manufacturing method thereof.

In particular, between gate electrodes traversing a fin as the protruding portion of a semiconductor substrate, a short circuit between the gate electrodes due to a residue resulting from gate processing presents a problem. To avoid such a problem, it is desired to conduct a study on the structure and manufacturing method of a memory cell.

Other problems and novel features of the present invention will become apparent from a statement in the present specification and the accompanying drawings.

The following is a brief description of the outline of a representative one of the embodiments disclosed in the present application.

A semiconductor device shown in the embodiment disclosed in the present application has a first isolation portion provided in a first isolation region as an element isolation region which is surrounded by a first fin, a second fin, a first gate electrode, and a second gate electrode. In plan view, the first isolation portion is higher in level than a second isolation portion provided in a second isolation region as the element isolation region which overlaps the first gate electrode in plan view.

The semiconductor device shown in the representative embodiment disclosed in the present application can have improved characteristics.

BRIEF DESCRIPTION OF THE DRAWINGS

FIG. 7 is a block diagram showing an example of the configuration of the semiconductor device in Embodiment 1;

FIGS. 8A and 8B are cross-sectionals view showing the configuration of the semiconductor device in Embodiment 1 and a configuration of a semiconductor device in a comparative example;

DETAILED DESCRIPTION

Figure 1:
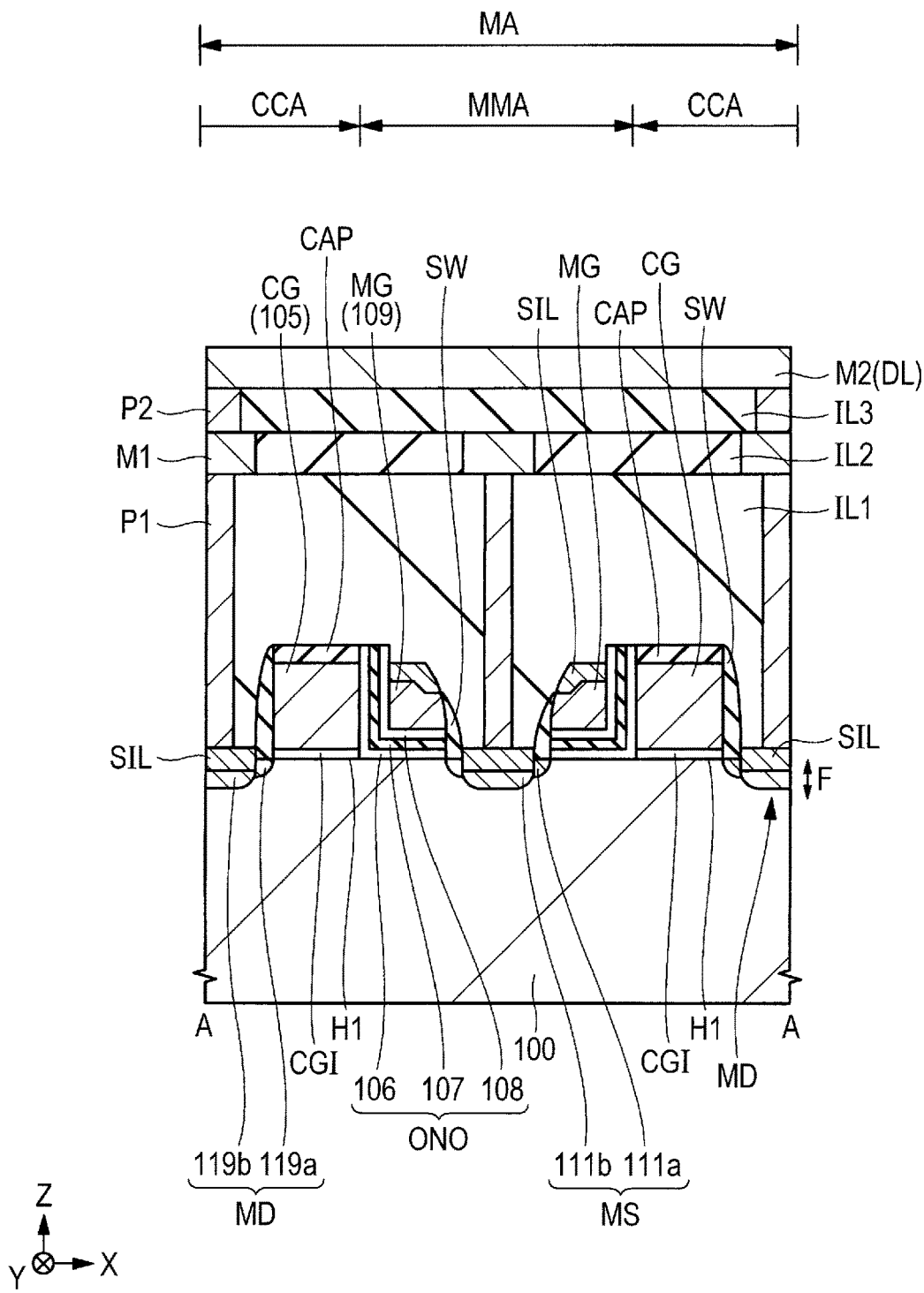
FIG. 1 is a cross-sectional view showing a configuration of a semiconductor device in Embodiment 1.
Figure 2:
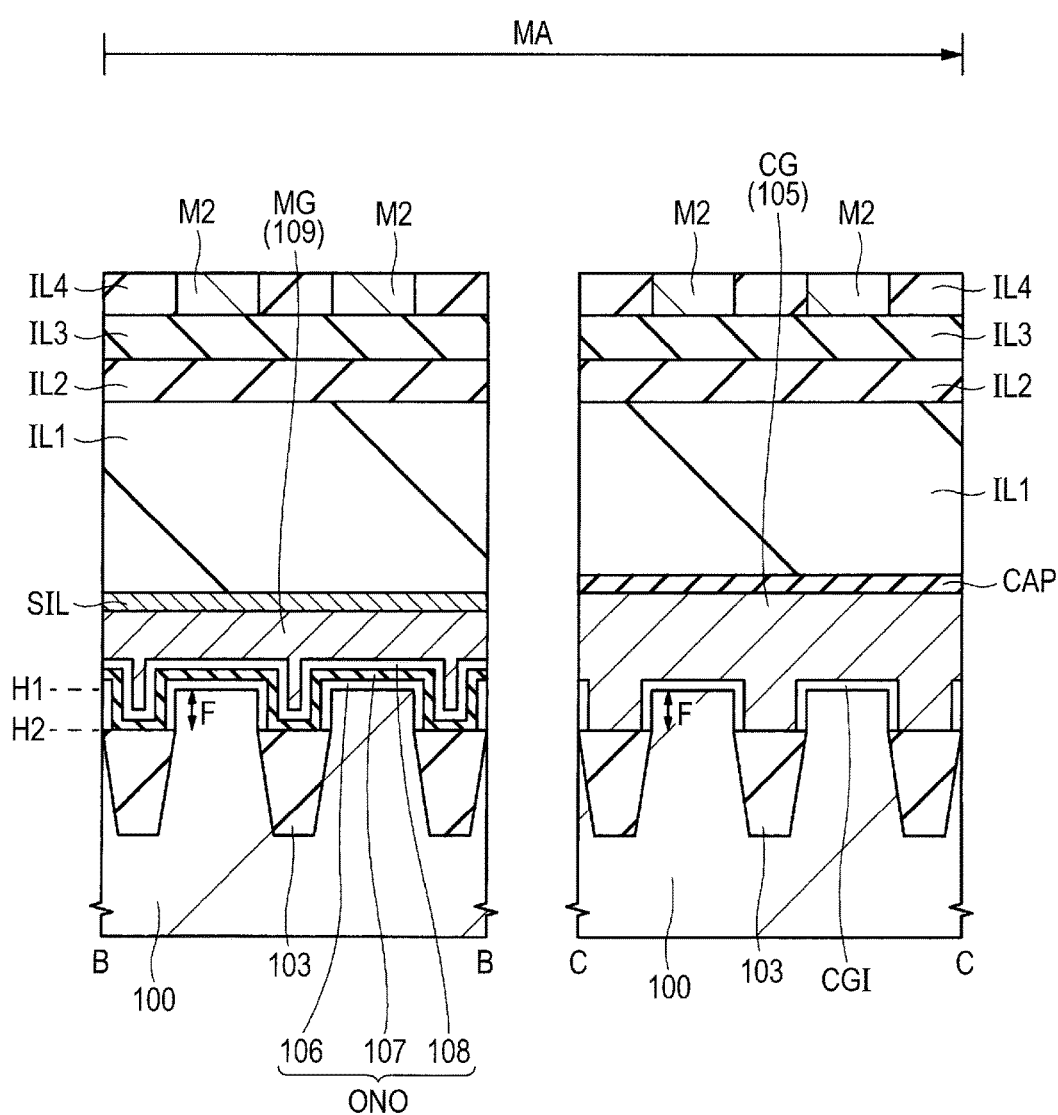
FIG. 2 is a cross-sectional view showing the configuration of the semiconductor device in Embodiment 1.
Figure 3:
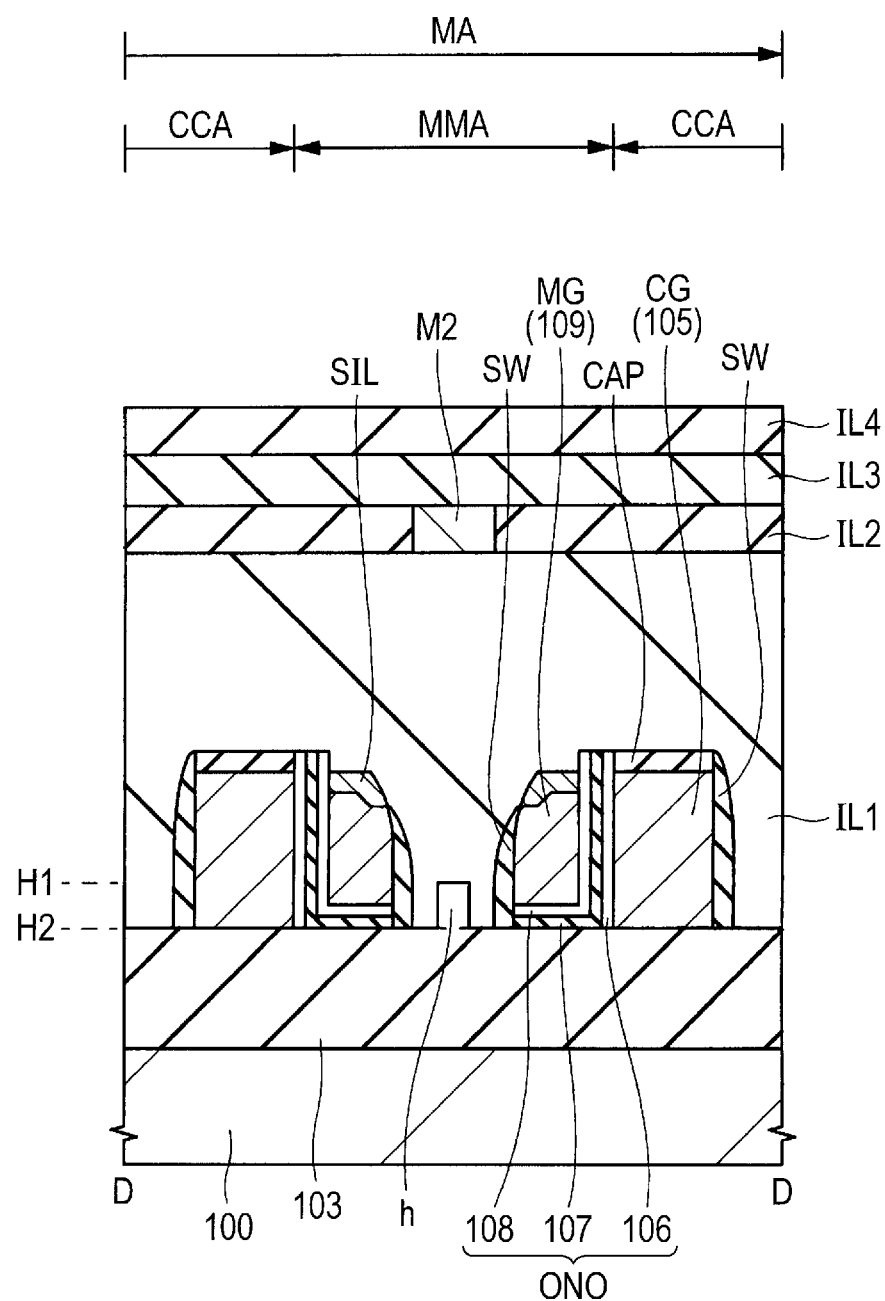
FIG. 3 is a cross-sectional view showing the configuration of the semiconductor device in Embodiment 1.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, an application example, a detailed description, a supplementary description, and so forth of part or the whole of the others. Also, in the following embodiments, when the number and the like (including the number, numerical value, amount, range, and the like) of elements are mentioned, they are not limited to specific numbers unless particularly explicitly described otherwise or unless they are obviously limited to specific numbers in principle. The number and the like of the elements may be not less than or not more than specific numbers.

Also in the following embodiments, the components thereof (including elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes and the like are assumed to include those substantially proximate or similar thereto and the like unless particularly explicitly described otherwise or unless it can be considered that they obviously do not in principle. The same shall apply in regard to the foregoing number and the like (including the number, numerical value, amount, range, and the like).

Hereinbelow, the embodiments will be described in detail on the basis of the drawings. Note that, throughout all the drawings for illustrating the embodiments, members having the same functions are designated by the same or related reference numerals, and a repeated description thereof is omitted. When there are a plurality of similar members (portions), marks may be added to general reference numerals to show individual or specific portions. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

In a cross-sectional view and a plan view, the sizes of individual portions do not correspond to those in a real device. For improved clarity of illustration, a specific portion may be shown in a relatively large size. Even when the cross-sectional view corresponds to the plan view, for improved clarity of illustration, a specific portion may be shown in a relatively large size.

Embodiment 1

[Description of Structure]

Referring to the drawings, the following will describe a structure of a semiconductor device (semiconductor storage device) in Embodiment 1. The semiconductor device in Embodiment 1 has memory cells (memory transistors or control transistors) formed in a memory cell region MA. The transistors mentioned herein may be referred to also as MISFETs.

(Description of Structure of Memory Cell)

Figure 4:
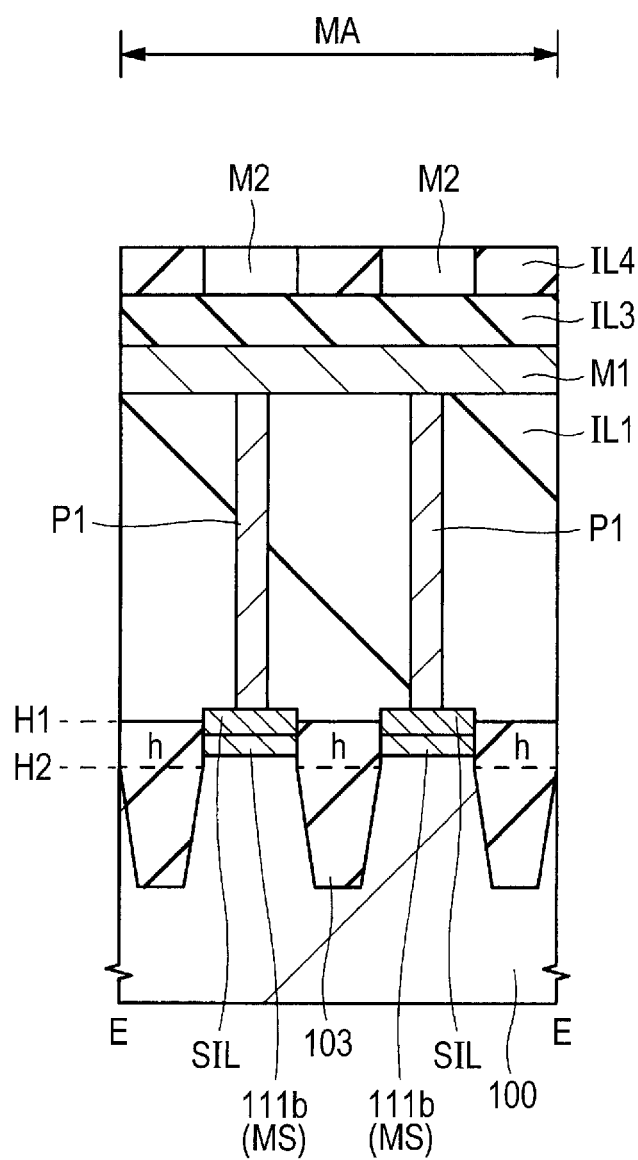
FIG. 4 is a cross-sectional view showing the configuration of the semiconductor device in Embodiment 1.
Figure 5:
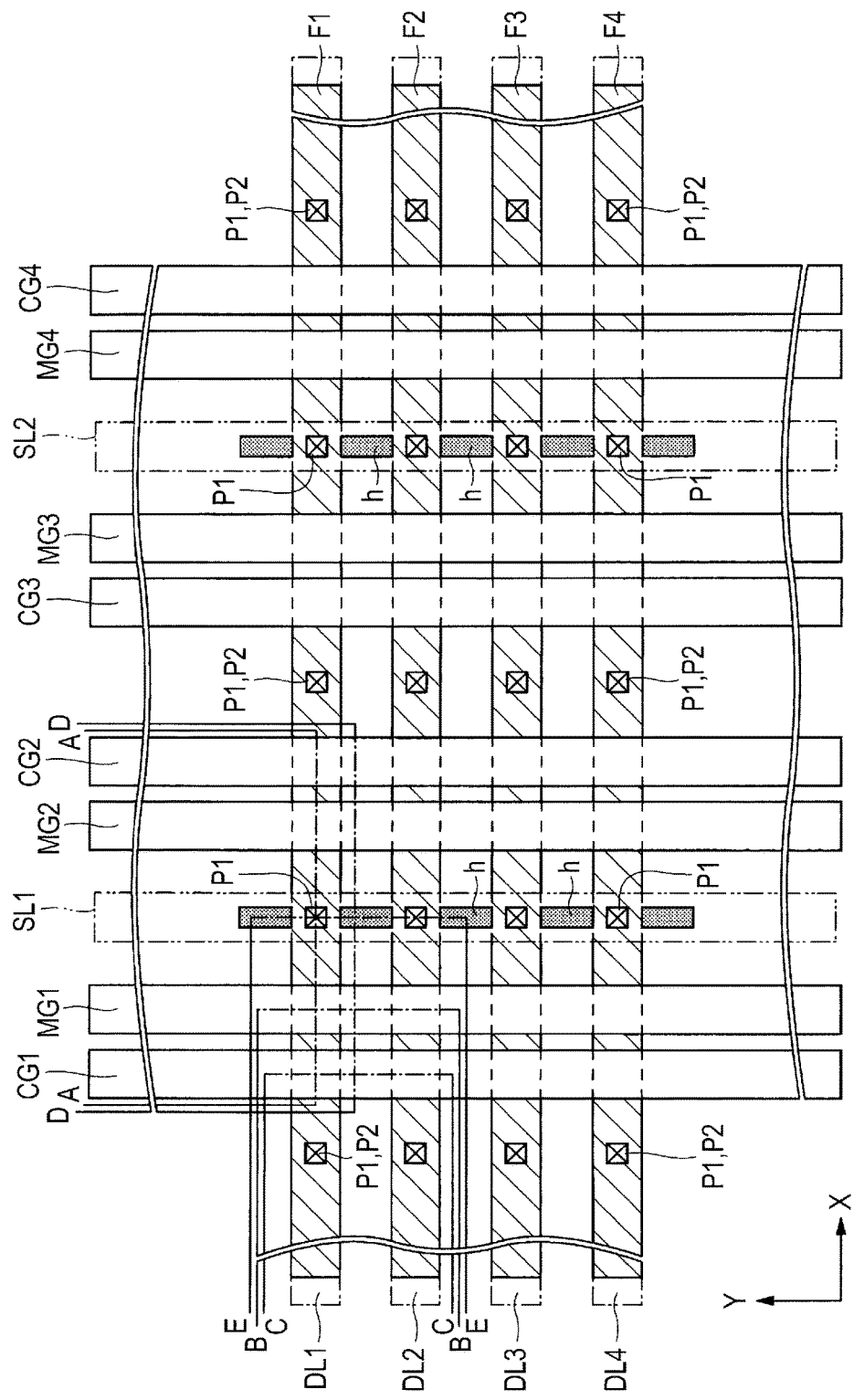
FIG. 5 is a plan view showing a memory array in the semiconductor device in Embodiment 1.
Figure 6:
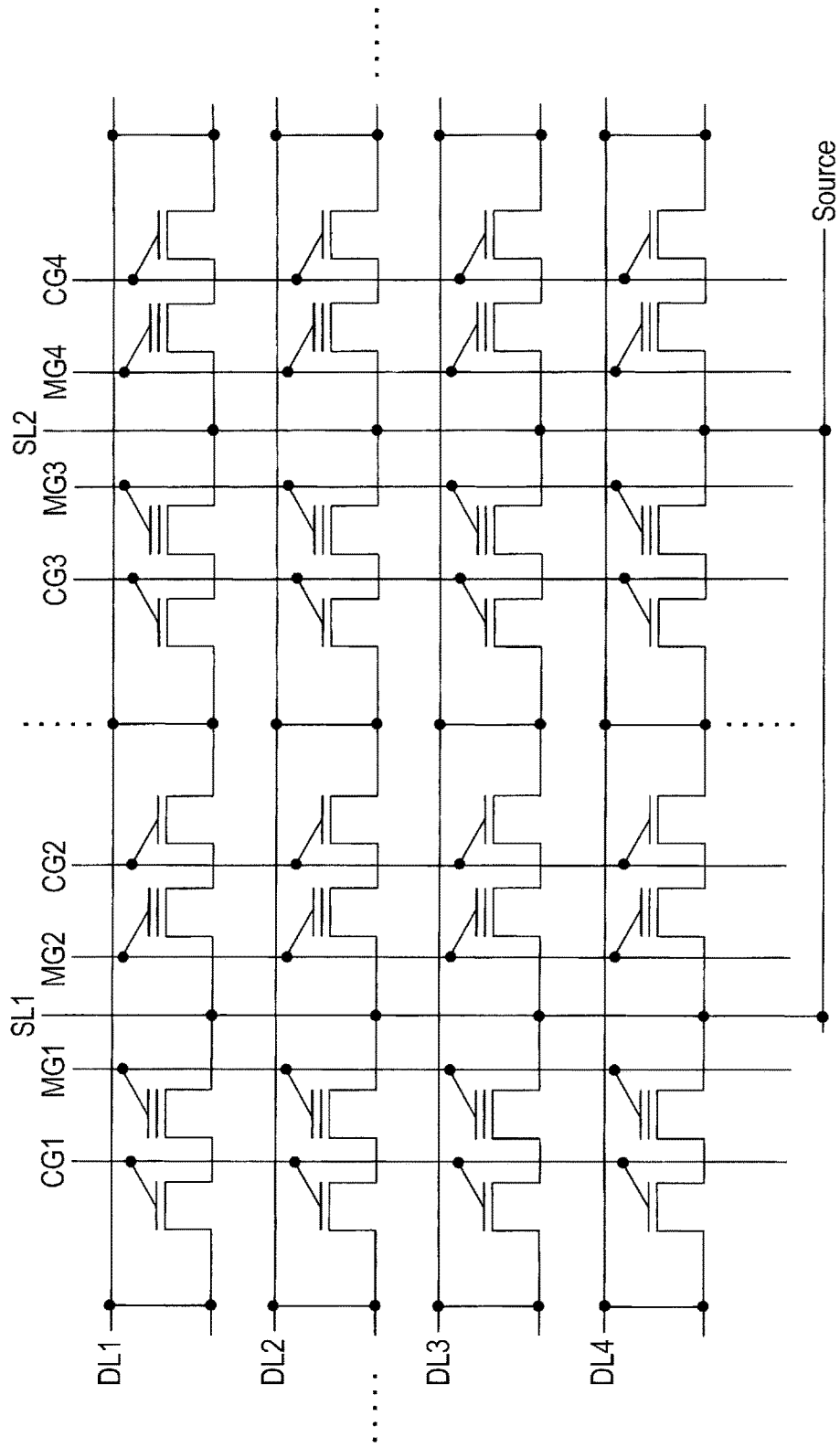
FIG. 6 is a circuit diagram showing the memory array in the semiconductor device in Embodiment 1.

FIGS. 1 to 4 are cross-sectional views each showing a configuration of the semiconductor device in Embodiment 1. FIG. 5 is a plan view showing a memory array in the semiconductor device in Embodiment 1. For example, FIG. 1 corresponds to a cross section along the line A-A in FIG. 5, FIG. 2 corresponds to cross sections along the lines B-B and C-C in FIG. 5, and FIG. 3 corresponds to a cross section along the line D-D in FIG. 5. FIG. 4 corresponds to a cross section along the line E-E in FIG. 5. FIG. 6 is a circuit diagram showing the memory array in the semiconductor device in Embodiment 1. FIG. 7 is a block diagram showing an example of the configuration of the semiconductor device in Embodiment 1.

As shown in FIGS. 1 to 4, each of memory cells (memory elements or elements) includes a control transistor having a control gate electrode (control gate electrode portion) CG and a memory transistor having a memory gate electrode (memory gate electrode portion) MG.

Specifically, the memory cell includes the control gate electrode CG disposed over a semiconductor substrate 100 (fin F) and the memory gate electrode MG disposed over the semiconductor substrate 100 (fin F) to be adjacent to the control gate electrode CG. For example, each of the control gate electrode CG and the memory gate electrode MG is made of a silicon film.

In Embodiment 1, the control gate electrode CG and the memory gate electrode MG are disposed over each of the fins F having a cuboid shape via insulating films (CG1 and ONO). Each of the fins F is made of an upper portion of the semiconductor substrate 100. In other words, the semiconductor substrate 100 has depressions/projections, and the fins F correspond to the projecting portions of the semiconductor substrate 100. As will be described later, each of the fins F has a two-dimensional shape in the form of a line (rectangle having long sides in an X-direction) having a given width (length in a Y-direction). In FIG. 5, the four fins F (F1 to F4) are arranged to be spaced apart at regular intervals (a given pitch) in the Y-direction.

Between the control gate electrode CG and the semiconductor substrate 100 (fin F), the control gate insulating film CGI is disposed. The control gate insulating film CGI is made of, e.g., a silicon dioxide film.

The memory cell further includes the insulating film ONO (106, 107, and 108) disposed between the memory gate electrode MG and the semiconductor substrate 100 (fin F). The insulating film ONO includes, e.g., the lower-layer insulating film 106, the intermediate-layer insulating film 107 located thereover, and the upper-layer insulating film 108 located thereover. The intermediate-layer insulating film 107 serves as a charge storage portion. The lower-layer insulating film 106 is made of, e.g., a silicon dioxide film. The intermediate-layer insulating film 107 is made of, e.g., a silicon nitride film. The upper-layer insulating film 108 is made of, e.g., a silicon oxynitride film.

The insulating film ONO (106, 107, and 108) is disposed between the memory gate electrode MG and the semiconductor substrate 100 (fin F) and between the control gate electrode CG and the memory gate electrode MG.

The memory cell further includes a drain region MD and a source region MS which are formed in the fin F of the semiconductor substrate 100. Over the side-wall portions of a combined pattern of the memory gate electrode MG and the control gate electrode CG, side-wall insulating films (sidewalls or sidewall spacers) SW each made of an insulating film are formed.

The drain region MD includes an $n^+$-type semiconductor region 119$b$ and an $n^-$-type semiconductor region 119$a$. The $n^-$-type semiconductor region 119$a$ is formed by self-alignment with the side wall of the control gate electrode CG. The $n^+$-type semiconductor region 119$b$ is formed by self-alignment with the side surface of the side-wall insulating film SW closer to the control gate electrode CG to have a junction depth larger than that of the $n^-$-type semiconductor region 119$a$ and an impurity concentration higher than that thereof.

The source region MS includes an $n^+$-type semiconductor region 111$b$ and an $n^-$-type semiconductor region 111$a$. The $n^-$-type semiconductor region 111$a$ is formed by self-alignment with the side wall of the memory gate electrode MG. The $n^+$-type semiconductor region 111$b$ is also formed by self-alignment with the side surface of the side-wall insulating film SW closer to the memory gate electrode MG to have a junction depth larger than that of the n⁻-type semiconductor region 111a and an impurity concentration higher than that thereof.

Such a source region (or drain region) including a lower-concentration semiconductor region and a higher-concentration semiconductor region is referred to as an LDD (Lightly doped Drain) structure.

In the present specification, the drain region MD and the source region MS are defined on the basis of voltages applied thereto during operations thereof. A semiconductor region to which a low voltage is applied during a read operation described later will be uniquely referred to as the source region MS, while a semiconductor region to which a high voltage is applied during the read operation will be uniquely referred to as a drain region MD.

Over the drain region MD (n⁺-type semiconductor region 119b) and the source region MS (n⁺-type semiconductor region 111b), respective metal silicide films SIL are formed. Also, over the memory gate electrode MG, the metal silicide film SIL is formed. On the other hand, over the control gate electrode CG, a cap insulating film CAP is formed. The cap insulating film CP is made of, e.g., a silicon nitride film.

Over the memory cells, interlayer insulating films IL1, IL2, IL3, and IL4 are formed. Each of these films is made of, e.g., a silicon dioxide film. In the interlayer insulating film IL1, plugs P1 are formed. Over the plugs P1, wires M1 are formed. In the interlayer insulating film IL3, plugs P2 are formed. Over the plugs P2, wires M2 are formed. The wires M1 and M2 are, e.g., embedded wires and made of a conductive material such as metal. The wires M1 and M2 are embedded herein in the interlayer insulating films IL2 and IL4.

The two memory cells shown in FIG. 1 are substantially symmetrically arranged with the source region MS being interposed therebetween. As will be described later, in the memory cell region MA, the plurality of memory cells are further disposed. For example, on the left of the left memory cell in the memory cell region MA shown in FIG. 1, a memory cell (not shown) sharing the drain region MD with the left memory cell is disposed.

The region between the control gate electrodes CG which are disposed with the drain region MD being interposed therebetween is referred to as a region CCA. The region between the memory gate electrodes MG which are disposed with the source region MS being interposed therebetween is referred to as a region MMA. In FIG. 1, the region CCA is disposed on each of both sides of the region MMA. It is assumed that the region MMA includes the regions where the insulating film ONO (106, 107, and 108) disposed along the side wall of each of the memory gate electrodes MG is formed.

As described above, the plurality of memory cells are arranged in a lateral direction (gate length direction) in FIG. 1 such that the shared source regions MS and the shared drain regions MD are alternately arranged to form a memory cell group (row). In a direction (gate width direction) perpendicular to the surface of a paper sheet with FIG. 1 also, the plurality of memory cells are arranged to form a memory cell group (column). Thus, the plurality of memory cells are formed to be arranged in the form of an array. The following will describe the memory array with reference to FIGS. 5 to 7.

(Memory Array)

As shown in FIG. 5, the plurality of fins F (active regions or hatched portions) are provided in the form of lines extending in the X-direction. Between the fins F, an element isolation region (103) is located. Around the outer periphery of the memory array (memory block) also, the element isolation region (103) is located (see FIG. 7).

The control gate electrodes CG (CG1, CG2, CG3, and CG4) of the memory cells and the memory gate electrodes MG (MG1, MG2, MG3, and MG4) of the memory cells extend in the Y-direction (direction crossing an A-A cross-sectional portion or a vertical direction over the surface of the paper sheet) so as to traverse the fins F. Also, source lines SL (SL1 and SL2) extend in the Y-direction over the fins F so as to traverse the fins F. The source regions (MS or the n⁺-type semiconductor regions 111b) and the source lines SL in the fins F are coupled to each other via the plugs (contact plugs or coupling portions) P1. Over the plurality of fins F, the source lines SL are disposed to extend in the Y-direction so as to couple the plugs P1 over the source regions (MS) disposed to be arranged in the Y-direction to each other. The source lines SL are, e.g., the first-layer wires (M1).

The control gate electrodes CG and the memory gate electrodes MG are arranged symmetrically relative to the foregoing source lines SL. The drain regions MD (n⁺-type semiconductor regions 119b) and drain lines (DL1, DL2, DL3, and DL4) in the fins F are coupled to each other via the plugs (contact plugs or coupling portions) P1, P2, and the like. Over the individual fins F, the drain lines DL (DL1, DL2, DL3, and DL4) are disposed to extend in the X-direction so as to couple the plugs P2 over the drain regions MD disposed to be arranged in the X-direction to each other. The drain lines DL are, e.g., the second-layer wires (M2).

As shown in FIG. 6, the memory cells (memory transistors and control transistors) are disposed at the points of intersection of the source lines SL (SL1 and SL2) and the drain lines DL (DL1, DL2, DL3, and DL4) in the form of an array.

As shown in FIG. 7, the memory cell array is provided in a memory module B. For example, in the memory module B, memory blocks MB and shunt regions SH are included. The shunt regions SH are provided around the outer peripheries of the memory blocks MB and between the memory blocks MB. In each of the memory blocks MB, the memory cells described above are provided in the form of an array. Each of the memory blocks MB is referred to also as the memory cell region (MA). The shunt regions SH are the element isolation region (103) where the wires (MG, CG, M1, and the like) extending from the memory blocks MB are disposed.

The memory module B and a peripheral circuit D are included in the semiconductor device in Embodiment 1. In addition to the memory module B and the peripheral circuit D, a CPU (A), a RAM (C), and the like may also be provided in the semiconductor device.

In the peripheral circuit D, circuits other than the non-volatile memory are formed herein. Examples of the circuits formed in the peripheral circuit D include a control circuit, a sense amplifier, a column decoder, a row decoder, and an input/output circuit. Note that the control circuit, the sense amplifier, the column decoder, the row decoder, the input/output circuit, or the like may also be provided between the memory blocks MB in the memory module B. As the constituent elements of such circuits provided in the peripheral circuit D or between the memory blocks MB, MISFETs can be used. For example, the foregoing memory cells and the MISFETs are mounted over the same semiconductor substrate in mixed relation. In other words, the memory cells are provided in the memory cell regions MA of the semiconductor substrate, while the MISFETs are provided in the peripheral circuit region PA of the semiconductor substrate (see FIGS. 24 and 25). The following will describe a configuration of each of the MISFETs. Note that a description will be given herein of a case where the FIN structure is not applied to the peripheral circuit region PA. However, as will be described later, each of the MISFETs in the peripheral circuit region PA may also have the FIN structure (see Embodiment 4).

(MISFET)

Figure 25:
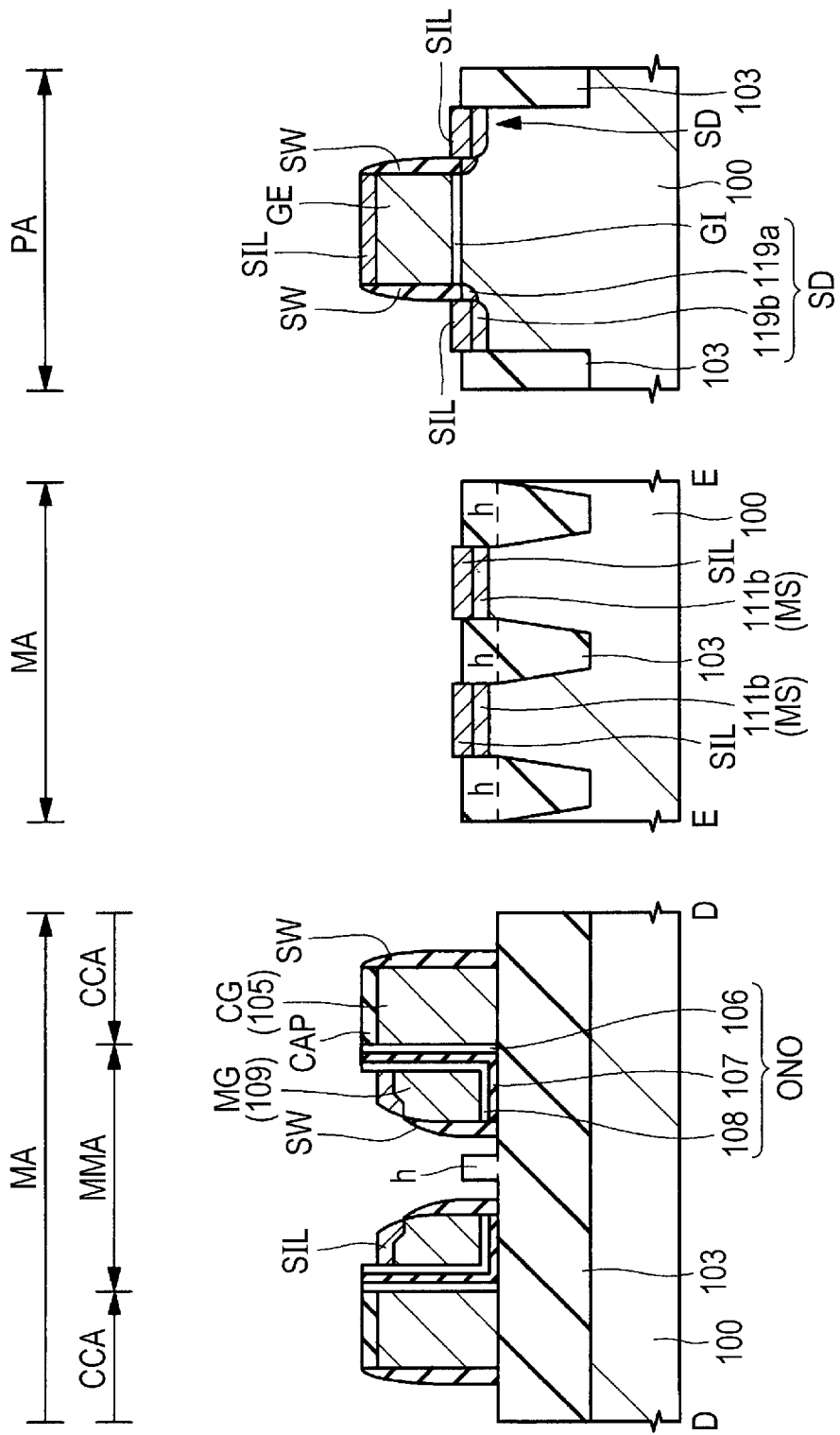
FIG. 25 is a cross-sectional view showing the manufacturing process of the semiconductor device in Embodiment 1.

As shown in FIG. 25, each of the MISFETs in the peripheral circuit region PA has a gate electrode (gate electrode portion) GE disposed over the semiconductor substrate 100 and the source/drain regions SD provided in the semiconductor substrate 100 located on both sides of the gate electrode GE. As the gate electrode GE, e.g., a film in the same layer as that of the control gate electrodes CG can be used. The MISFET also includes a gate insulating film GI disposed between the gate electrode GE and the semiconductor substrate 100. As the gate insulating film GI, e.g., a silicon dioxide film can be used. Alternatively, as the gate insulating film GI, a film in the same layer as that of the control gate insulating film CGI can also be used.

Over the side-wall portions of the gate electrode GE, the side-wall insulating films SW each made of an insulating film are formed. Each of the source/drain regions SD includes the n$^+$-type semiconductor region 119$b$ and the n$^-$-type semiconductor region 119$a$. The n$^-$-type semiconductor regions 119$a$ are formed by self-alignment with the side walls of the gate electrode GE. The n$^+$-type semiconductor regions 119$b$ are formed by self-alignment with the side surfaces of the side-wall insulating films SW and have junction depths deeper than those of the n$^-$-type semiconductor regions 119$a$ and impurity concentrations higher than those thereof. Over the source/drain regions SD (n$^+$-type semiconductor regions 119$b$) and the foregoing gate electrode GE, the respective metal silicide films SIL are formed.

Over the MISFETs, in the same manner as over the memory cells, the interlayer insulating films (IL1, IL2, IL3, and IL4) are formed, though not clearly shown in FIG. 25. In and over the interlayer insulating films, the plugs P1 and P2 and the wires M1 and M2 are formed.

(Memory Operations)

Next, a description will be given of an example of basic operations to each of the memory cells. As the operations to the memory cell, three operations which are: (1) a read operation; (2) an erase operation; and (3) a write operation will be described. These operations have various definitions. In particular, the erase operation and the write operation may also be defined as the opposite operations.

(1) Read Operation

For example, a positive potential of about 1.2 V is given to the drain region MD closer to the control gate electrode CG and a positive potential of about 1.2 V is given to the control gate electrode CG to bring the channel under the control gate electrode CG into an ON state. Then, the memory gate electrode MG is set at a predetermined potential (i.e., a middle potential between a threshold in a written state and a threshold in an erase state) to thus allow charge information retained in the memory cell to be read as a current.

(2) Erase Operation

For example, a voltage of 12 V is applied to the memory gate electrode MG and a voltage of 0 V is applied to the control gate electrode CG, while 0 V is applied to the source region MS closer to the memory gate electrode MG and 0 V is applied to the source region MS closer to the control gate electrode CG. Thus, from the memory gate electrode MG, holes are injected into the silicon nitride film (intermediate-layer insulating film 107 or charge storage portion) using an FN tunneling phenomenon to remove the stored charges (which are electrons herein) and thus perform an erase operation (an FN tunneling erase method).

(3) Write Operation

For example, a voltage of 9.5 V is applied to the memory gate electrode MG and a voltage of 0.9 V is applied to the control gate electrode CG, while 5.7 V is applied to the source region MS closer to the memory gate electrode MG and a potential lower than that in the source region, e.g., 0.3 V is applied to the drain region MD closer to the control gate electrode CG. Thus, electrons are locally injected into the end portion of the memory gate electrode MG which is closer to the control gate electrode CG. This injection method is referred to as a SSI (Source Side Hot Electron) injection method.

<About Protruding Portion (Non-Lowered Portion) h>

In Embodiment 1, as shown in FIG. 5, each of protruding portions (non-lowered portions or higher-level isolation portions) h is provided in the element isolation region (103) located between the plurality of fins F provided in the form of the lines extending in the X-direction. As is also obvious from FIG. 3, the protruding portion (non-lowered portion) h is located between the memory gate electrodes MG.

Normally, the top surface of each of the element isolation regions 103 between the fins F is lowered from the top surface (upper surface or top) of each of the fins F. The side surfaces of the fins F are exposed to a depth corresponding to the level difference between the top surface of the fin F and the element isolation region 103 to allow an improvement in effective channel width (see FIG. 2). For example, the element isolation region 103 is formed by forming an isolation trench in the semiconductor substrate 100 located between the regions where the fins F are formed and embedding an insulating film in the isolation trench. By lowering the top surface of the embedded insulating film, the fins F are allowed to protrude.

In Embodiment 1, in the element isolation region 103 between the fins F, the protruding portions (non-lowered portions) h in which the top surfaces of the embedded insulating films are not lowered are provided between the memory gate electrodes MG. In contrast to the protruding portions (non-lowered portions) h, portions that have been lowered may also be referred to as "lowered portions (lower-level isolation portions)".

By thus providing the protruding portions (non-lowered portions) h, during etching (processing) for the memory gate electrodes MG, it is possible to prevent a short circuit between the memory gate electrodes MG due to a residue resulting from gate processing.

FIGS. 8A and 8B are cross-sectional views showing the configuration of the semiconductor device in Embodiment 1 and a configuration of a semiconductor device in a comparative example. As shown in FIG. 8A, when the protruding portion (non-lowered portion) h is not provided, on the memory gate electrode MG, a residue a of the memory gate electrode MG may be left along the side wall of the fin F. The cross-sectional view on the upper right of FIG. 8A corresponds to the cross section in the broken-line portion of FIG. 8A.

By contrast, in Embodiment 1, as shown in FIG. 8B, even when the residue a of the memory gate electrode MG is left between the memory gate electrodes MG, the residue a is divided by the protruding portion (non-lowered portion) h. In other words, over the protruding portion (non-lowered portion) h, the level difference between the top surface of the fin F and the element isolation region 103 is reduced to be able to prevent the residue a of the memory gate electrode MG from being left. As a result, it is possible to prevent a short circuit between the memory gate electrodes MG.

Figure 26:
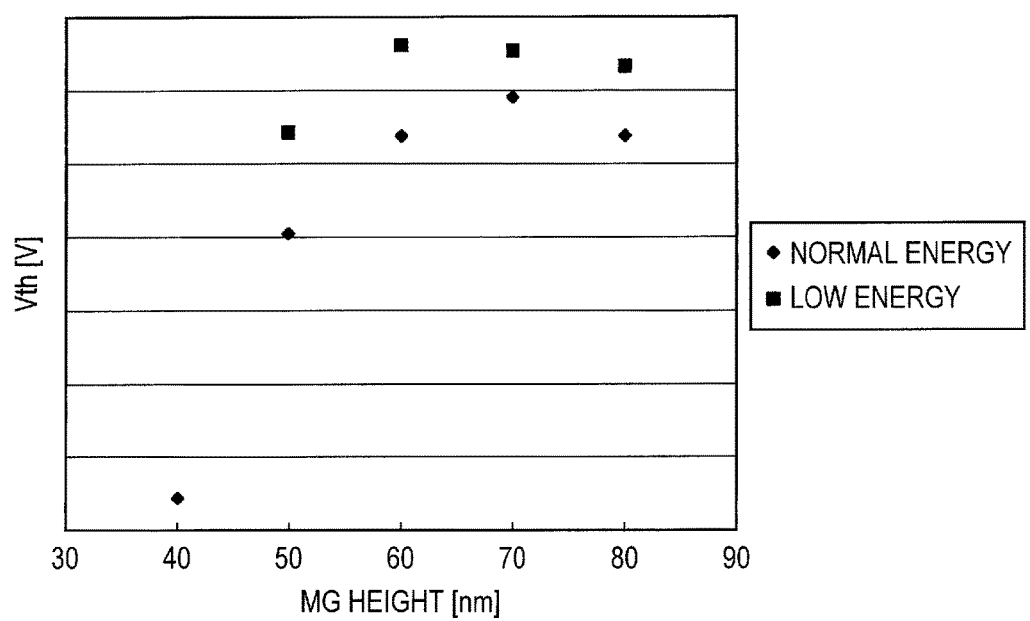
FIG. 26 is a graph showing the relationship between the height of a memory gate electrode and a threshold potential.
Figure 27:
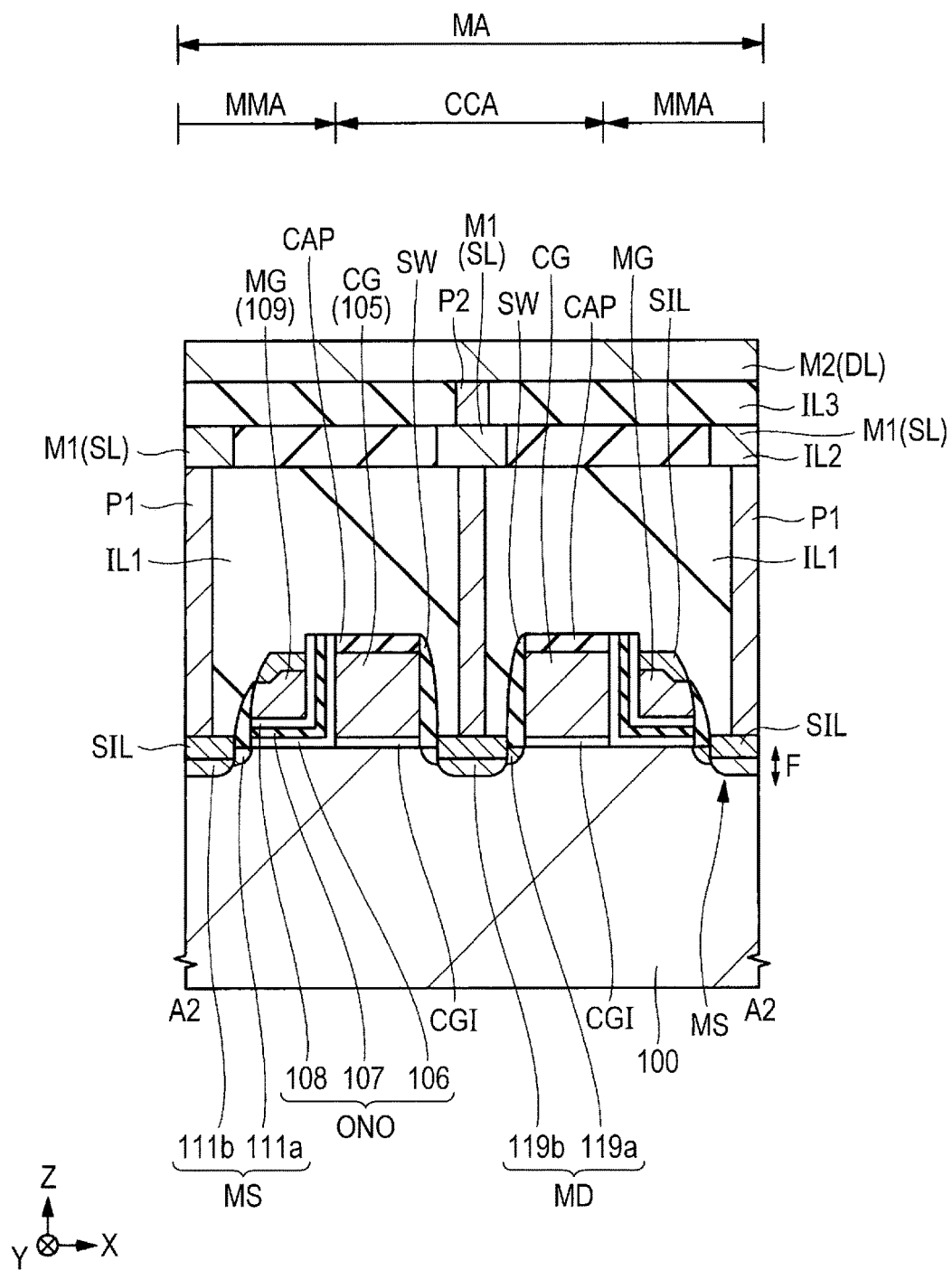
FIG. 27 is a cross-sectional view showing a configuration of a semiconductor device in Embodiment 2.
Figure 28:
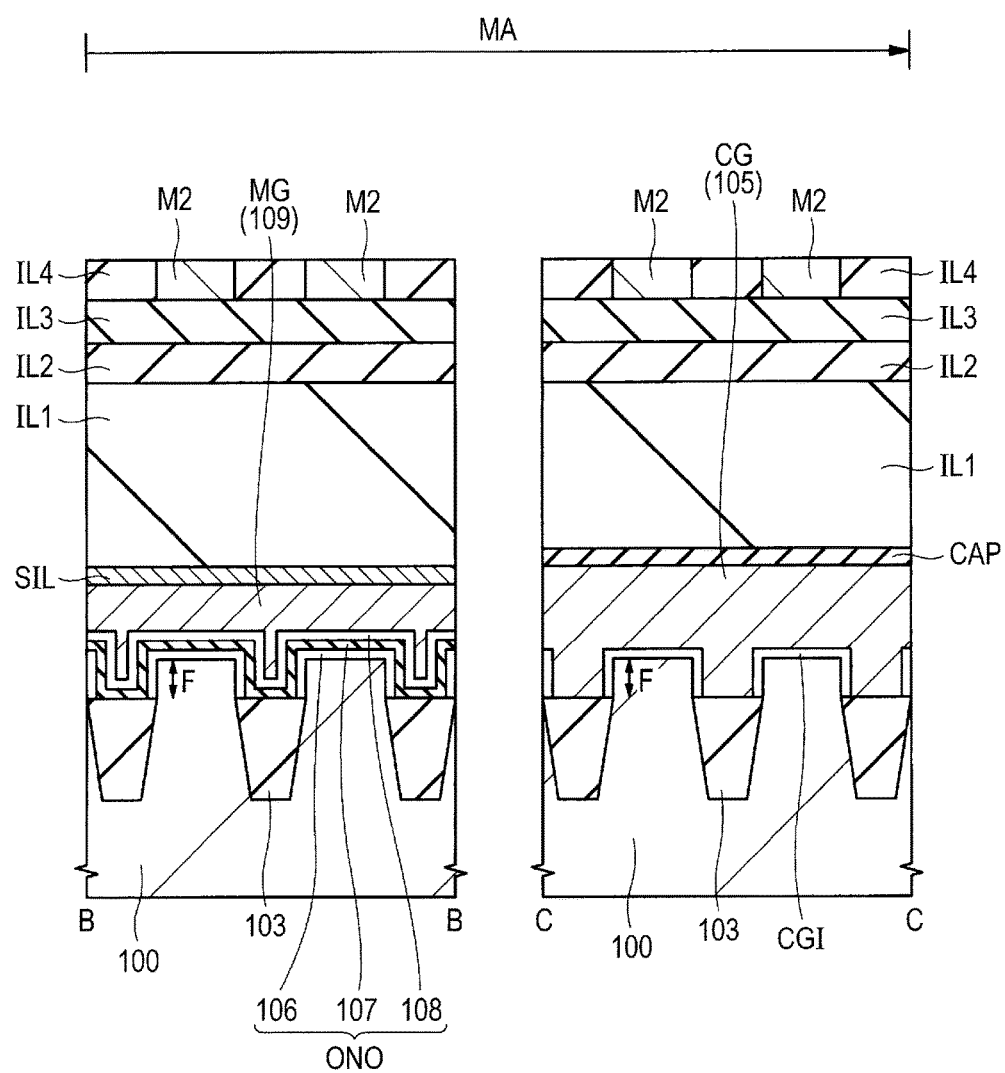
FIG. 28 is a cross-sectional view showing the configuration of the semiconductor device in Embodiment 2.
Figure 29:
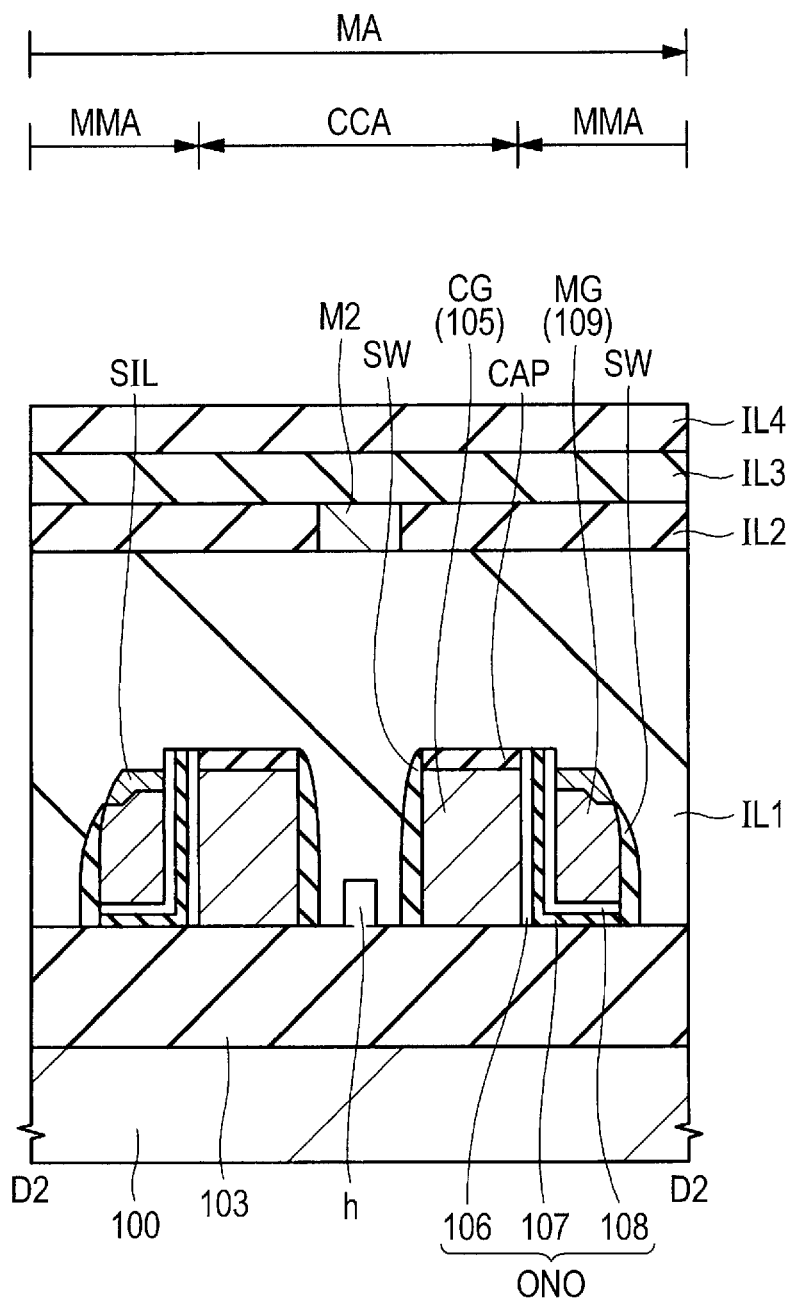
FIG. 29 is a cross-sectional view showing the configuration of the semiconductor device in Embodiment 2.

To prevent such a residue a from being left, it can also be considered to increase an amount of over-etching. However, when the amount of over-etching is increased, the height of the memory gate electrode MG is reduced to increase height variations. When the height of the memory gate electrode MG is reduced even partially, in the step of implanting an impurity such as the step of forming the source regions (MS or n$^+$-type semiconductor regions 111b), impurity penetration may occur. This forms an unintended impurity region under the memory gate electrode MG and reduces a threshold potential (see FIG. 26). FIG. 26 is a graph showing the relationship between the height of the memory gate electrode and a threshold potential. In FIG. 26, the abscissa axis represents "MG Height [nm]", while the ordinate axis represents "Threshold Potential (Vth [V])". The diamond marks show a case where an implantation energy is normal, while the square marks show a case where the implantation energy is low. In this example, when the "MG Height" is less than 60 nm, the "Threshold Potential (Vth)" decreases and, when the "MG height" is less than 50 nm, the "Threshold Potential (Vth)" significantly decreases. Thus, it is important to maintain the height of the memory gate electrode MG in terms of retaining or improving the characteristics of the memory cell.

Accordingly, in Embodiment 1, it is possible to prevent a short circuit between the memory gate electrodes MG, while suppressing the amount of over-etching and allowing the memory gate electrode MG to retain an intended height.

<About Region where Protruding Portion (Non-Lowered Portion) h is Formed>

For example, it may also be possible to provide the protruding portion (non-lowered portion) h in the entire element isolation region 103 between the memory gate electrodes MG (inter-memory-gate isolation region). In other words, it may also be possible to provide the protruding portion (non-lowered portion) h in the entire inter-memory-gate isolation region. The inter-memory-gate isolation region is the generally rectangular element isolation region (103) surrounded by, e.g., the fins F1 and F2 and the memory gate electrodes MG1 and MG2 in plan view (see FIG. 5).

However, it is appropriate to provide the protruding portion (non-lowered portion) h only at the middle portion of the inter-memory-gate isolation region in the patterning step for the memory gate electrodes MG in consideration of the misalignment thereof. More specifically, it is appropriate to provide the protruding portion (non-lowered portion) h at the foregoing middle portion of the inter-memory-gate isolation region such that the protruding portion (non-lowered portion) h extends in the Y-direction. In this case, the portions (isolation portions) on both sides of the protruding portion (non-lowered portion) h serve as the "lowered portions (lower-level isolation portions)".

The width (length) of the protruding portion (non-lowered portion) h in the X-direction is, e.g., about 40 nm to 50 nm. The width (length) of the protruding portion (non-lowered portion) h in the X-direction can be set to a value close to that obtained by, e.g., adding or subtracting 10 nm to or from the width (length) of the plug P1 in the X-direction. The length of the protruding portion (non-lowered portion) h in the Y-direction is preferably set to a value corresponding to the distance between the fins F. Since a residue resulting from gate processing is left along the side wall of the fin F extending in the X-direction (see FIG. 8A), the protruding portion (non-lowered portion) h is preferably provided in contact relation with the side wall of the fin F.

By thus providing the protruding portion (non-lowered portion) h in a part of the inter-memory-gate isolation region, it is possible to prevent a short circuit due to a residue resulting from gate processing. In addition, since the protruding portion (non-lowered portion) h is provided in a part of the inter-memory-gate isolation region and the element isolation region (103) along the memory gate electrode MG is provided as the "lowered portion", even when the memory gate electrodes MG are formed in misaligned relation due to the misalignment of a mask or the like, the side surfaces of the fins F are in contact with the memory gate electrodes MG. This can improve the effective channel widths thereof.

<About Height of Element Isolation Region>

In plan view, the protruding portions (non-lowered portions) h of the element isolation regions (103) correspond to the dotted portions of FIG. 5. On the other hand, the "lowered portions" of the isolation regions (103) correspond to the portions of the generally rectangular linear regions between the fins F (hatched portions) of FIG. 5 which are other than the dotted portions (see FIG. 15). The "lowered portions" also correspond to the areas of the inter-memory-gate isolation region which are located on both sides of each of the protruding portions (non-lowered portions) h. The "lowered portions" also correspond to "under-gate isolation regions" where the various gate electrodes and the element isolation region (103) overlap each other. The "under-gate isolation regions" include under-memory-gate isolation regions and under-control-gate isolation regions. In other words, the protruding portions (non-lowered portions) h are disposed at predetermined intervals in the X-direction in the generally rectangular linear regions between the fins F (hatched portions) of FIG. 5.

The heights of the protruding portions (non-lowered portions) h are higher than the heights of the "lowered portions".

The height of each of the protruding portions (non-lowered portions) h is about the same as the height (H1) of the top surface (upper surface or top) of each of the fins F. It can be said that the height (H1) of the top surface (upper surface or top) of each of the fins F is the height of the top surface of the fin under the memory gate electrode MG. The height (H2) of each of the "lowered portions" is lower than the height (H1) of the top surface (upper surface or top) of each of the fins F.

The height (H1) of the top surface (upper surface or top) of each of the foregoing fins F need not necessarily be about the same as the height of each of the protruding portions (non-lowered portions) h. The protruding portion (non-lowered portion) h may also be lower in level than the top surface (upper surface or top) of the fin F. The difference (first height difference) between the height (H1) of the top surface (upper surface or top) of the foregoing fin F and the height of the protruding portion (non-lowered portion) h may also be, e.g., not less than 10 nm as a result of a film reduction in the protruding portion h or the like.

The difference (second height difference) between the height (H1) of the top surface (upper surface or top) of the foregoing fin F and the height (H2) of the "lowered portion" is, e.g., about 50 nm. The second height difference is preferably not less than 50 nm.

The foregoing second height difference is larger than the foregoing first height difference.

To prevent a short circuit due to a residue resulting from gate processing, the height of the protruding portion (non-lowered portion) h is preferably 10 nm or more larger than the height of the "lowered portion".

[Description of Manufacturing Method]

Next, referring to FIGS. 9 to 25, a method of manufacturing the semiconductor device in Embodiment 1 will be described, while the configuration of the semiconductor device will be more clearly shown. FIGS. 9 to 25 are cross-sectional views showing the manufacturing process of the semiconductor device in Embodiment 1 (except for FIG. 15). FIG. 15 is a plan view showing the manufacturing process of the semiconductor device in Embodiment 1.

The semiconductor substrate 100 has the memory cell region MA and the peripheral circuit region PA. In the memory cell region MA, the memory cells are formed. In the peripheral circuit region PA, the MISFETs are formed.

Figure 9:
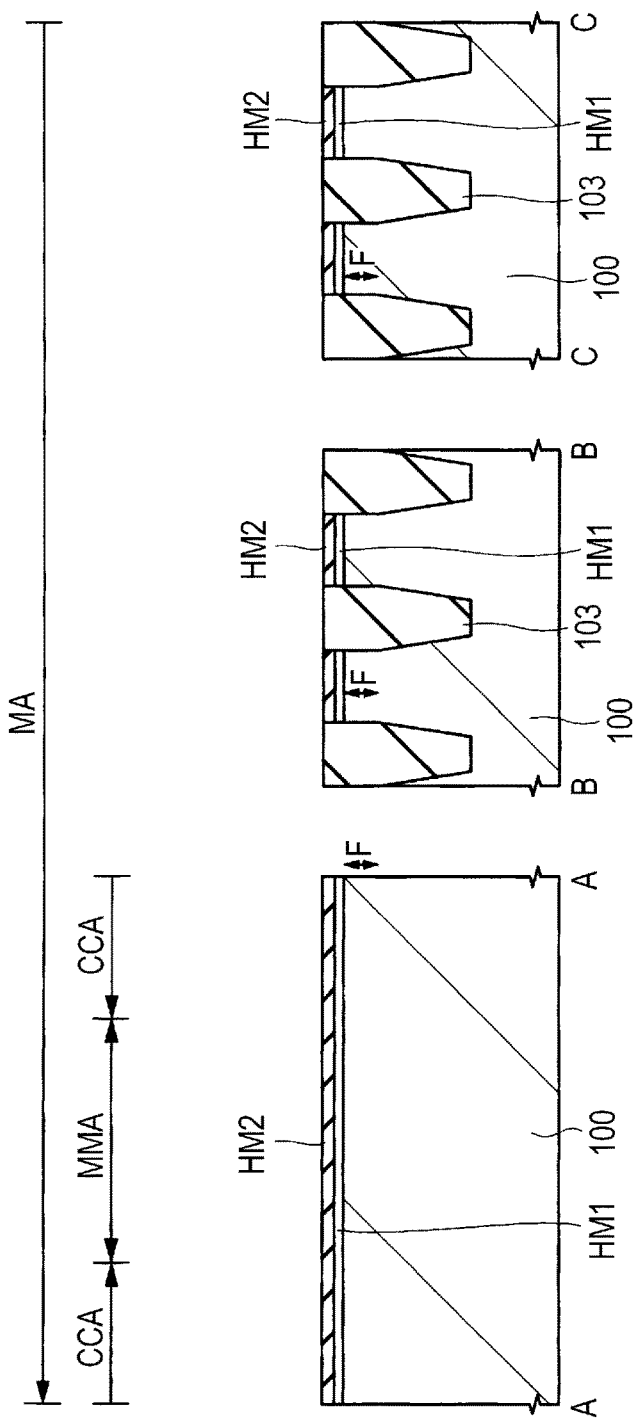
FIG. 9 is a cross-sectional view showing the manufacturing process of the semiconductor device in Embodiment 1.
Figure 10:
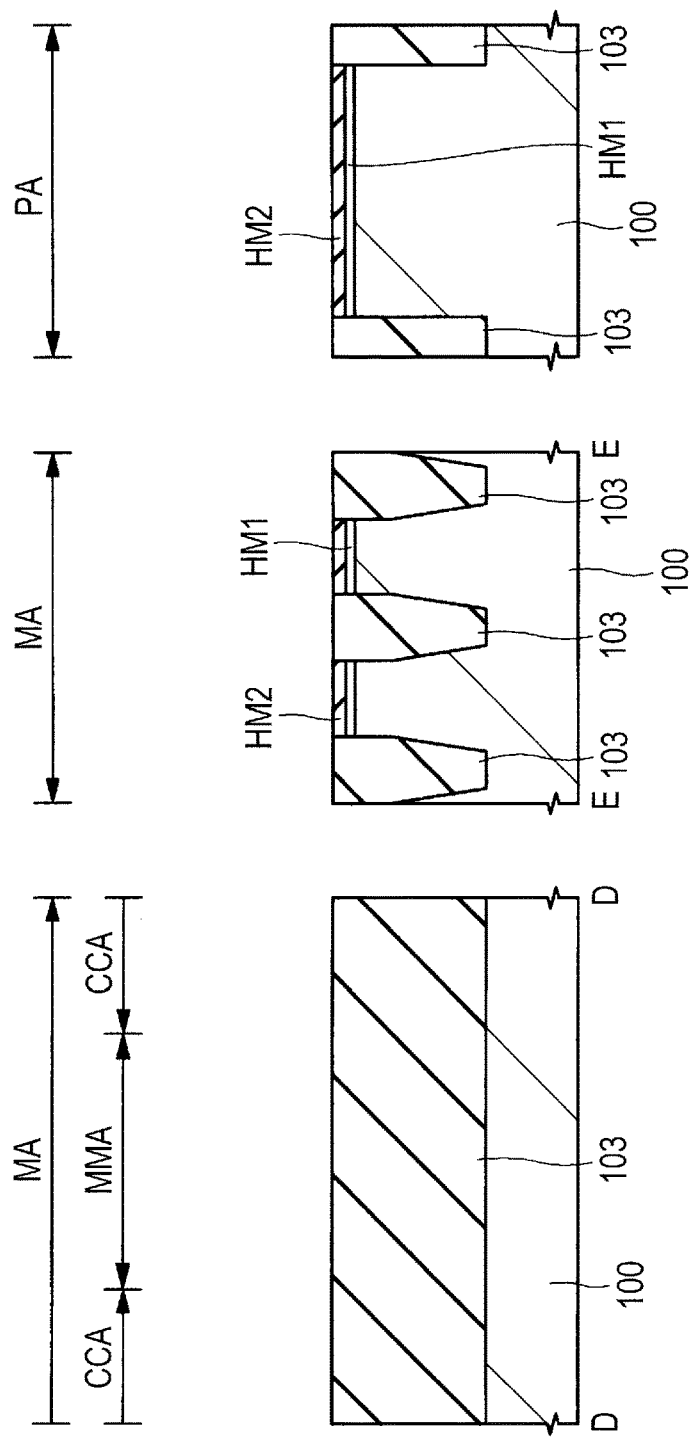
FIG. 10 is a cross-sectional view showing the manufacturing process of the semiconductor device in Embodiment 1.

First, as shown in FIGS. 9 and 10, as the semiconductor substrate 100, a semiconductor substrate made of p-type monocrystalline silicon having a specific resistance of, e.g., about 1 to 10Ωcm is prepared. Then, the semiconductor substrate 100 is thermally oxidized to form a silicon dioxide film HM1 having a thickness of about 10 nm. Then, over the silicon dioxide film HM1, a silicon nitride film HM2 having a thickness of about 100 nm is deposited using a CVD (Chemical Vapor Deposition) method or the like. Then, using a photolithographic technique and a dry etching technique, the silicon dioxide film HM1 and the silicon nitride film HM2 are etched. By further etching the semiconductor substrate 100 to a depth of about 400 nm, isolation trenches are formed. Then, over the silicon nitride film HM2 including the inner portion of each of the isolation trenches, a silicon dioxide film (embedded insulating film) having a thickness of about 1000 nm is deposited using a CVD method or the like. Then, heat treatment (annealing) is performed on the silicon dioxide film to densify the silicon dioxide film. Then, by removing the silicon dioxide film located outside the isolation trenches using a CMP (Chemical Mechanical Polishing) method or the like, an insulating film such as a silicon dioxide film is embedded in each of the isolation trenches. Such an isolation method is referred to as a STI (Shallow Trench Isolation) method. In the memory cell region MA, e.g., the element isolation regions 103 are in the form of lines (rectangles having long sides in the X-direction) each having a given width (length in the Y-direction). The plurality of isolation regions 103 in the form of lines are arranged to be spaced apart at regular intervals (a given pitch).

Figure 11:
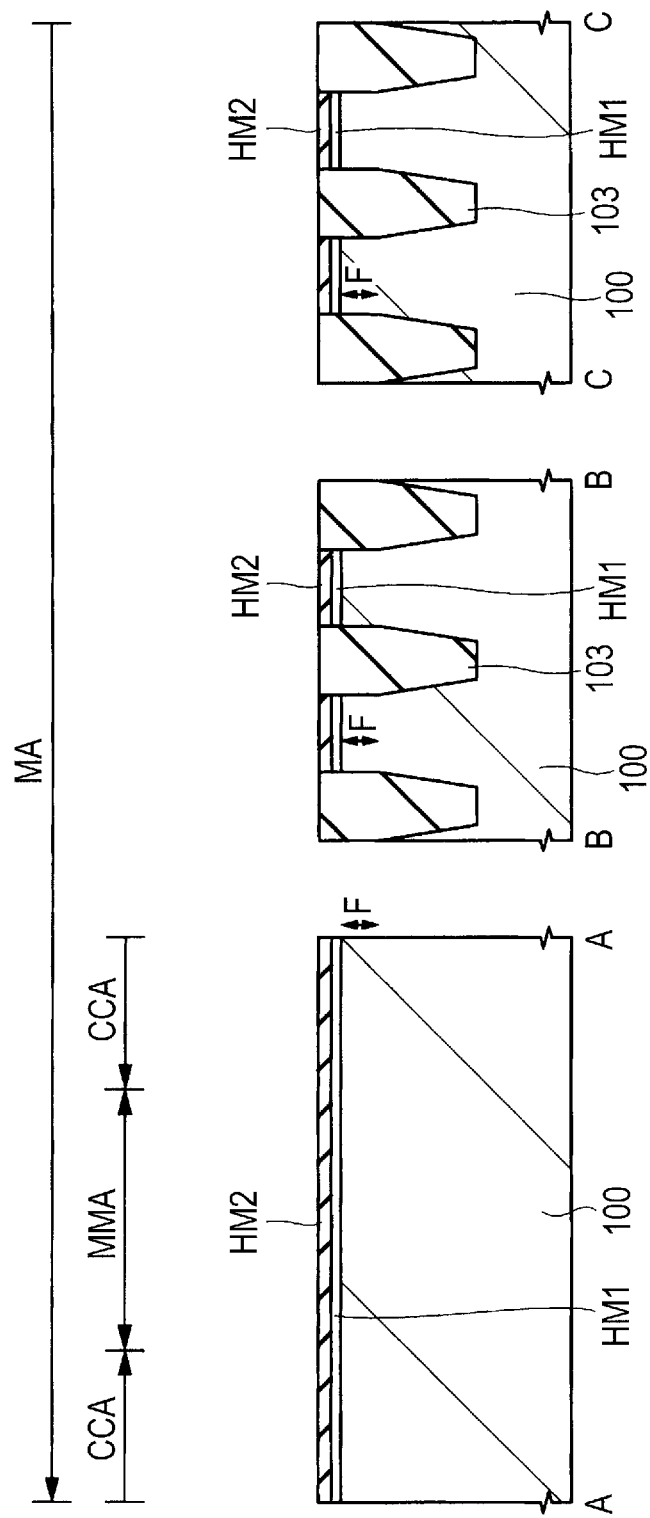
FIG. 11 is a cross-sectional view showing the manufacturing process of the semiconductor device in Embodiment 1.
Figure 12:
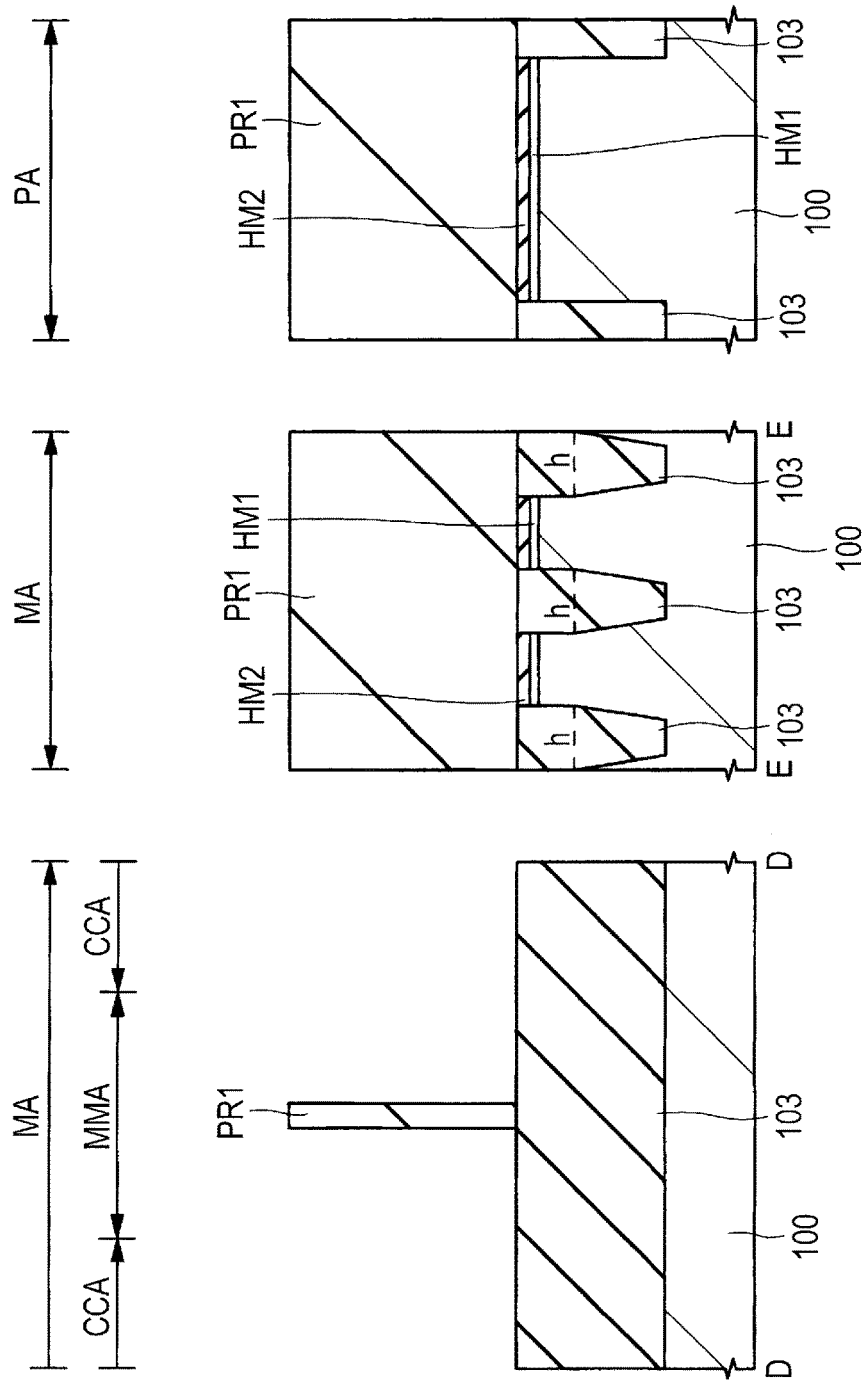
FIG. 12 is a cross-sectional view showing the manufacturing process of the semiconductor device in Embodiment 1.
Figure 13:
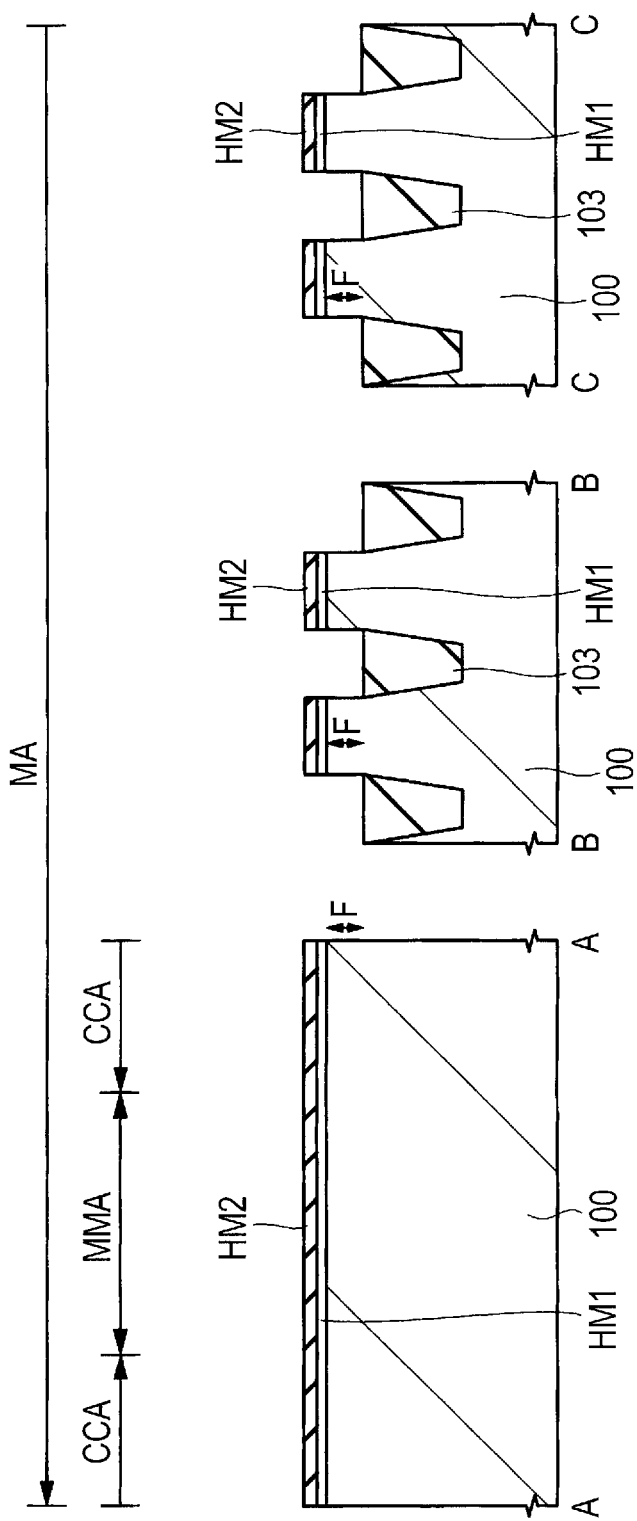
FIG. 13 is a cross-sectional view showing the manufacturing process of the semiconductor device in Embodiment 1.
Figure 14:
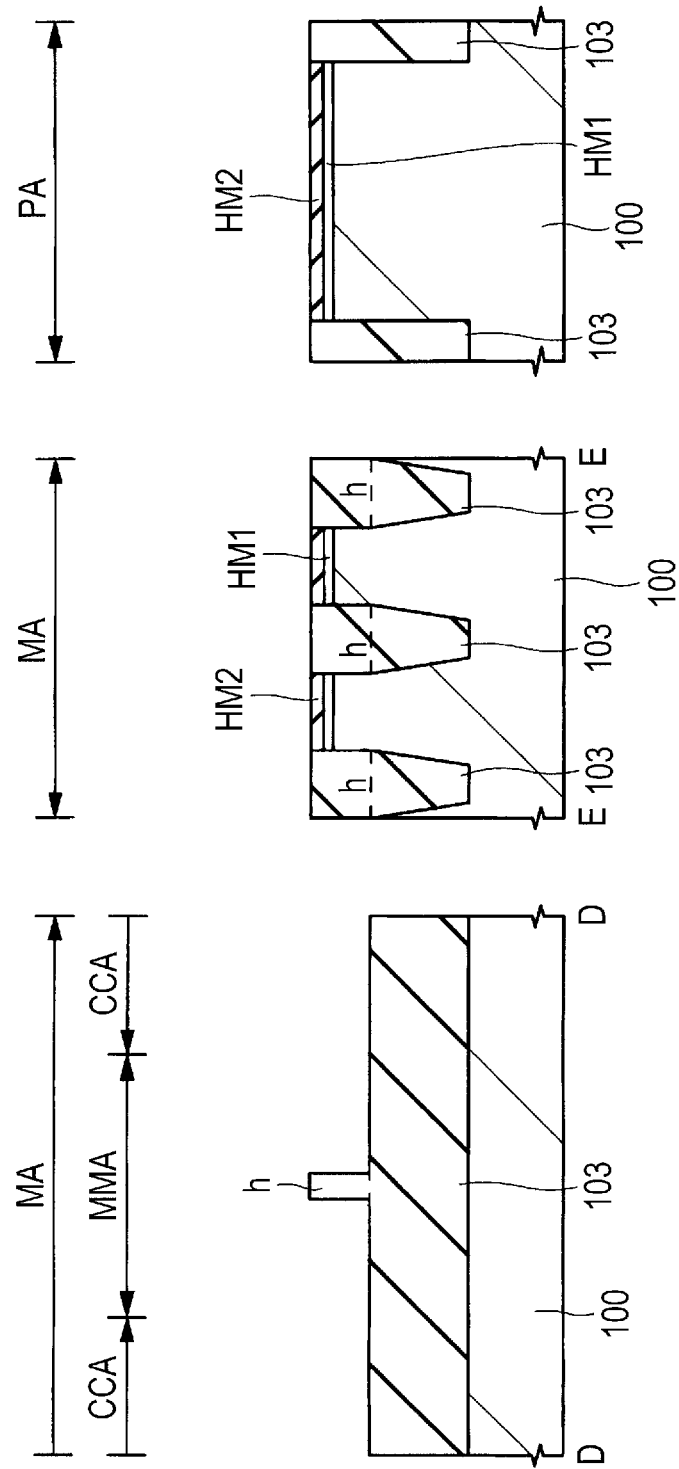
FIG. 14 is a cross-sectional view showing the manufacturing process of the semiconductor device in Embodiment 1.
Figure 15:
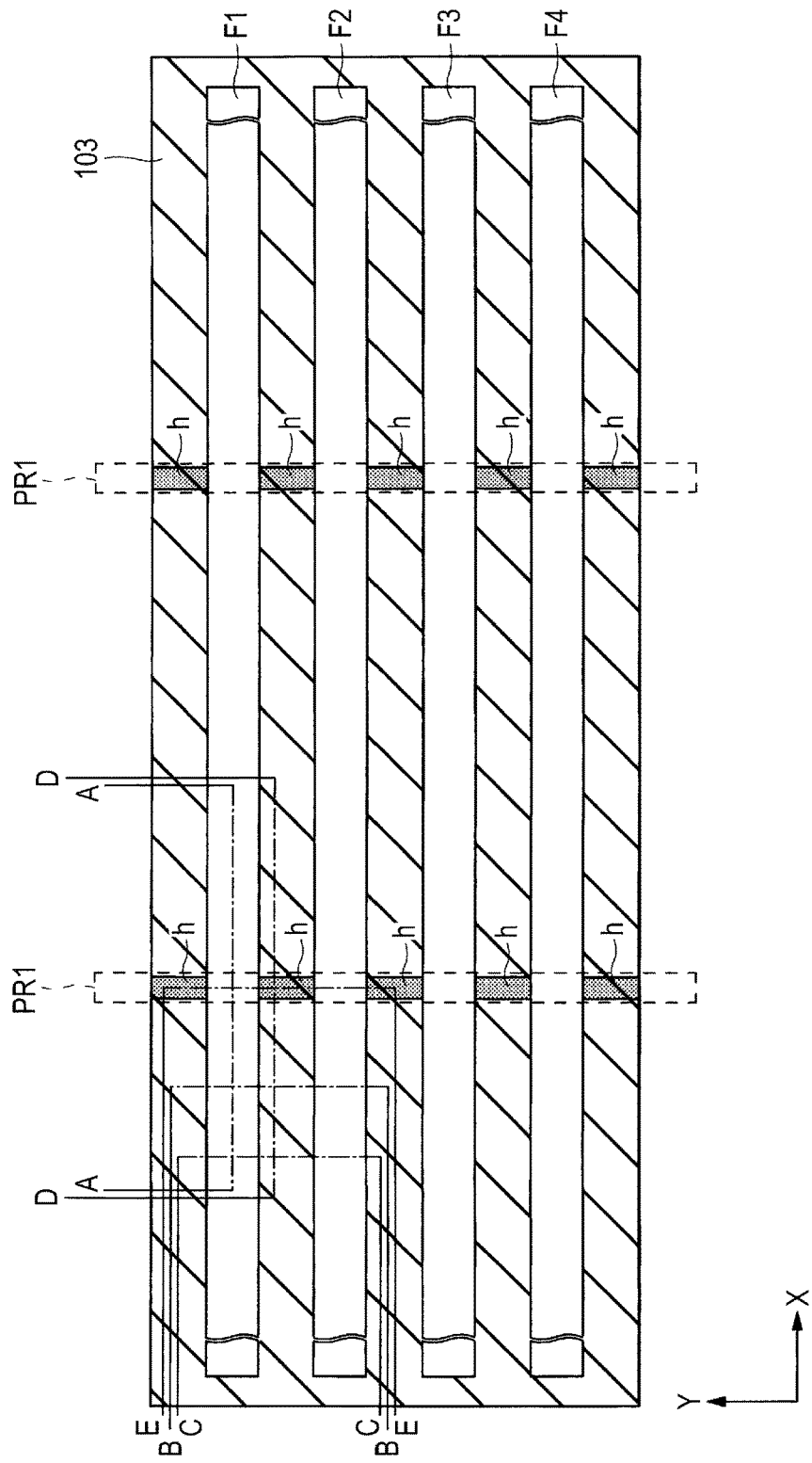
FIG. 15 is a plan view showing the manufacturing process of the semiconductor device in Embodiment 1.

Next, as shown in FIGS. 11 to 15, the top surface of the element isolation region 103 in the memory cell region MA is lowered. For example, as shown in FIGS. 11 and 12, a photoresist film (mask film) PR1 covering the peripheral circuit region PA is formed. Then, using the photoresist film PR1 as a mask, the top surface of the element isolation region 103 in the memory cell region MA is lowered by a given distance by dry etching (FIGS. 13 and 14). The distance by which the top surface is lowered is, e.g., about 50 nm. In Embodiment 1, a part of the element isolation region 103 in the memory cell region MA is covered herein with the photoresist film PR1 to provide the protruding portion (non-lowered portion) h (see the D-D portion of FIG. 12).

The region covered with the photoresist film PR1 is between the regions where the memory gate electrodes MG are to be formed, which is the rectangular region having a width of, e.g., 40 nm to 50 nm and extending in the Y-direction at substantially the middle portion between the regions where the memory gate electrodes MG are to be formed (see FIG. 15). The width of the photoresist film PR1 in the X-direction is, e.g., about the same as the width of each of the plugs P1 described later in the Y-direction.

Thus, over the linear element isolation regions 103 extending in the X-direction, the protruding portions (non-lowered portions) h are formed to be spaced apart at regular intervals in the X-direction (see FIGS. 14 and 15).

By the etching, in the memory cell region MA, the upper portion of the semiconductor substrate 100 located between the element isolation regions 103 is formed into the projecting portions (cuboid-shaped projecting portions). The projecting portions serve as the fins F (see the hatched portions of FIG. 5 and FIG. 13). That is, the linear isolation regions 103 and the linear fins F are alternately arranged. In the linear element isolation regions 103 extending in the X-direction, the protruding portions (non-lowered portions) h and the "lowered portions" as the other portions are provided. Note that, in the peripheral circuit region PA, the fins F are not formed. That is, the element isolation region 103 in the peripheral circuit region PA is not lowered. By thus covering the regions where the protruding portions (non-lowered portions) h are to be formed using the photoresist film PR1 covering the region where the element isolation region 103 is not to be lowered, the protruding portions (non-lowered portions) h can be formed without increasing the number of masks (exposure original plates). Subsequently, the photoresist film PR1 is removed.

Next, etching is performed such that the respective heights of the protruding portions (non-lowered portions) h and the element isolation region 103 in the peripheral circuit region PA are the same as the heights of the top surfaces of the fins F. For example, the protruding portions (non-lowered portions) h and the element isolation region 103 in the peripheral circuit region PA are etched by a thickness equivalent to the combined thickness of the silicon nitride film HM2 and the silicon dioxide film HM1. Note that it may also be possible that the element isolation region 103 is over-etched, and the respective heights of the protruding portions (non-lowered portions) h and the element isolation region 103 in the peripheral circuit region PA are lower than the heights of the top surfaces of the fins F. As described above, it is appropriate for the heights of the protruding portions (non-lowered portions) h to be 10 nm or more larger than the height of the "lowered portion".

Then, the silicon nitride film HM2 is removed and, using the silicon dioxide film HM1 as a through film, a p-type impurity (such as, e.g., boron (B)) is ion-implanted. Thus, into the fins F (semiconductor substrate 100 (fins F)), the p-type impurity is introduced. The region where the p-type impurity is introduced is referred to as a p-type well (not shown). It may also be possible to form an n-type well by ion-implanting an n-type impurity into a region not shown.

Figure 16:
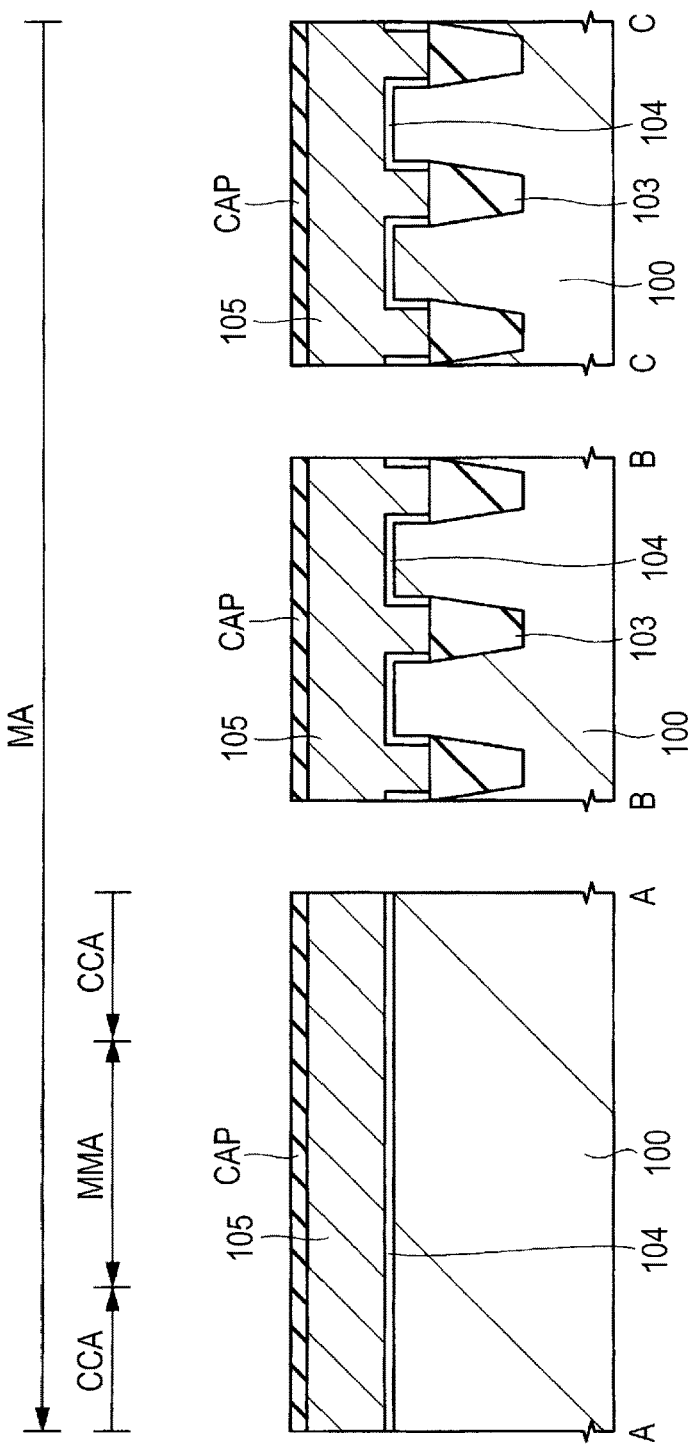
FIG. 16 is a cross-sectional view showing the manufacturing process of the semiconductor device in Embodiment 1.
Figure 17:
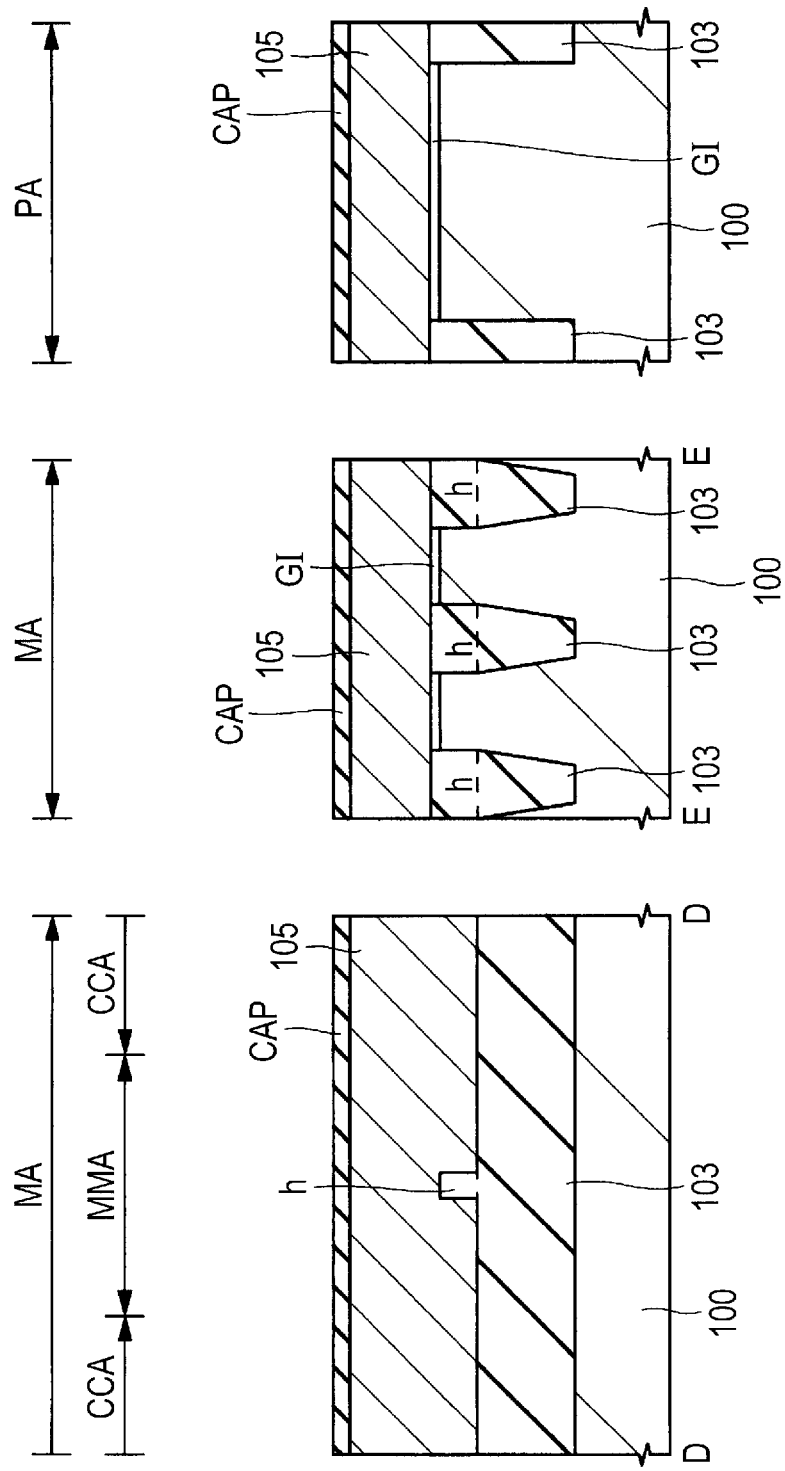
FIG. 17 is a cross-sectional view showing the manufacturing process of the semiconductor device in Embodiment 1.

Next, as shown in FIGS. 16 and 17, over the semiconductor substrate 100 (fins F), an insulating film 104 is formed. The insulating film 104 serves as the control gate insulating films CGI and the gate insulating films GI. For example, over the semiconductor substrate 100 (fins F), a silicon dioxide film having a thickness of about 2 nm is formed by thermal oxidation. Then, over the insulating film 104 (CGI and GI), a polysilicon film (conductive film) 105 for the control gate electrodes CG and the gate electrodes GE are formed. For example, over the insulating film 104 (GGI and GI) and the isolation regions 103, a polysilicon film 105 (CG and GE) having a thickness of about 120 nm is formed using a CVD method or the like. Then, over the polysilicon film 105 (CG and GE), the cap insulating film CAP is formed. For example, over the polysilicon film 105

(CG and GE), a silicon nitride film having a thickness of about 80 nm is formed using a CVD method or the like.

Figure 18:
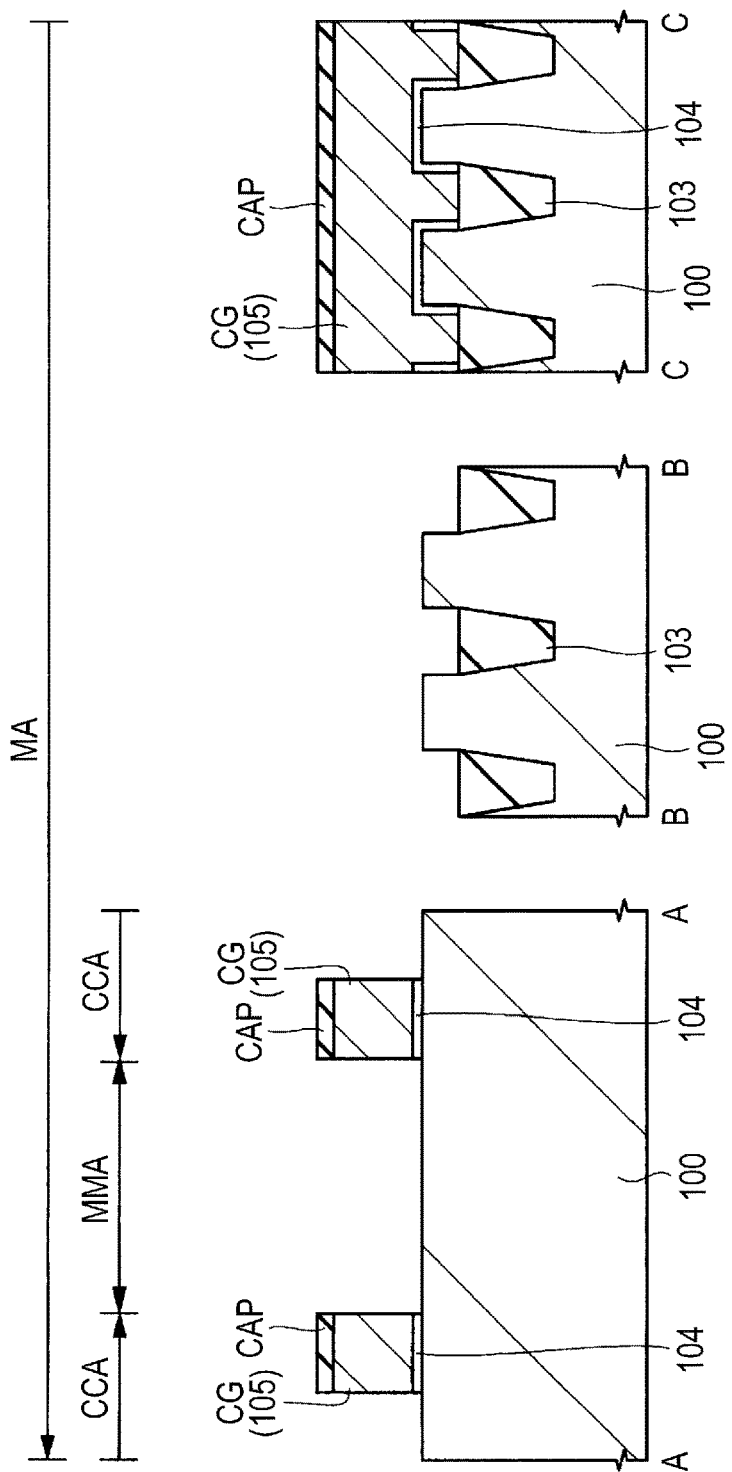
FIG. 18 is a cross-sectional view showing the manufacturing process of the semiconductor device in Embodiment 1.
Figure 19:
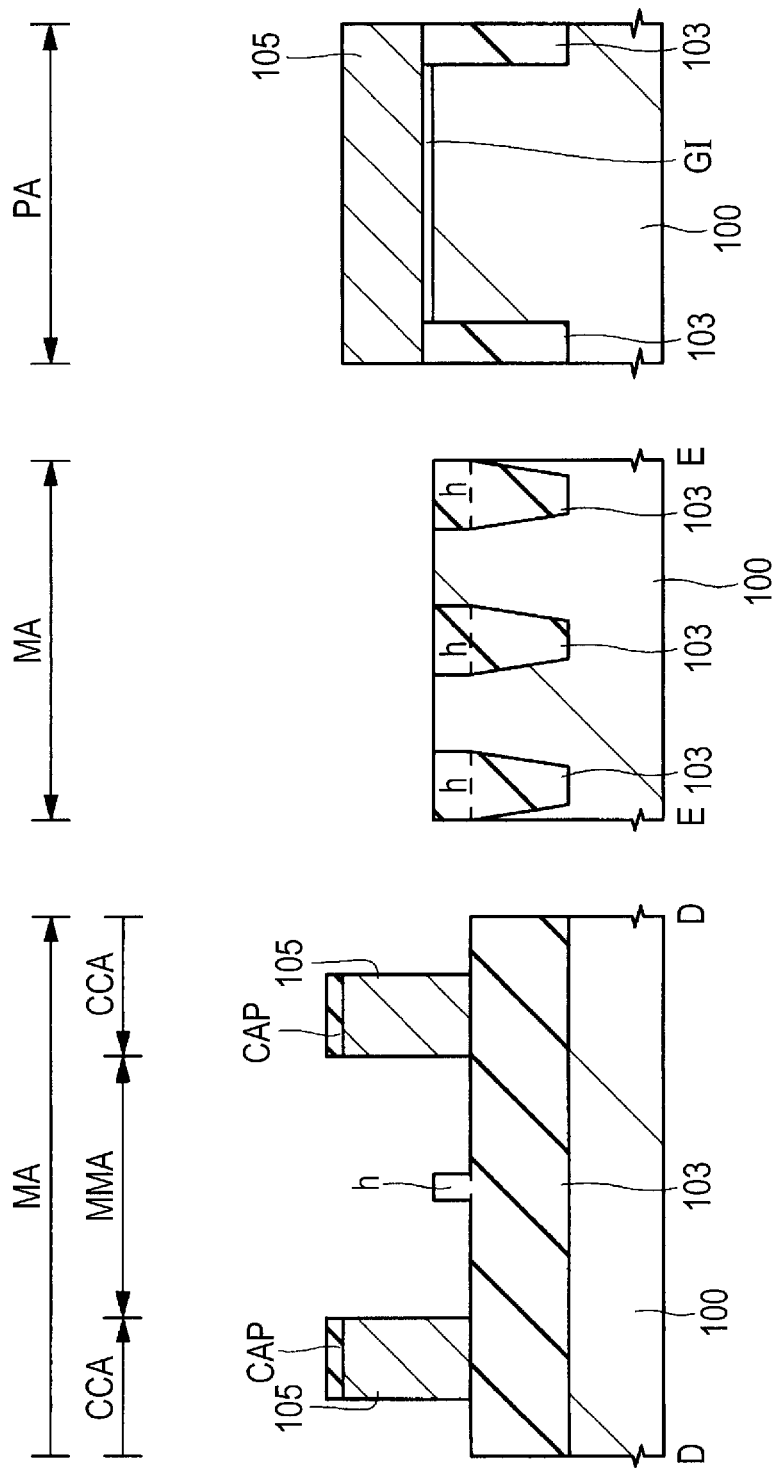
FIG. 19 is a cross-sectional view showing the manufacturing process of the semiconductor device in Embodiment 1.

Next, as shown in FIGS. 18 and 19, using a photolithographic technique and a dry etching technique, a multi-layer film including the insulating film 104 and the polysilicon film 105 is patterned to form the control gate electrodes CG. The both end portions of the region NMA between the control gate electrodes CG serve as the regions where the memory gate electrodes MG described later are to be formed. Also, the protruding portions h and the portions on both sides thereof are to be located between the memory gate electrodes MG.

Then, using a photolithographic technique and a dry etching technique, the cap insulating film CAP over the polysilicon film 105 in the peripheral circuit region PA is removed. Note that, at this time, in the shunt region (SH), the cap insulating film CAP over the control gate electrode CG may also be removed therefrom (see FIG. 45 in Embodiment 3). In the area from which the cap insulating film CAP has been removed, the metal silicide film SIL described later is formed. In the area of the shunt region (SH) from which the cap insulating film CAP has been removed, the plug P1 is disposed via the foregoing metal silicide SIL (see FIG. 45 in Embodiment 3 or the like). Thus, the area of the shunt region (SH) from which the cap insulating film CPA has been removed serves as the region where the metal silicide film SIL is to be formed and serves also as the area where the plug P1 is to be formed.

Figure 20:
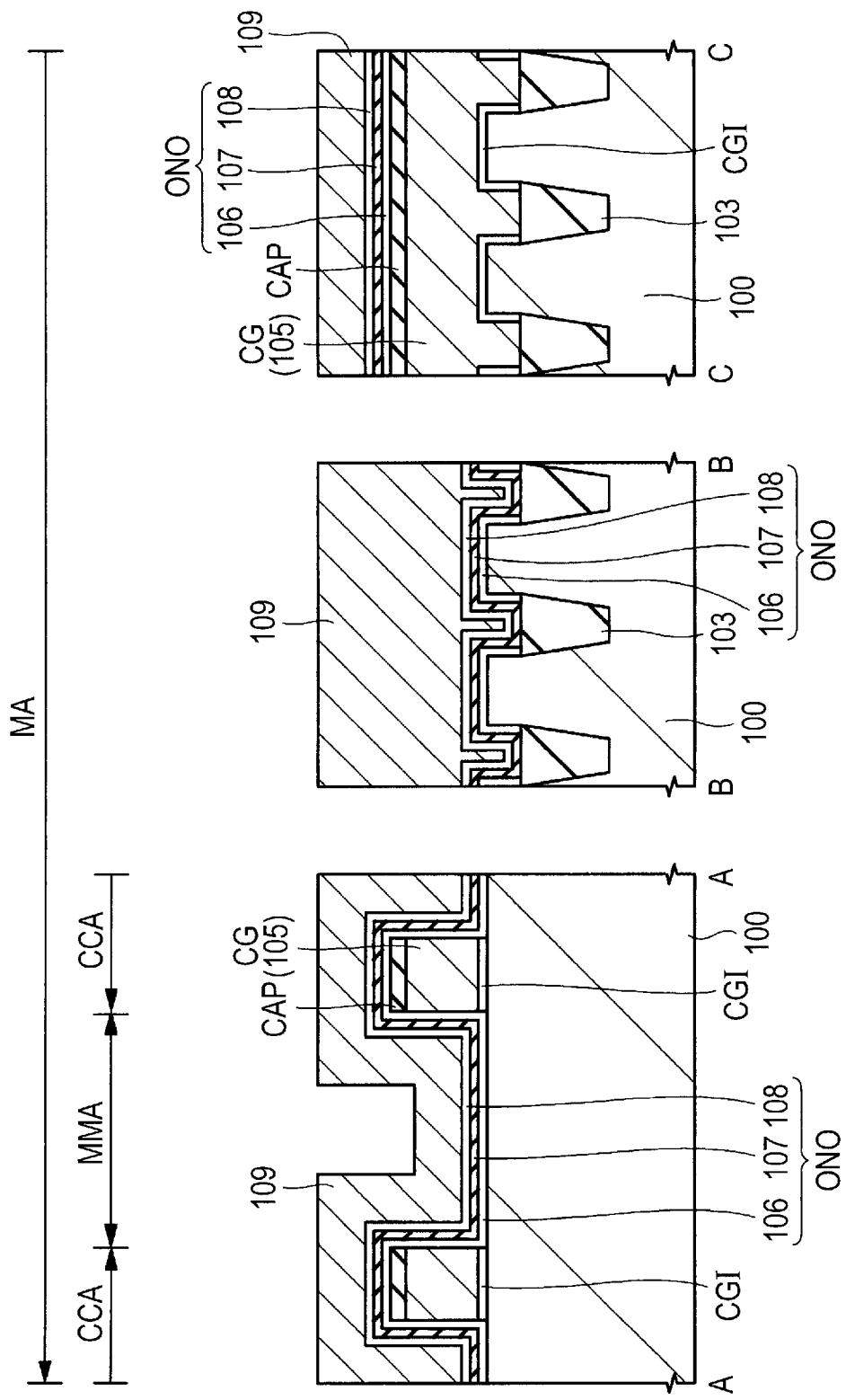
FIG. 20 is a cross-sectional view showing the manufacturing process of the semiconductor device in Embodiment 1.
Figure 21:
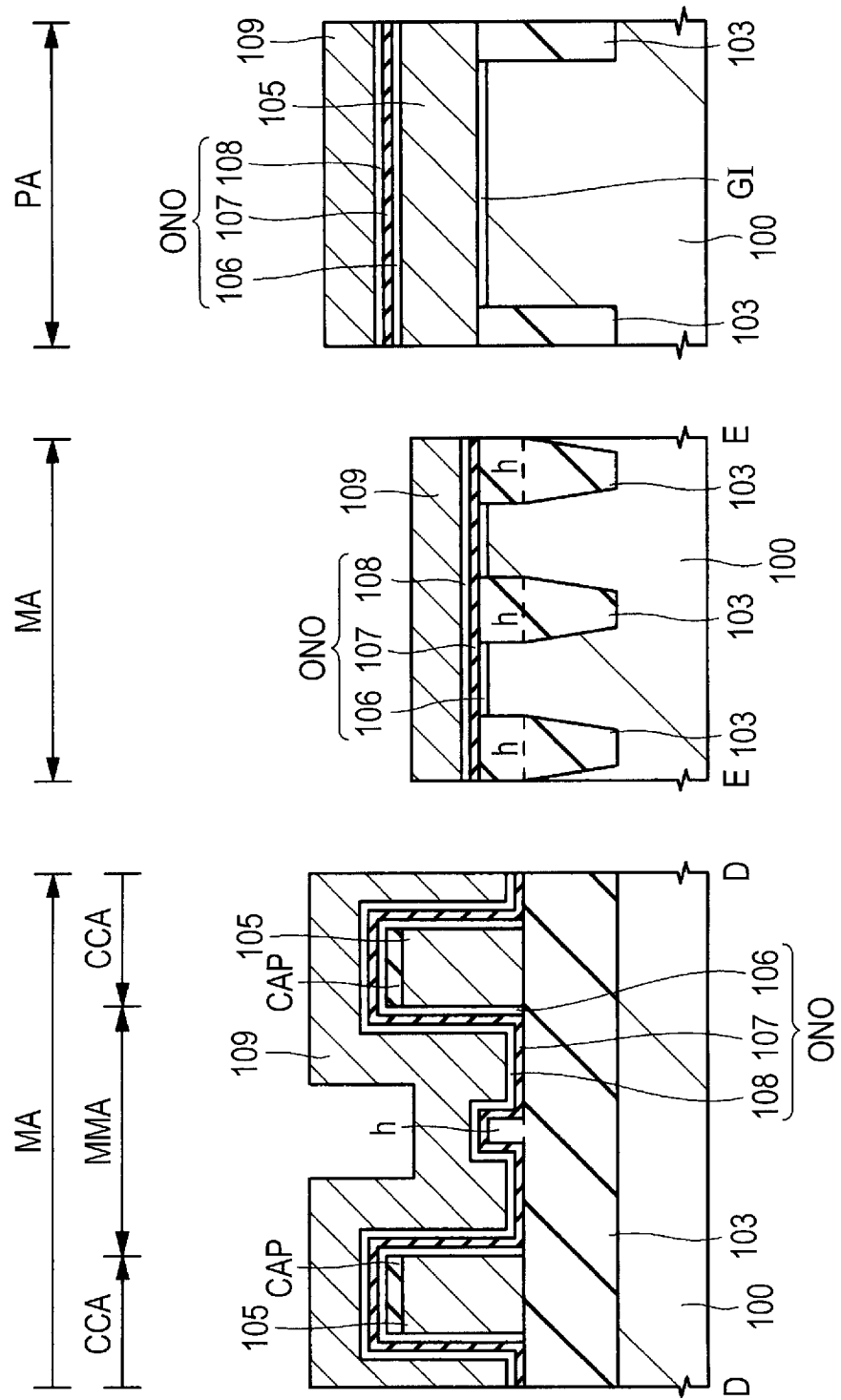
FIG. 21 is a cross-sectional view showing the manufacturing process of the semiconductor device in Embodiment 1.

Next, as shown in FIGS. 20 and 21, the insulating film ONO (106, 107, and 108) is formed. First, over the semiconductor substrate 100 (fins F) including the control gate electrodes CG, e.g., a silicon dioxide film is formed as the lower-layer insulating film 106. The silicon dioxide film is formed by, e.g., a thermal oxidation method to a film thickness of about 4 nm. Note that the silicon dioxide film may also be formed using a CVD method or the like. In FIG. 20, for the sake of convenience, the lower-layer insulating film (silicon dioxide film) 106 is clearly shown over the cap insulating film CAP (the same applies also to the other embodiments). However, when the silicon dioxide film is a thermal oxidation film, the silicon dioxide film is formed only over the side walls of the polysilicon film 105 and is not formed over the cap insulating film CPA.

Then, over the lower-layer insulating film 106, e.g., a silicon nitride film is deposited as the intermediate-layer insulating film 107 by a CVD method or the like to a film thickness of about 7 nm. The intermediate-layer insulating film 107 serves as the charge storage portion of the memory cell. Then, over the intermediate-layer insulating film 107, the upper-layer insulating film 108 is formed. Then, over the intermediate-layer insulating film 107, e.g., a silicon dioxide film is deposited as the upper-layer insulating film 108 by a CVD method or the like to a film thickness of about 9 nm.

Next, over the insulating film ONO (106, 107, and 108), a conductive film 109 serving as the memory gate electrodes MG is formed. For example, over the insulating film ONO (106, 107, and 108), a polysilicon film having a thickness of about 40 nm is deposited as the conductive film 109 using a CVD method or the like.

Figure 22:
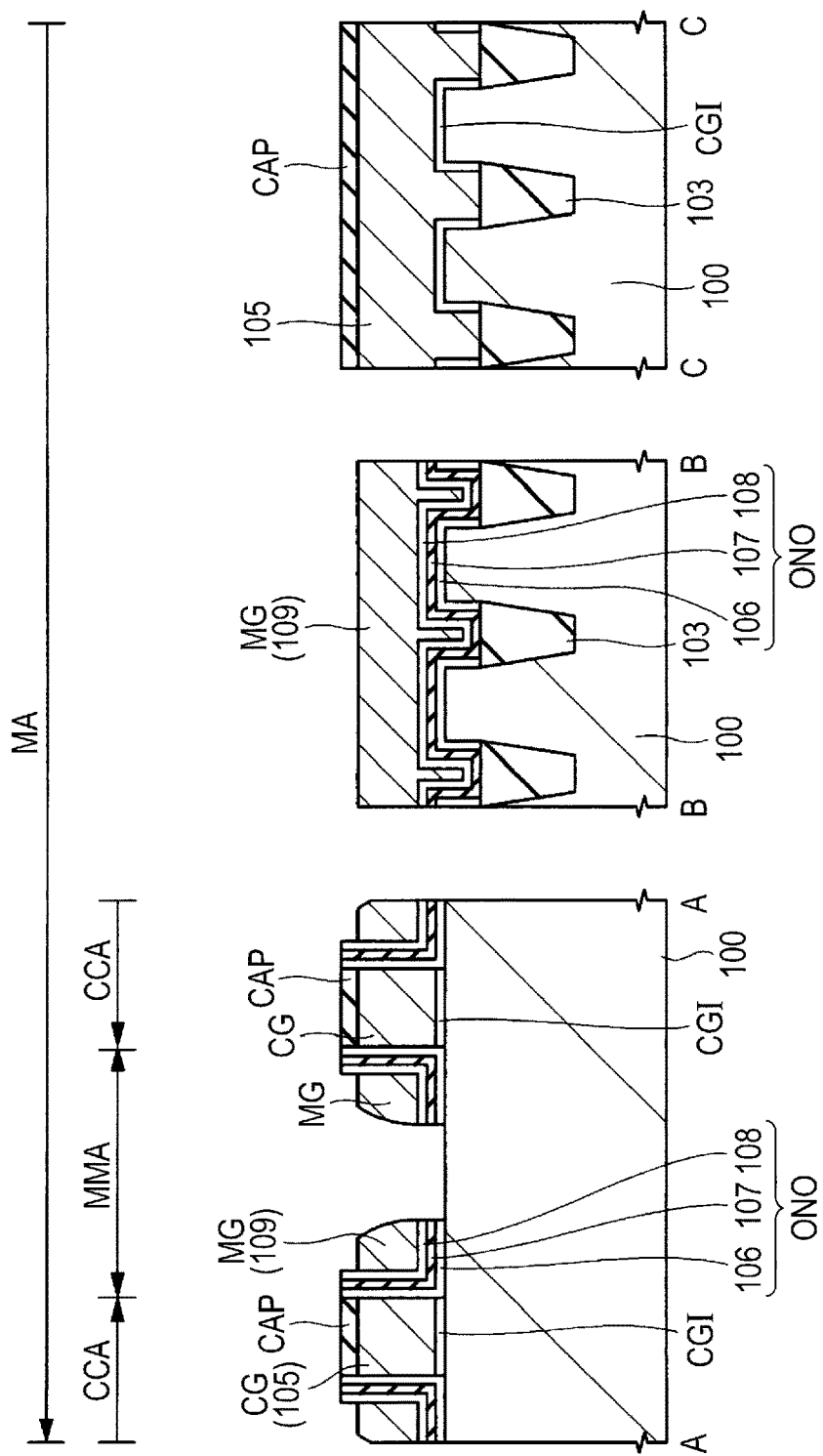
FIG. 22 is a cross-sectional view showing the manufacturing process of the semiconductor device in Embodiment 1.
Figure 23:
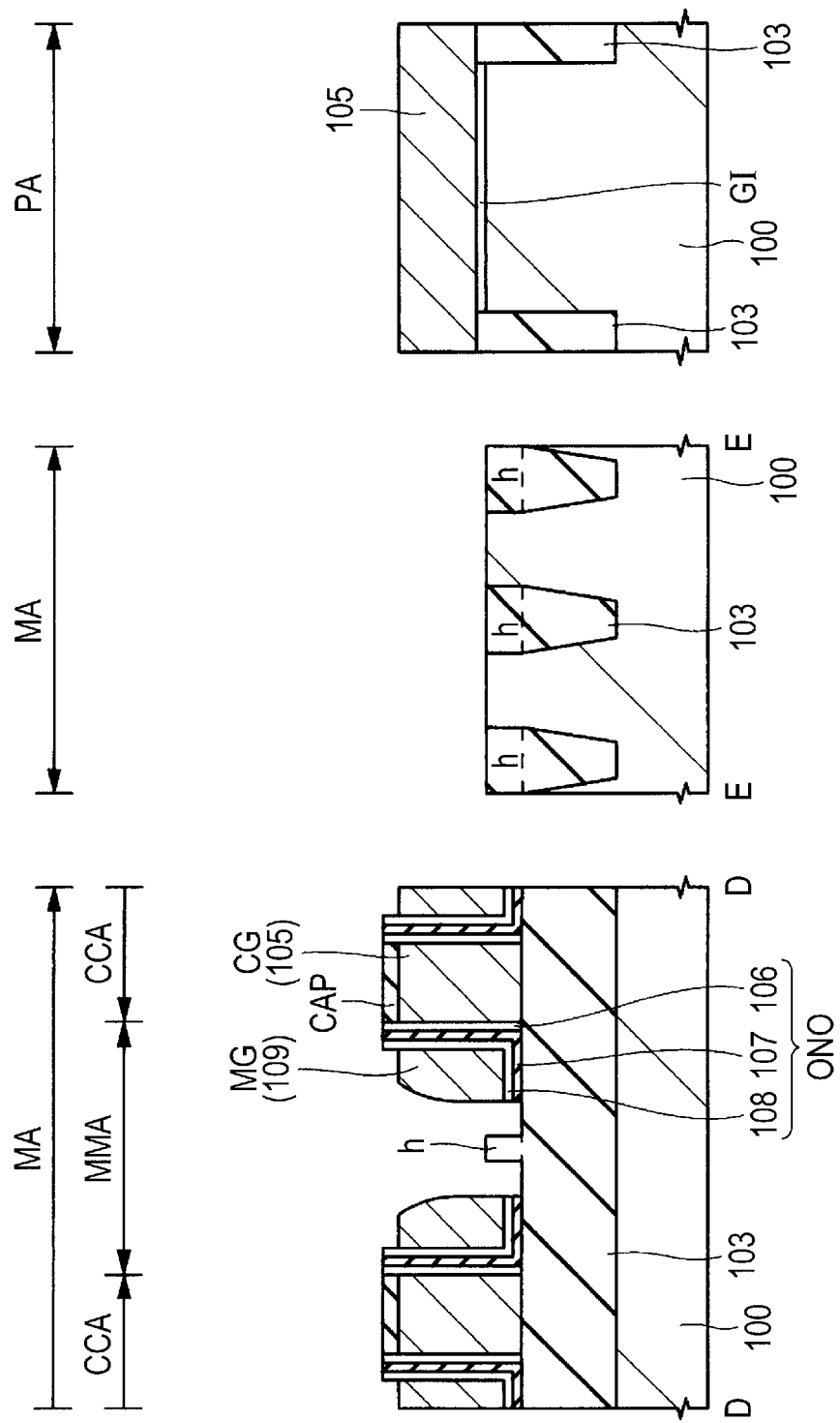
FIG. 23 is a cross-sectional view showing the manufacturing process of the semiconductor device in Embodiment 1.

Then, as shown in FIGS. 22 and 23, over the side-wall portions of the control gate electrodes CG, the sidewall-shaped memory gate electrodes MG are formed.

For example, a polysilicon film is etched back. In this etch-back step, the polysilicon film is removed by anisotropic dry etching to a depth corresponding to a predetermined film thickness from the top surface thereof. This step allows the polysilicon film to remain in the form of sidewalls (side-wall films) over the side-wall portions of the control gate electrodes CG each via the insulating film ONO. Note that, on both sides of the region CCA, the polysilicon film remains, and the polysilicon film on one of the both sides serves as the memory gate electrode MG. Note that the sidewall-shaped polysilicon film on the other side is removed using a photolithographic technique and a dry etching technique.

Next, using the memory gate electrodes MG as a mask, the insulating film ONO (106, 107, and 108) is etched. As a result, between the memory gate electrodes MG and the semiconductor substrate 100 (fins F) and between the control gate electrodes CG and the memory gate electrodes MG, the insulating film ONO (106, 107, and 108) remains.

Figure 24:
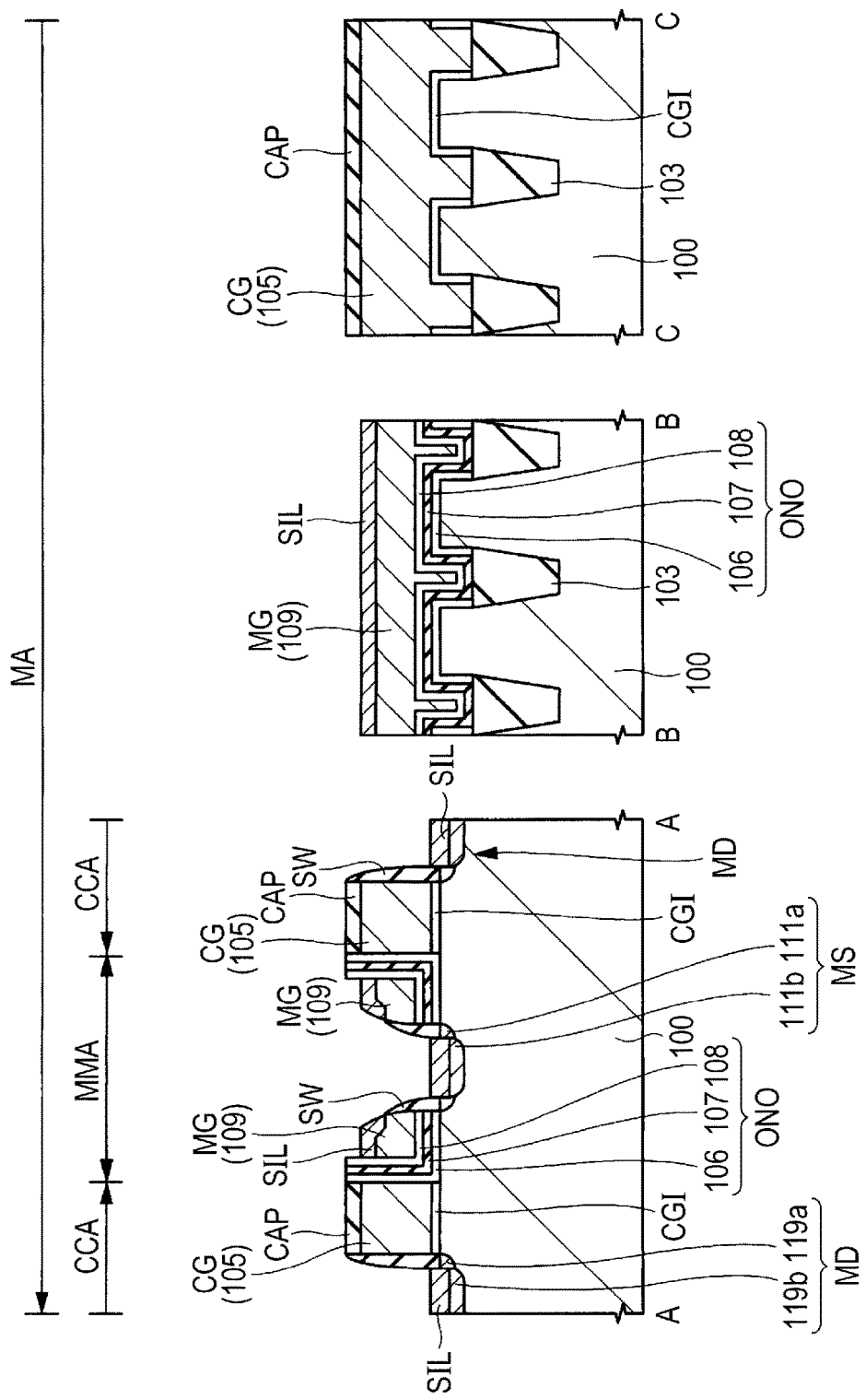
FIG. 24 is a cross-sectional view showing the manufacturing process of the semiconductor device in Embodiment 1.

Next, as shown in FIGS. 24 and 25, over the memory cell region MA and the peripheral circuit region PA, a silicon nitride film (protective film) having a film thickness of about 40 nm is deposited using a CVD method or the like. Subsequently, it may also be possible to leave the silicon nitride film (protective film) only over the memory cell region MA using a photolithographic technique and a dry etching technique.

Next, using a photolithographic technique and a dry etching technique, the insulating film 104 (GI) and the polysilicon film 105 (GE) in the peripheral circuit region PA are processed to form the gate insulating films GI and the gate electrodes GE. Then, the foregoing silicon nitride film (protective film) over the memory cell region MA and the gate electrodes GE are removed by wet etching or the like.

Next, in the memory cell region MA, the source regions MS and the drain regions MD are formed while, in the peripheral circuit region PA, the source/drain regions SD are formed.

For example, using the memory gate electrodes MG and the control gate electrodes CG as a mask, an n-type impurity such as arsenic (As) or phosphorus (P) is implanted into the semiconductor substrate 100 (fins F) to form the $n^-$-type semiconductor regions 111a and 119a. At this time, the $n^-$-type semiconductor regions 111a are formed by self-alignment with the side walls of the memory gate electrodes MG, while the $n^-$-type semiconductor regions 119a are formed by self-alignment with the side walls of the control gate electrodes CG. On the other hand, an n-type impurity such as arsenic (As) or phosphorus (P) is implanted into the semiconductor substrate 100 (fin F) using the gate electrode GE as a mask to form the $n^-$-type semiconductor regions GE. At this time, the $n^-$-type semiconductor regions 119a are formed by self-alignment with the side walls of the gate electrode GE.

Next, over the respective side-wall portions of the memory gate electrodes MG, the control gate electrodes CG, and the gate electrode GE, the side-wall insulating films SW are formed. For example, over the semiconductor substrate 100 (fins F) including the memory gate electrodes MG, the control gate electrodes CG, and the gate electrode GE, a silicon nitride film having a film thickness of about 40 nm is deposited using a CVD method or the like. The silicon nitride film is removed by anisotropic dry etching to a depth corresponding to a predetermined film thickness from the top surface thereof to form the side-wall insulating films SW. Then, using the memory gate electrodes MG, the control gate electrodes CG, the gate electrode GE, and the side-wall insulating films SW as a mask, an n-type impurity such as arsenic (As) or phosphorus (P) is implanted into the semiconductor substrate 100 (fins F) to form the $n^+$-type semiconductor regions 111b and 119b. At this time, the $n^+$-type semiconductor regions 111b and 119b are formed by self-alignment with the side-wall insulating films SW. Each of the n+-type semiconductor regions 111b has an impurity concentration higher than that of each of the n−-type semiconductor regions 111a and a junction depth deeper than that thereof. Also, each of the n+-type semiconductor regions 119b has an impurity concentration higher than that of each of the n−-type semiconductor regions 119a and a junction depth deeper than that thereof. By this step, the source regions MS each including the n−-type semiconductor region 111a and the n+-type semiconductor region 111b are formed, and the drain regions MD each including the n−-type semiconductor region 119a and the n+-type semiconductor region 119b are formed. Also, the source/drain regions SD each including the n−-type semiconductor region 119a and the n+-type semiconductor region 119b are formed.

Next, over the memory gate electrodes MG, the source regions MS, the drain regions MD, the source/drain regions SD, and the gate electrode GE in the peripheral circuit region PA, the metal silicide films SIL are formed using a salicide technique. At this time, in the area (see FIG. 45 for Embodiment 3) of the shunt region (SH) from which the cap insulating film CAP over the control gate electrode CG has been removed also, the metal silicide film SIL is formed.

For example, over the memory gate electrodes MG, the source regions MS, the drain regions MD, the source/drain regions SD, the gate electrode GE in the peripheral circuit region PA, and the area of the shunt region (SH) from which the cap insulating film CAP over the control gate electrode CG has been removed, a metal film (not shown) is formed. Then, heat treatment is performed on the semiconductor substrate 100 (fins F) to cause the memory gate electrodes MG, the source regions MS, the drain regions MD, the source/drain regions SD, the gate electrode GE in the peripheral circuit region PA, and the area of the shunt region (SH) from which the cap insulating film CAP over the control gate electrode CG has been removed to react with the foregoing metal film. Thus, the metal silicide films SIL are formed. The foregoing metal film is made of, e.g., nickel (Ni), a nickel-platinum (Pt) alloy, or the like and can be formed using a sputtering method or the like. Then, the unreacted metal film is removed. The metal silicide films SIL allow reductions in resistances such as diffusion resistance and contact resistance.

Then, over the control gate electrodes CG, the memory gate electrodes MG, the gate electrode GE, and the like, the interlayer insulating film IL1 is formed. For example, as the interlayer insulating film IL1, a silicon dioxide film is deposited by a CVD method or the like. As necessary, the upper portion of the silicon dioxide film is planarized by a CMP method or the like. Then, in the silicon dioxide film, the plugs P1 are formed and, over the plugs P1, the wires M1 are formed. The plugs P1 can be formed by, e.g., embedding a conductive film in the contact holes in the interlayer insulating film IL1. The wires M1 can be formed by, e.g., embedding a conductive film in wire trenches in the interlayer insulating film IL2. Then, the steps of forming the interlayer insulating film, the plugs, and the wires are repeated to be able to form the interlayer insulating films IL3 and IL4, the plugs P2, and the wires M2 (see FIGS. 1 to 4).

By the foregoing process steps, the semiconductor device in Embodiment 1 can be formed.

Embodiment 2

In the semiconductor device in Embodiment 1, the protruding portions (non-lowered portions) h are provided between the adjacent memory gate electrodes MG in the element isolation regions (103) between the plurality of fins F provided in the form of lines extending in the X-direction. However, the protruding portions (non-lowered portions) h may also be provided between the adjacent control gate electrodes CG.

Referring to the drawings, the following will describe a structure of a semiconductor device in Embodiment 2. A configuration in Embodiment 2 is the same as that in the case of Embodiment 1 except for the positions where the protruding portions (non-lowered portions) h are formed so that a description thereof is omitted.

[Description of Structure]

In the same manner as in Embodiment 1, the semiconductor device in Embodiment 2 also has memory cells (memory transistors and control transistors) formed in the memory cell region MA and MISFETs formed in the peripheral circuit region PA. The MISFETs formed in the peripheral circuit region PA are the same as in the case of Embodiment 1 so that a description thereof is omitted.

(Description of Structure of Memory Cell)

Figure 30:
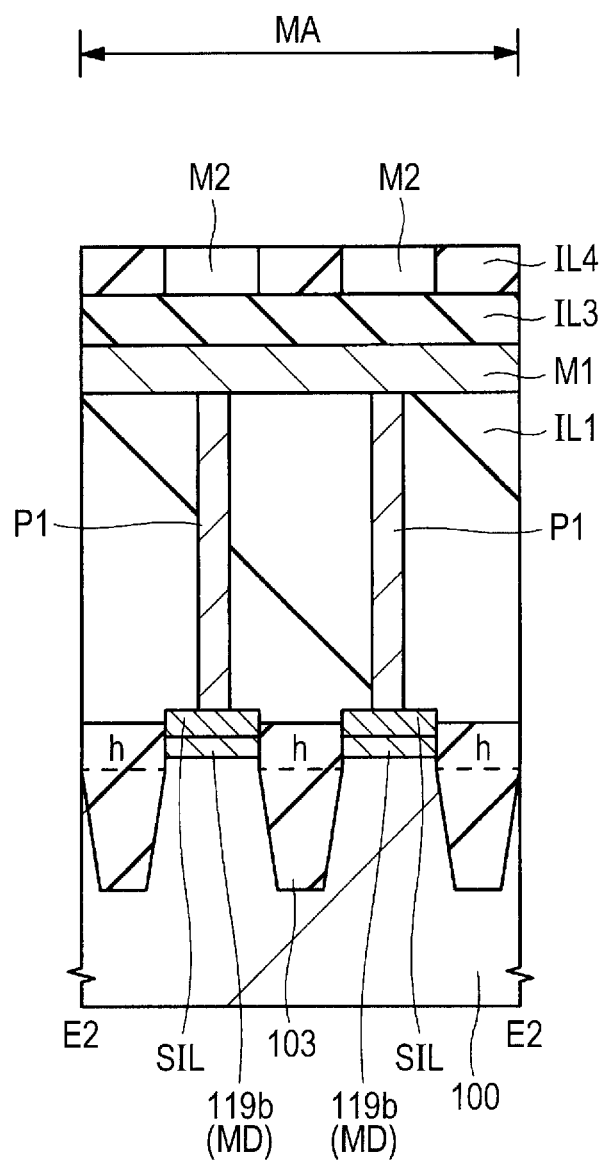
FIG. 30 is a cross-sectional view showing the configuration of the semiconductor device in Embodiment 2.
Figure 31:
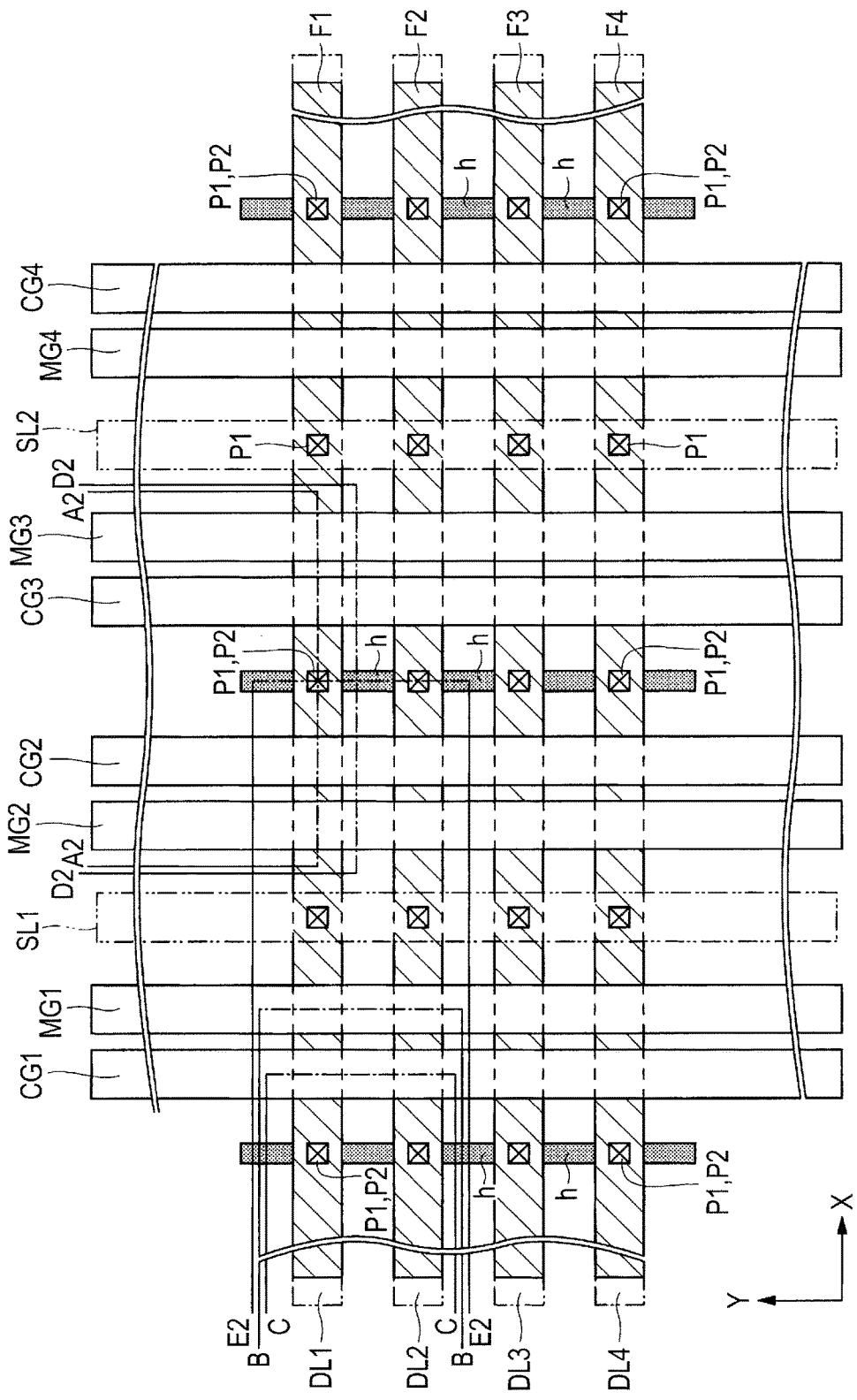
FIG. 31 is a plan view showing a memory array in the semiconductor device in Embodiment 2.

FIGS. 27 to 30 are cross-sectional views showing the configuration of the semiconductor device in Embodiment 2. FIG. 31 is a plan view showing a memory array in the semiconductor device in Embodiment 2. For example, FIG. 27 corresponds to a cross section along the line A2-A2 in FIG. 31, FIG. 28 corresponds to cross sections along the lines B-B and C-C in FIG. 31, and FIG. 29 corresponds to a cross section along the line D2-D2 in FIG. 31. FIG. 30 corresponds to a cross section along the line E2-E2 in FIG. 31.

As shown in FIGS. 27 to 31, in the semiconductor device in Embodiment 2 also, each of the memory cells includes the control transistor having the control gate electrode CG and the memory transistor having the memory gate electrode MG.

In the semiconductor device in Embodiment 2, the positions of the protruding portions (non-lowered portions) h are different from those in Embodiment 1. In the semiconductor device in Embodiment 2, the protruding portions (non-lowered portions) h are provided between the adjacent control gate electrodes CG (FIG. 31).

<About Protruding Portion (Non-Lowered Portion) h>

In Embodiment 2, as shown in FIG. 31, each of the protruding portions (non-lowered portions) h is provided in the element isolation region (103) located between the plurality of fins F in the form of lines extending in the X-direction. As is obvious from FIG. 29, the protruding portion (non-lowered portion) h is located between the control gate electrodes CG.

Normally, the top surface of each of the element isolation regions 103 between the fins F is lowered from the top surface (upper surface or top) of each of the fins F. The side surfaces of the fins F are exposed to a depth corresponding to the level difference between the top surface of the fin F and the element isolation region 103 to allow an improvement in effective channel width (see FIG. 28). For example, the element isolation regions 103 are formed by forming isolation trenches in the semiconductor substrate 100 located between the regions where the fins F are formed and embedding an insulating film in the isolation trenches. By lowering the top surface of the embedded insulating film, the fins F are allowed to project.

In Embodiment 2, in the element isolation regions 103 between the fins F, the protruding portions (non-lowered portions) h where the top surface of the embedded insulating film is not lowered are provided between the control gate electrodes CG.

By thus providing the protruding portions (non-lowered portions) h, during etching (processing) between the control gate electrodes CG, it is possible to prevent a short circuit between the control gate electrodes CG due to a residue resulting from gate processing.

Figure 32:
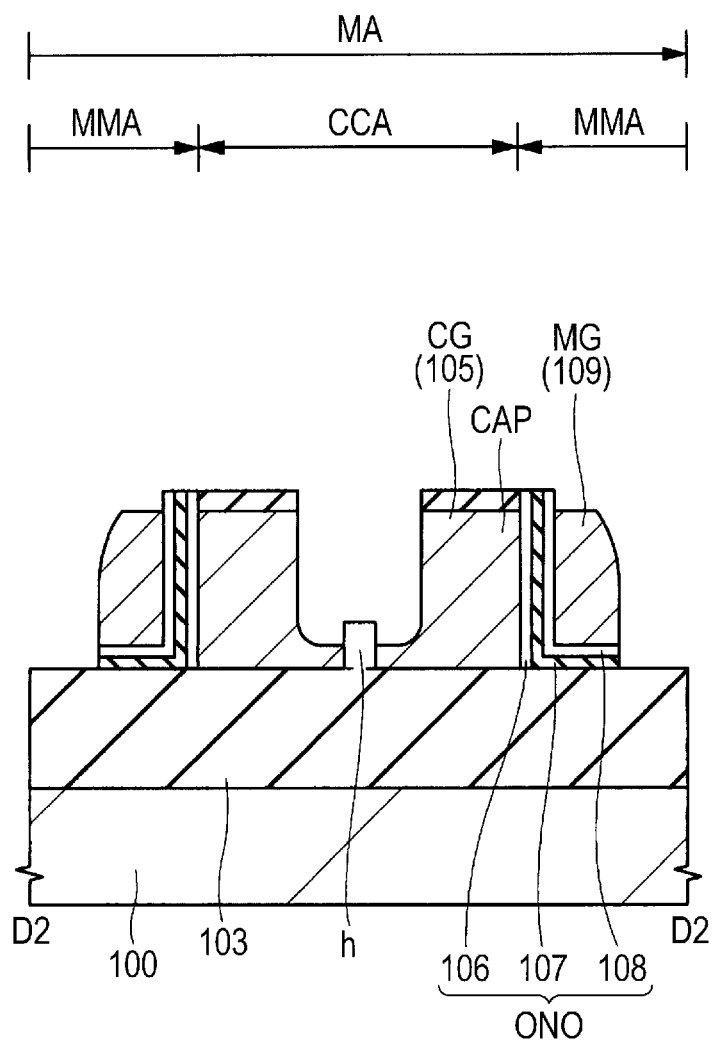
FIG. 32 is a cross-sectional view showing the configuration of the semiconductor device in Embodiment 2.

As shown in FIG. 32, even when a residue is left between the control gate electrodes CG, the residue is divided by the protruding portion (non-lowered portion) h. In other words, over the protruding portion (non-lowered portion) h, the level difference between the top surface of the fin F and the element isolation region 103 is reduced to be able to prevent a residue from being left between the control gate electrodes CG. This can prevent a short circuit between the control gate electrodes CG. FIG. 32 is a cross-sectional view showing the configuration of the semiconductor device in Embodiment 2.

<About Region where Protruding Portion (Non-Lowered Portion) h is Formed>

For example, it may also be possible to provide the protruding portion (non-lowered portion) h in the entire element isolation region 103 between the control gate electrodes CG (inter-control-gate isolation region). In other words, it may also be possible to provide the protruding portion (non-lowered portion) h in the entire inter-control-gate isolation region. The inter-control-gate isolation region is the generally rectangular element isolation region (103) surrounded by, e.g., the fins F1 and F2 and the control gate electrodes CG1 and CG2 in plan view (see FIG. 31).

However, it is appropriate to provide the protruding portion (non-lowered portion) h only at the middle portion of the inter-control-gate isolation region in the patterning step for the control gate electrodes CG in consideration of the misalignment thereof. More specifically, it is appropriate to provide the protruding portion (non-lowered portion) h at the foregoing middle portion of the inter-control-gate isolation region such that the protruding portion (non-lowered portion) h extends in the Y-direction. In this case, the portions on both sides of the protruding portion (non-lowered portion) h serve as the "lowered portions (lower-level isolation portions)". Accordingly, the "lowered portions" are located under the control gate electrodes and on both sides of the protruding portions (non-lowered portions) h in the inter-control-gate isolation region.

The width (length) of the protruding portion (non-lowered portion) h in the X-direction is, e.g., about 40 nm to 50 nm. The width (length) of the protruding portion (non-lowered portion) h in the X-direction can be set to a value close to that obtained by, e.g., adding or subtracting 10 nm to or from the width (length) of the plug P1 in the X-direction. The length of the protruding portion (non-lowered portion) h in the Y-direction is preferably set to a value corresponding to the distance between the fins F. Since a residue resulting from gate processing is left along the side wall of the fin F extending in the X-direction, the protruding portion (Non-lowered portion) h is preferably provided in contact relation with the side wall of the fin F.

By thus providing the protruding portion (non-lowered portion) h in at least a part of the inter-control-gate isolation region, it is possible to prevent a short circuit due to a residue resulting from gate processing. In addition, since the protruding portion (non-lowered portion) h is provided in a part of the inter-control-gate isolation region and the element isolation region (103) along the control gate electrode CG is provided as the "lowered portion", even when the control gate electrodes CG are formed in misaligned relation due to the misalignment of a mask or the like, the side surfaces of the fins F are in contact with the control gate electrodes CG. This can improve the effective channel widths thereof.

<About Height of Element Isolation Region>

In plan view, the protruding portions (non-lowered portions) h of the element isolation region (103) correspond to the dotted portions of FIG. 31. On the other hand, the "lowered portions" of the isolation region (103) correspond to the portions of the generally rectangular linear regions between the fins F (hatched portions) of FIG. 31 which are other than the dotted portions. The "lowered portions" also correspond to the areas of the inter-control-gate isolation region which are located on both sides of each of the protruding portions (non-lowered portions) h. The "lowered portions" also correspond to the "under-gate isolation regions" where the various gate electrodes and the element isolation region (103) overlap each other (under-memory-gate isolation regions or under-control-gate isolation regions). In other words, the protruding portions (non-lowered portions) h are disposed at predetermined intervals in the X-direction in the generally rectangular linear regions between the fins F (hatched portions) of FIG. 31.

The heights of the protruding portions (non-lowered portions) h are higher than the heights of the "lowered portions".

The height of each of the protruding portions (non-lowered portions) h is about the same as the height (H1) of the top surface (upper surface or top) of each of the fins F. It can be said that the height (H1) of the top surface (upper surface or top) of each of the fins F is the height of the top surface of the fin under the control gate electrode CG. The height (H2) of each of the lowered portions" is lower than the height (H1) of the top surface (upper surface or top) of each of the fins F.

The height (H1) of the top surface (upper surface or top) of each of the foregoing fins F need not necessarily be about the same as the height of each of the protruding portions (non-lowered portions) h. The protruding portion (non-lowered portion) h may also be lower in level than the top surface (upper surface or top) of the fin F. The difference (first height difference) between the height (H1) of the top surface (upper surface or top) of the foregoing fin F and the height of the protruding portion (non-lowered portion) h may also be, e.g., not less than 10 nm as a result of a film reduction in the protruding portion (non-lowered portion) h or the like.

The difference (second height difference) between the height (H1) of the top surface (upper surface or top) of the foregoing fin F and the height (H2) of the "lowered portion" is, e.g., about 50 nm. The second height difference is preferably not less than 50 nm.

The foregoing second height difference is larger than the foregoing first height difference.

To prevent a short circuit due to a residue resulting from gate processing, the height of the protruding portion (non-lowered portion) h is preferably 10 nm or more larger than the height of the "lowered portion".

[Description of Manufacturing Method]

The semiconductor device in Embodiment 2 can be formed by the same process steps as those for the semiconductor device in Embodiment 1. It is appropriate to change the position where the photoresist film (mask film) PR1 is formed in the step of lowering the top surface of the element isolation region 103 in the memory cell region MA. That is, it is appropriate to provide the photoresist PR1 at positions to be located later between the adjacent control gate electrodes CG. The other process steps are the same as in the case of Embodiment 1 so that a description thereof is omitted.

[Application Example]

Figure 33:
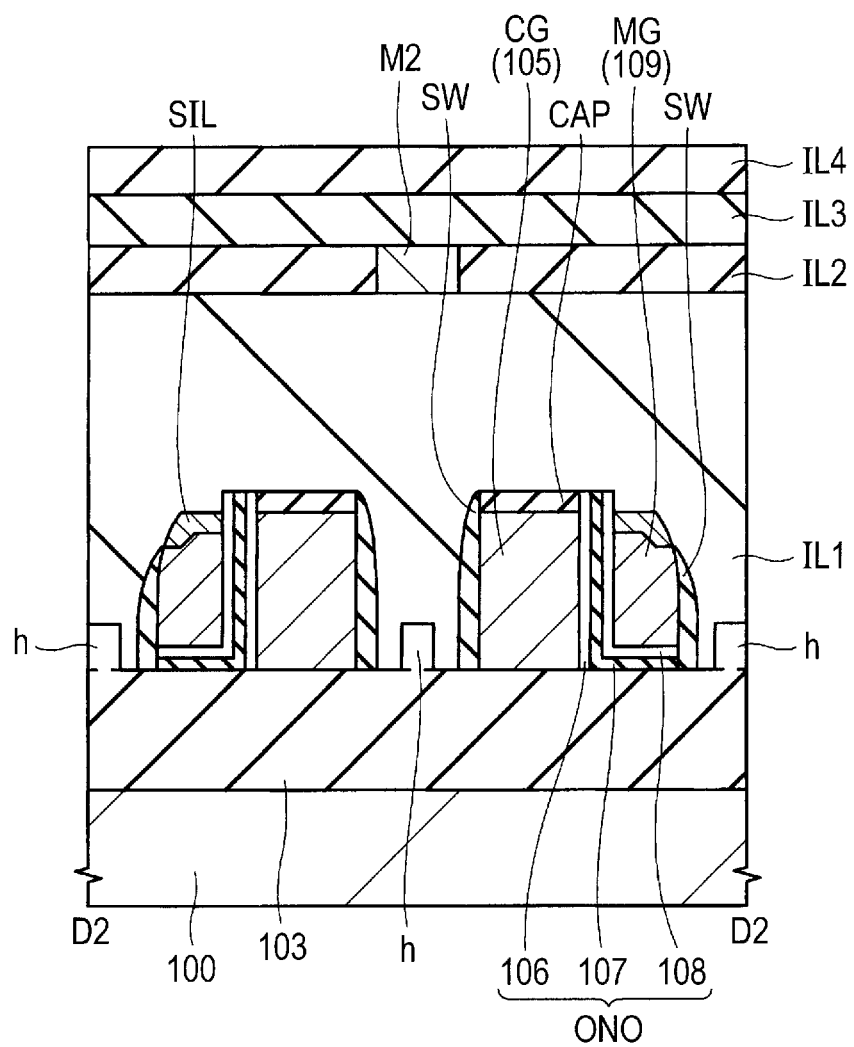
FIG. 33 is a cross-sectional view showing a configuration of a semiconductor device in an application example of Embodiment 2.
Figure 34:
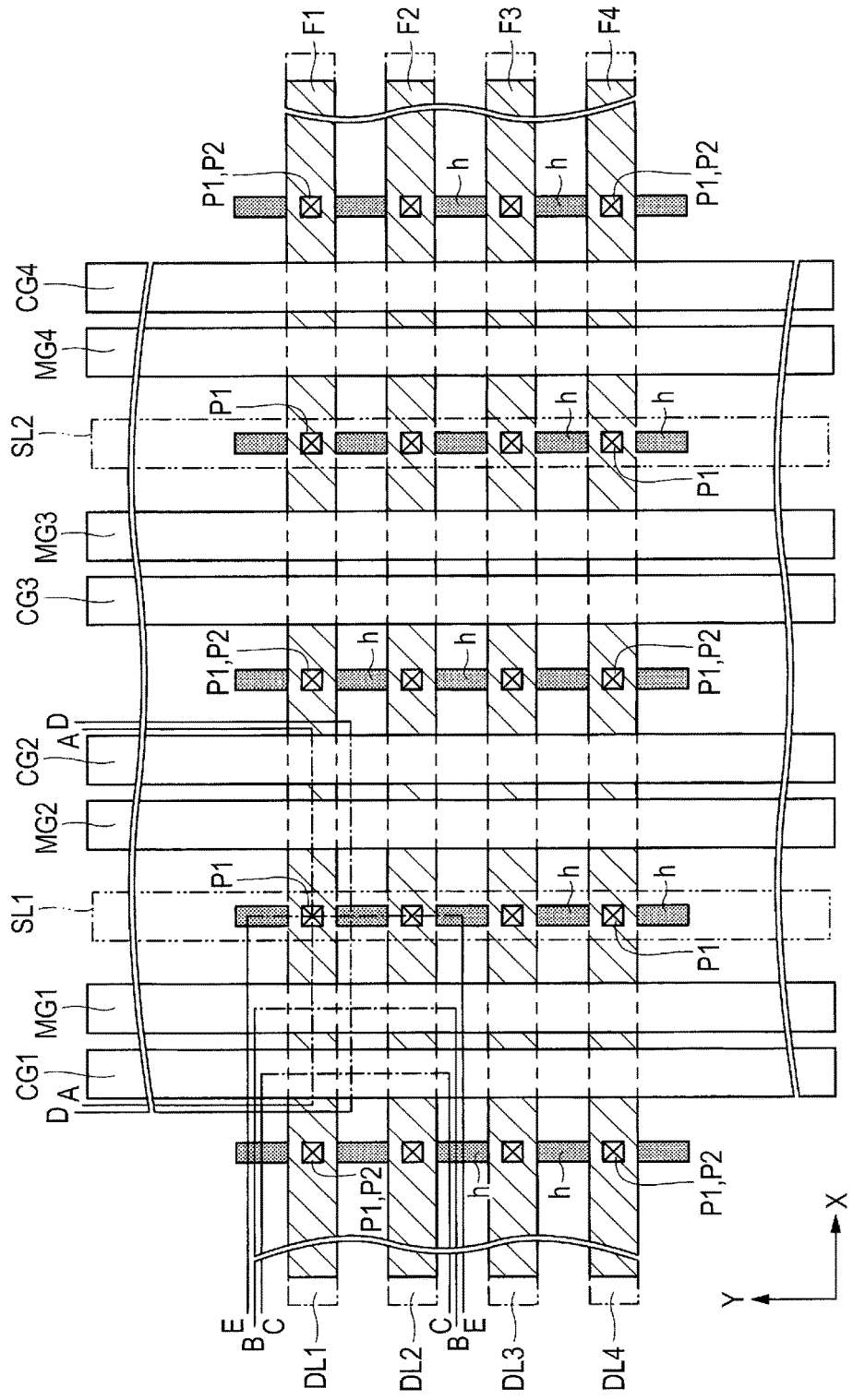
FIG. 34 is a plan view showing the configuration of the semiconductor device in the application example of Embodiment 2.

In the semiconductor device shown in FIGS. 27 to 31, the protruding portions (non-lowered portions) h are provided between the adjacent control gate electrodes CG. However, the protruding portions (non-lowered portions) h may also be provided between the adjacent memory gate electrodes MG (FIGS. 33 and 34). FIGS. 33 and 34 are a cross-sectional view and a plan view each showing a configuration of a semiconductor device in an application example of Embodiment 2.

In the present application example, as shown in FIG. 34, the protruding portions (non-lowered portions) h are provided in the element isolation regions (103) between the plurality of fins F provided in the form of lines extending in the X-direction. As is also obvious from FIG. 33, the protruding portions (non-lowered portions) h are located between the control gate electrodes CG and between the memory gate electrodes MG.

The semiconductor device in the present application example can be formed as follows. It is appropriate that, e.g., in the step of lowering the top surface of the element isolation region 103 in the memory cell region MA described with reference to FIGS. 11 to 15 in Embodiment 1, the photoresist PR1 is provided at positions to be located later between the control gate electrodes CG and the memory gate electrodes MG.

For example, in addition to the photoresist film (PR1) covering the peripheral circuit region PA, the photoresist film (PR1) is formed over a substantially middle portion between the regions where the memory gate electrodes MG are to be formed to have a width of, e.g., 40 nm to 50 nm and extend in the Y-direction. The photoresist film (PR1) is also formed over a substantially middle portion between the regions where the control gate electrodes CG are to be formed to have a width of 40 nm to 50 nm and extend in the Y-direction.

As a result, over the element isolation regions 103 in the form of lines extending in the X-direction, the protruding portions (non-lowered portions) h are formed to be spaced apart at predetermined intervals in the X-direction.

The other process steps are the same as in the case of Embodiment 1 so that a description thereof is omitted.

Embodiment 3

In each of the examples described in Embodiments 1 and 2, the protruding portions (non-lowered portions) h are provided in the memory array in the semiconductor device. However, the protruding portions (non-lowered portions) h may also be provided in, e.g., the shunt regions SH provided between the memory blocks MB.

[Description of Structure]

Figure 35:
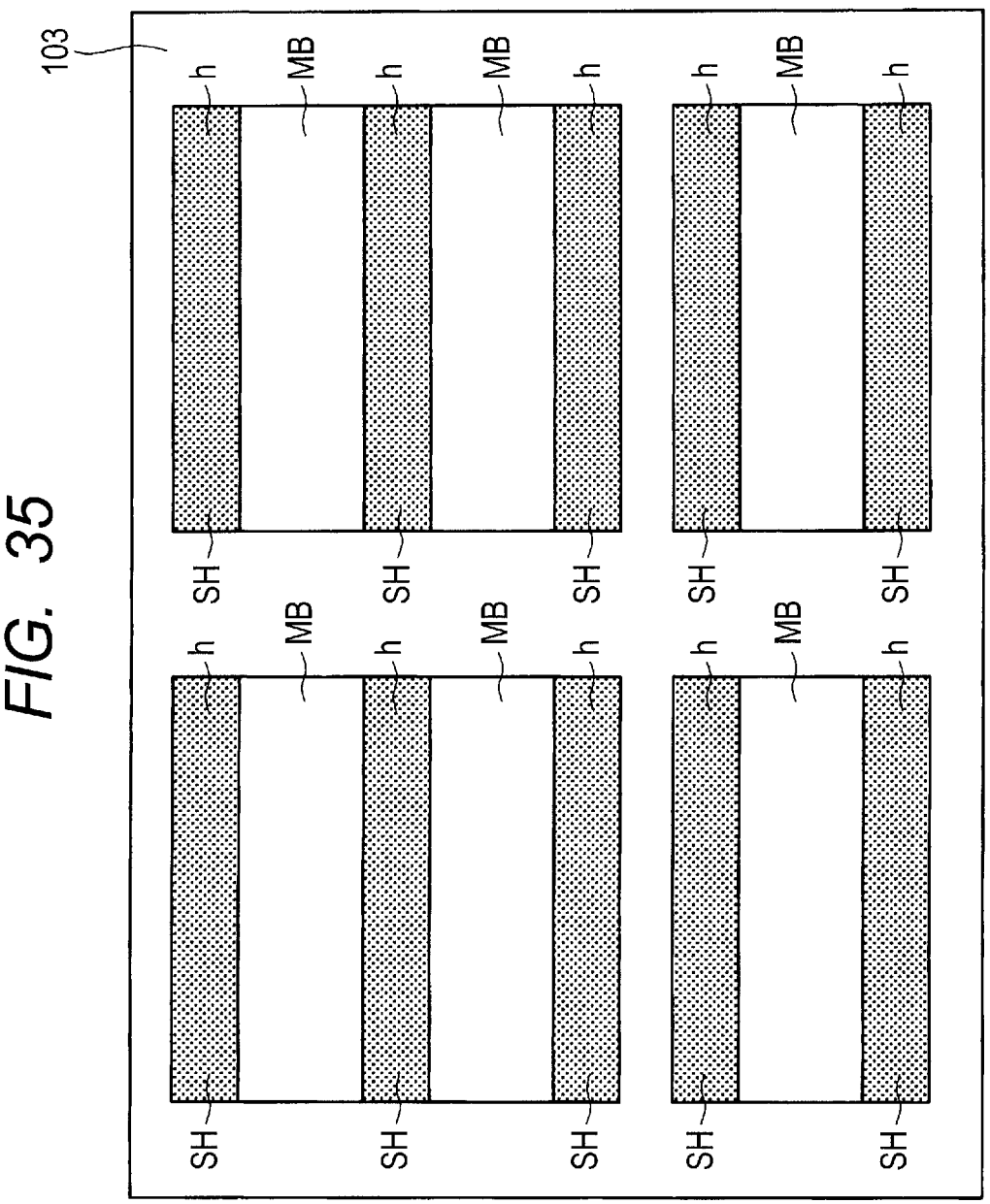
FIG. 35 is a block diagram showing an example of a configuration of a memory module portion in a semiconductor device in Embodiment 3.
Figure 36:
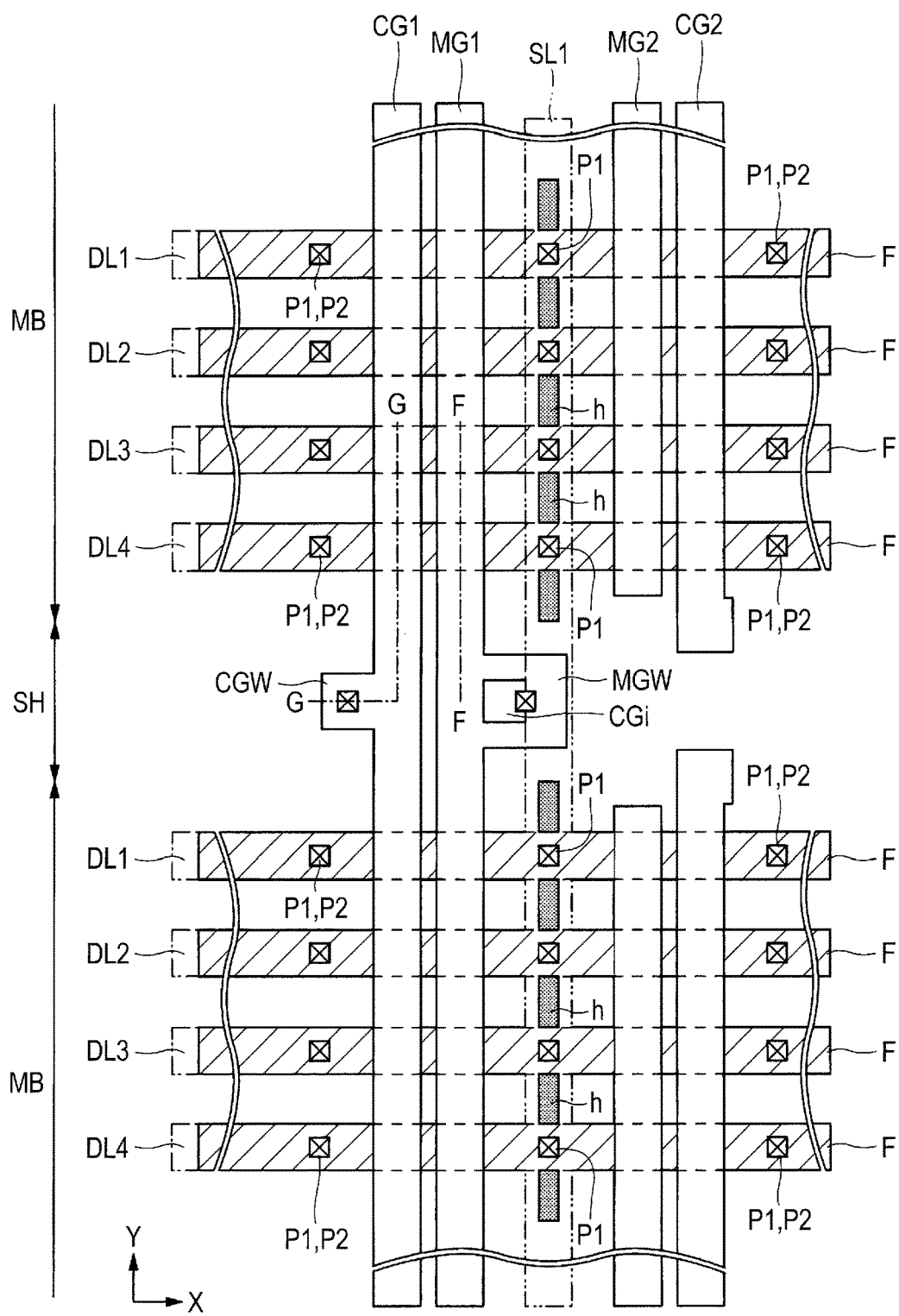
FIG. 36 is a plan view showing a memory block and a shunt region in the semiconductor device in Embodiment 3.

FIG. 35 is a block diagram showing an example of a configuration of a memory module portion of a semiconductor device in Embodiment 3. FIG. 36 is a plan view showing the memory blocks and the shunt regions in the semiconductor device in Embodiment 3.

As shown in FIG. 35, the semiconductor device in Embodiment 3 has the memory blocks MB and the shunt regions SH. The shunt regions SH are provided around the outer peripheries of the memory blocks MB and between the memory blocks MB.

In each of the memory blocks MB, the memory cells described above are provided in the form of an array. A configuration of the memory cells in the memory block MB is the same as in the case of Embodiment 1 (see FIGS. 1 to 5) so that a description thereof is omitted.

The shunt regions SH correspond to the element isolation region (103), and wires (such as MG, CG, and M1) extending from the memory blocks MB are placed in the shunt regions SH. For example, as shown in FIG. 36, the control gate electrode CG1 extends from one of the memory blocks MB (MB in the lower part of FIG. 36) to another of the memory blocks MB (MB in the upper part of FIG. 36). Likewise, the memory gate electrode MG1 extends. The control gate electrode CG1 has a wider portion CGW in the shunt region SH (element isolation region (103)). The memory gate electrode MG1 has a wider portion MGW in the shunt region SH (element isolation region (103)). At the center portion of the wider portion MGW, an island electrode CGi made of a film in the same layer as that of the control gate electrodes CG is disposed.

Over each of the foregoing wider portions (CGW and MGW), the plug (P1 not shown) is disposed. The control gate electrode CG1 and a wire (such as M1 or M2) are coupled to each other via the plug (P1). Also, the memory gate electrode MG1 and a wire (such as M1 or M2) are coupled to each other via the plug (P1).

Note that each of the control gate electrode CG2 and the memory gate electrode MG2 has no wider portion in the shunt region SH shown in FIG. 36, but has a wider portion in, e.g., another shunt region (shunt region located in the uppermost or lowermost portion of FIG. 36).

By providing the protruding portions (non-lowered portions) h in the shunt regions SH described above, i.e., by providing the shunt regions SH described above as the non-lowered portions (protruding portions h), it is possible to improve a margin during photolithography (exposure). It is also possible to improve the accuracy of photolithography.

Figure 37:
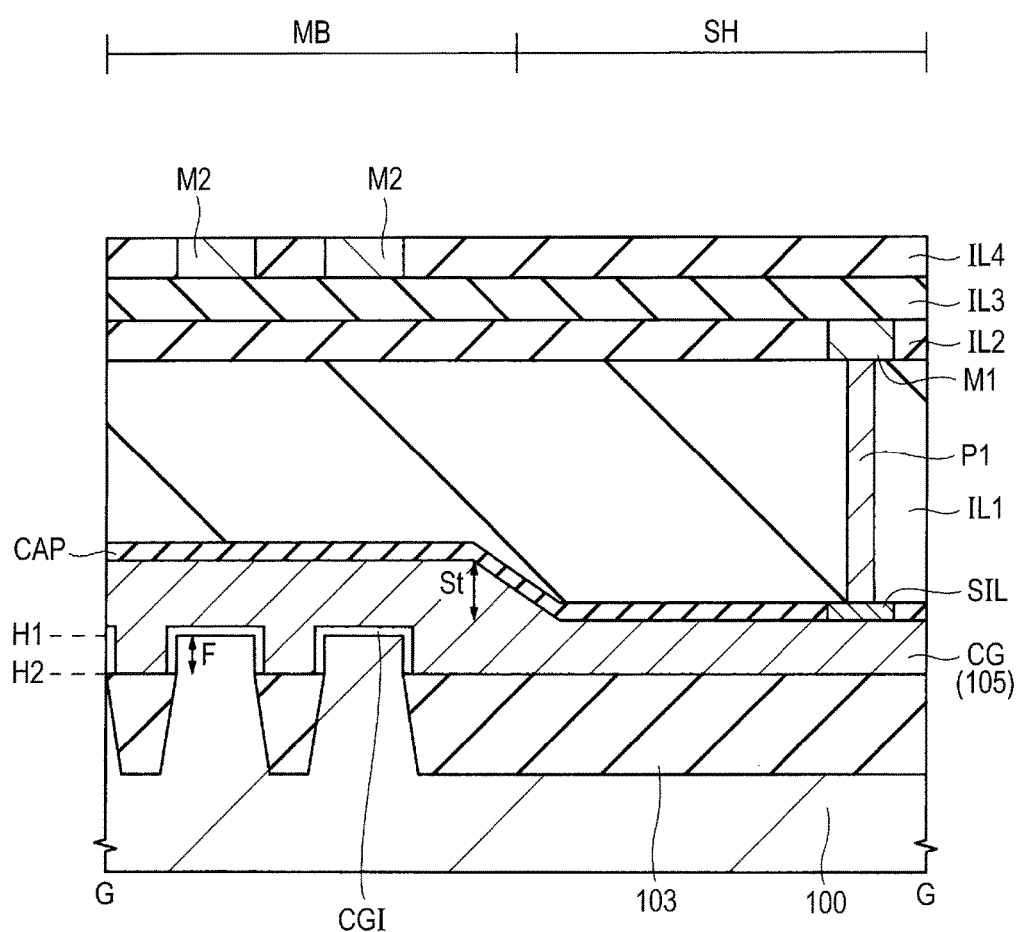
FIG. 37 is a cross-sectional view showing a configuration of a semiconductor device in a comparative example of Embodiment 3.
Figure 38:
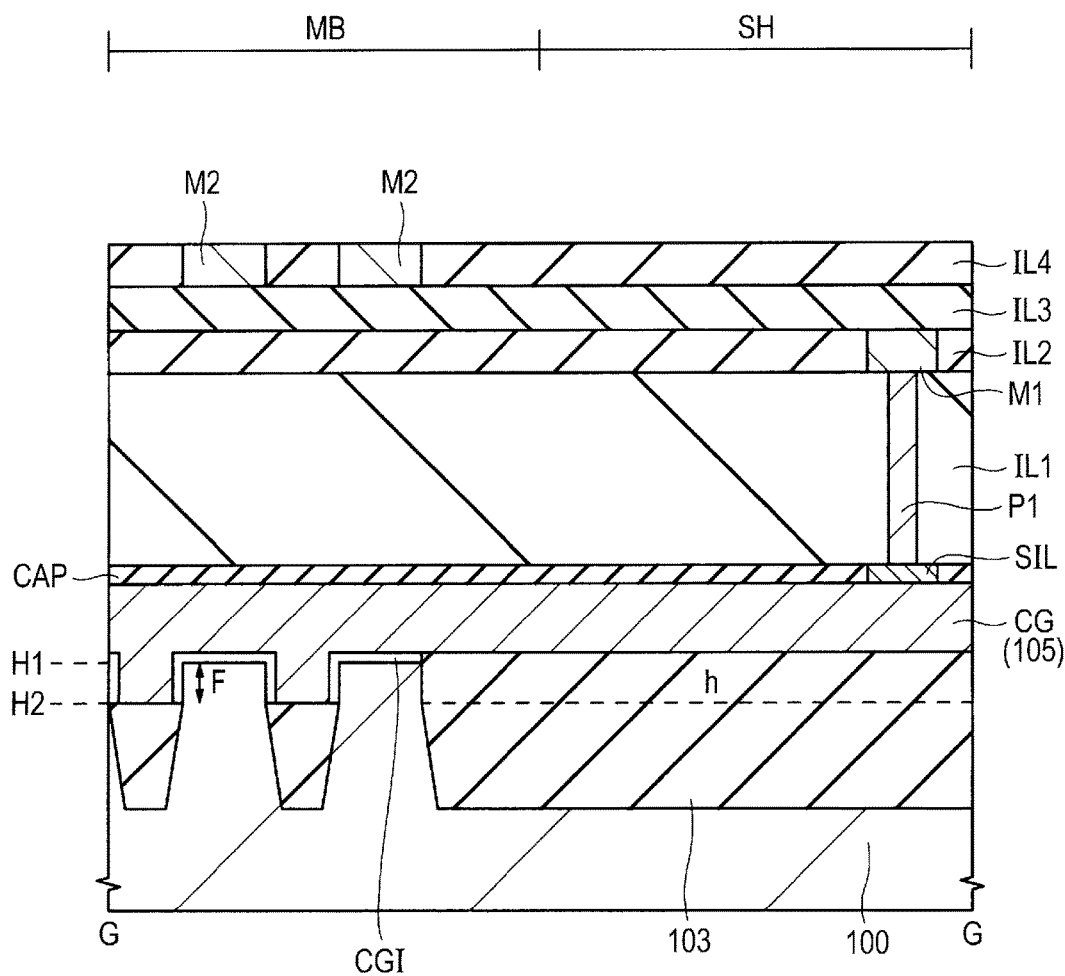
FIG. 38 is a cross-sectional view showing a configuration of the semiconductor device in Embodiment 3.
Figure 39:
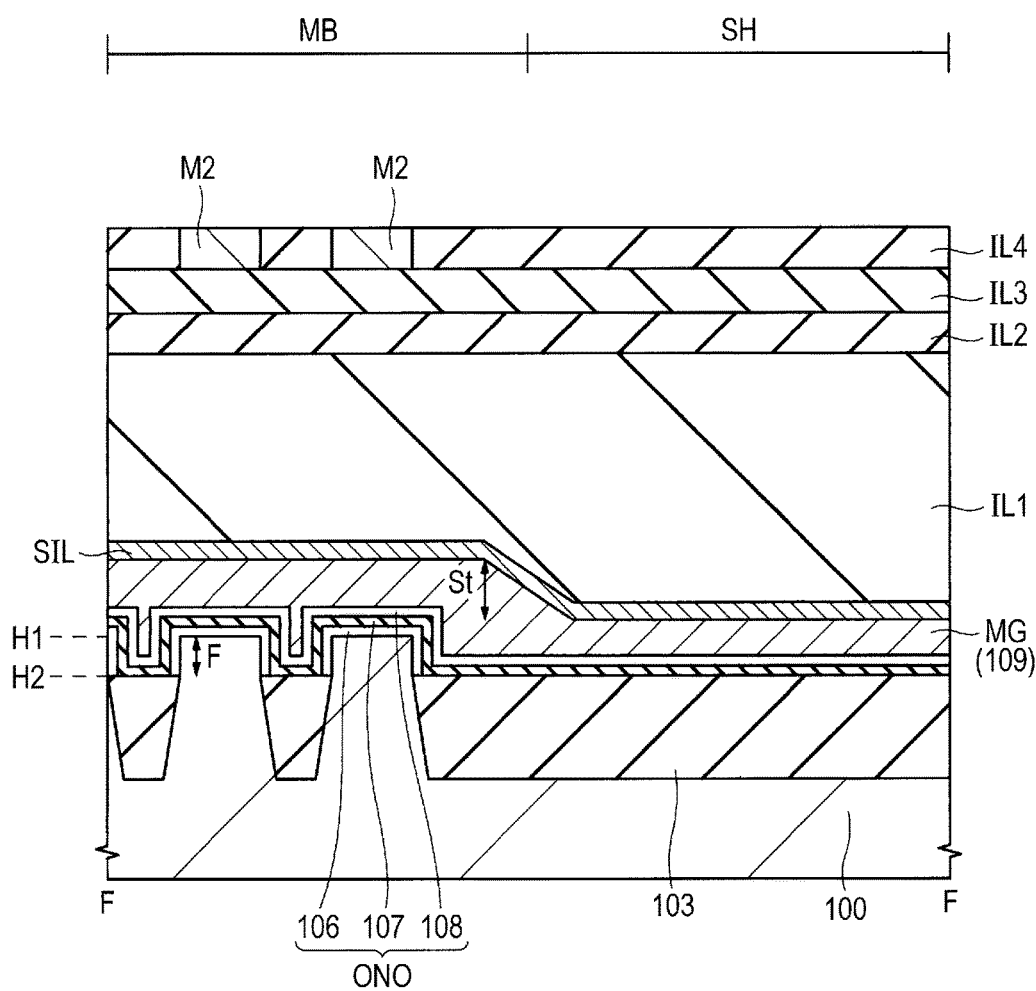
FIG. 39 is a cross-sectional view showing the configuration of the semiconductor device in the comparative example of Embodiment 3.
Figure 40:
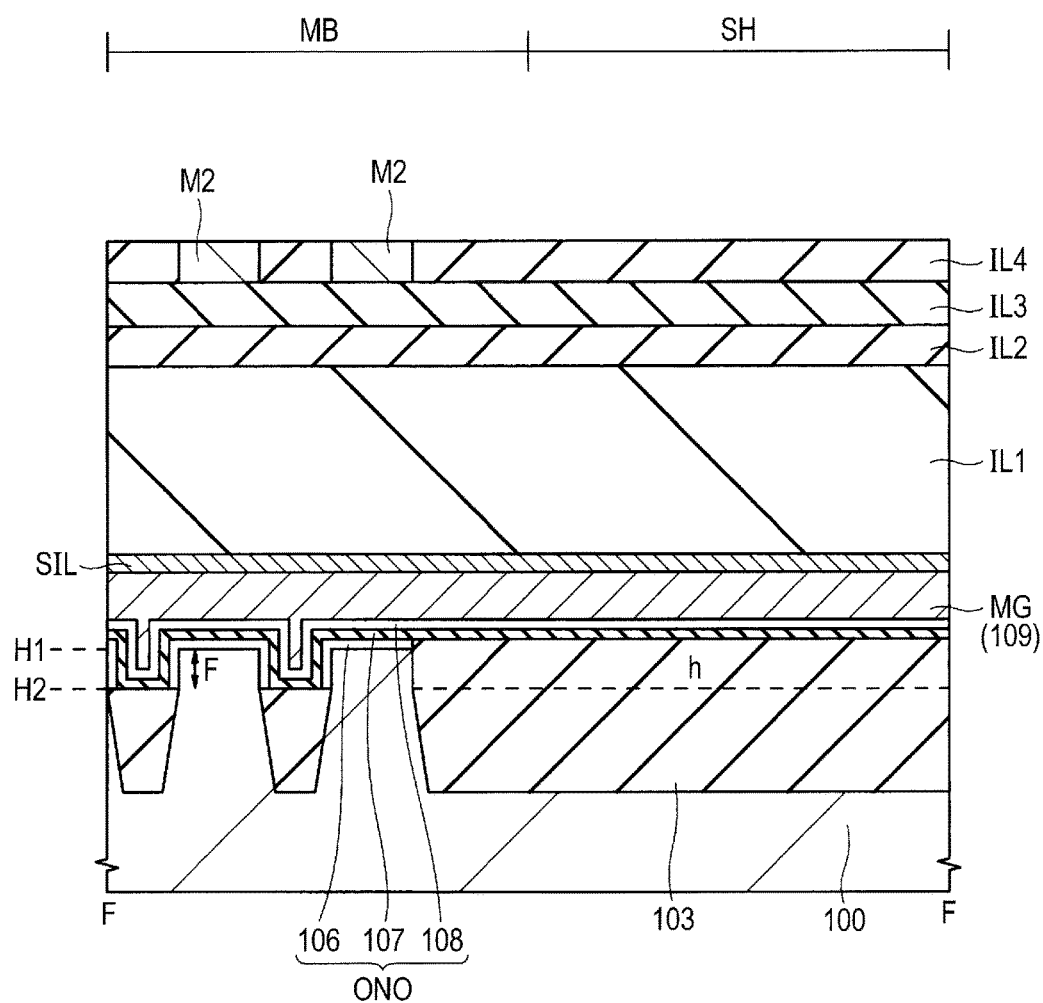
FIG. 40 is a cross-sectional view showing the configuration of the semiconductor device in Embodiment 3.

FIGS. 37 and 39 are cross-sectional views each showing a configuration of a semiconductor device in a comparative example of Embodiment 3. FIGS. 38 and 40 are cross-sectional views each showing the configuration of the semiconductor device in Embodiment 3. Note that these cross-sectional views correspond to, e.g., the portion along the line F-F or the portion along the line G-G in FIG. 36.

For example, as shown in FIG. 37, when each of the shunt regions SH described above is provided not as the non-lowered portion (protruding portion h), but as the "lowered portion", a level difference St is produced in the top surface of the control gate electrode CG between the memory block MB and the shunt region SH. This is because, while the element isolation region 103 and the fin F repetitively alternate at an extremely fine pitch in the memory block M, the fin F is not formed in the shunt region SH and consequently the element isolation region 103 in the shunt region SH is lowered in level. The presence of the level difference St degrades the margin during photolithography.

That is, in the one-shot exposure (transfer) of the pattern (control gate electrode CG), when there is the level difference (height difference) St in the region (between the memory block MB and the shunt region SH) to which the pattern is to be transferred, it is difficult to set the height (position) where focal adjustment is performed. Consequently, a focus is missed in either of the regions and the intended pattern may not be able to be transferred (through exposure).

By contrast, in Embodiment 3, as shown in FIG. 38, the shunt region SH is provided as the non-lowered portion (protruding portion h) to reduce the level difference St in the top surface of the control gate electrode CG. As a result, the pattern (control gate electrode CG) can accurately be transferred (through exposure).

Note that, when the shunt region SH described above is provided not as the non-lowered portion (protruding portion h), but as the "lowered portion" over the memory gate electrode MG also, as shown in FIG. 39, the level difference St is produced in the top surface of the memory gate electrode MG between the memory block MB and the shunt region SH. By contrast, in Embodiment 3, the shunt region SH is provided as the non-lowered portion (protruding portion h), as shown in FIG. 40, to allow a reduction in the level difference St in the top surface of the memory gate electrode MG.

As also described above, over the wider portions (CGW and MGW) of the control gate electrode CG and the memory gate electrode MG, the plugs (P1 not shown) are disposed. In such a case where contact holes in which the plugs (P1 not shown) are to be embedded are formed also, the margin during photolithography deteriorates. That is, when there is the level difference St in the top surface of the control gate electrode CG or the memory gate electrode MG (FIG. 37 or 39), the film thickness of the interlayer insulating film IL1 increases to increase the depths of the contact holes and degrade the margin during photolithography. By contrast, in Embodiment 3, as shown in FIGS. 38 and 40, the shunt region SH is provided as the non-lowered portion (protruding portion h). This can reduce the level difference St in the top surface of the control gate electrode CG or the memory gate electrode MG and allow the pattern to be accurately transferred (through exposure). By thus attempting to planarize the top surface of the control gate electrode CG or the memory gate electrode MG, it is possible to accurately form the patterns (of the plugs P1, the wires M1, the plugs P2, the wires M2, or the like) in the layers located above these electrodes.

<About Height of Element Isolation Region>

For example, in the semiconductor device in Embodiment 3, in plan view, the protruding portions (non-lowered portions) h of the element isolation regions (103) are dotted portions in FIG. 35 and also the dotted portions and the portions corresponding to the shunt regions SH in FIG. 36.

On the other hand, the "lowered portions" of the element isolation regions (103) are the portions of the generally rectangular linear regions between the fins F (hatched portions) which are other than the dotted portions in FIG. 36.

In Embodiment 3 also, in the same manner as in Embodiment 1, the following description applies to the height of each of the protruding portions (non-lowered portions) h in the memory block MB. The height of each of the protruding portions (non-lowered portions) h in the memory block MB is about the same as the height (H1) of the top surface (upper surface or top) of each of the fins F. It can be said that the height (H1) of the top surface (upper surface or top) of each of the fins F is the height of the top surface of the fin under the control gate electrode CG. The height (H2) of the "lowered portion" is lower than the height (H1) of the top surface (upper surface or top) of each of the fins F.

The height (H1) of the top surface (upper surface or top) of each of the foregoing fins F need not necessarily be about the same as the height of each of the protruding portions (non-lowered portions) h. The protruding portion (non-lowered portion) h may also be lower in level than the top surface (upper surface or top) of the fin F.

Note that, as described above, in the memory block MB, the difference (first height difference) between the height (H1) of the top surface (upper surface or top) of each of the foregoing fins F and the height of each of the protruding portions (non-lowered portions) h may also be, e.g., not less than 10 nm as a result of a film reduction in the protruding portion (non-lowered portion) h or the like.

The difference (second height difference) between the height (H1) of the top surface (upper surface or top) of each of the foregoing fins F and the height (H2) of the "lowered portion" is, e.g., about 50 nm. Preferably, the second height difference is not less than 50 nm.

The foregoing second height difference is larger than the foregoing first height difference.

To prevent a short circuit due to a residue resulting from gate processing, the height of the protruding portion (non-lowered portion) h is preferably 10 nm or more larger than the height of the "lowered portion".

It may also be possible to combine the height of each of the protruding portions (non-lowered portions) h of the memory block MB and the height of the protruding portion (non-lowered portion) h of the shunt region SH.

[Description of Manufacturing Method]

Figure 41:
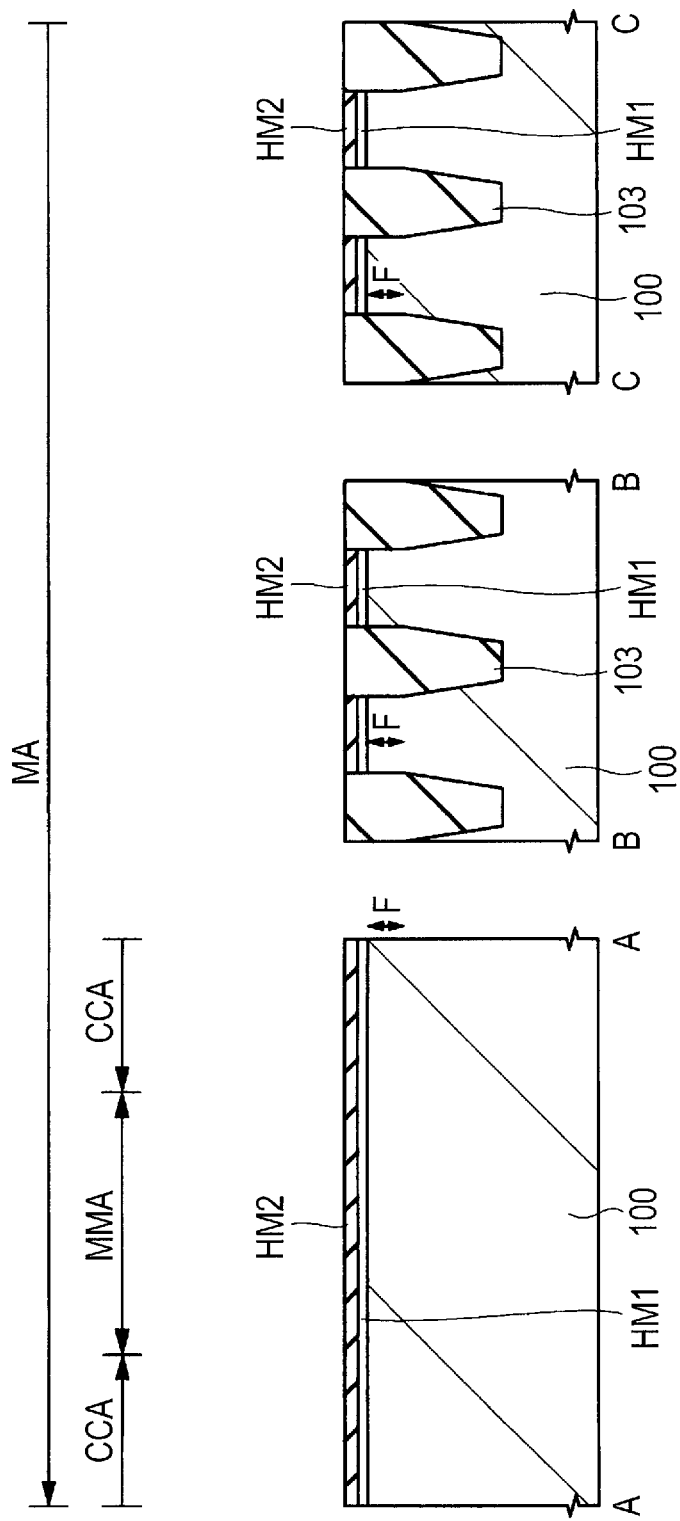
FIG. 41 is a cross-sectional view showing the manufacturing process of the semiconductor device in Embodiment 3.
Figure 42:
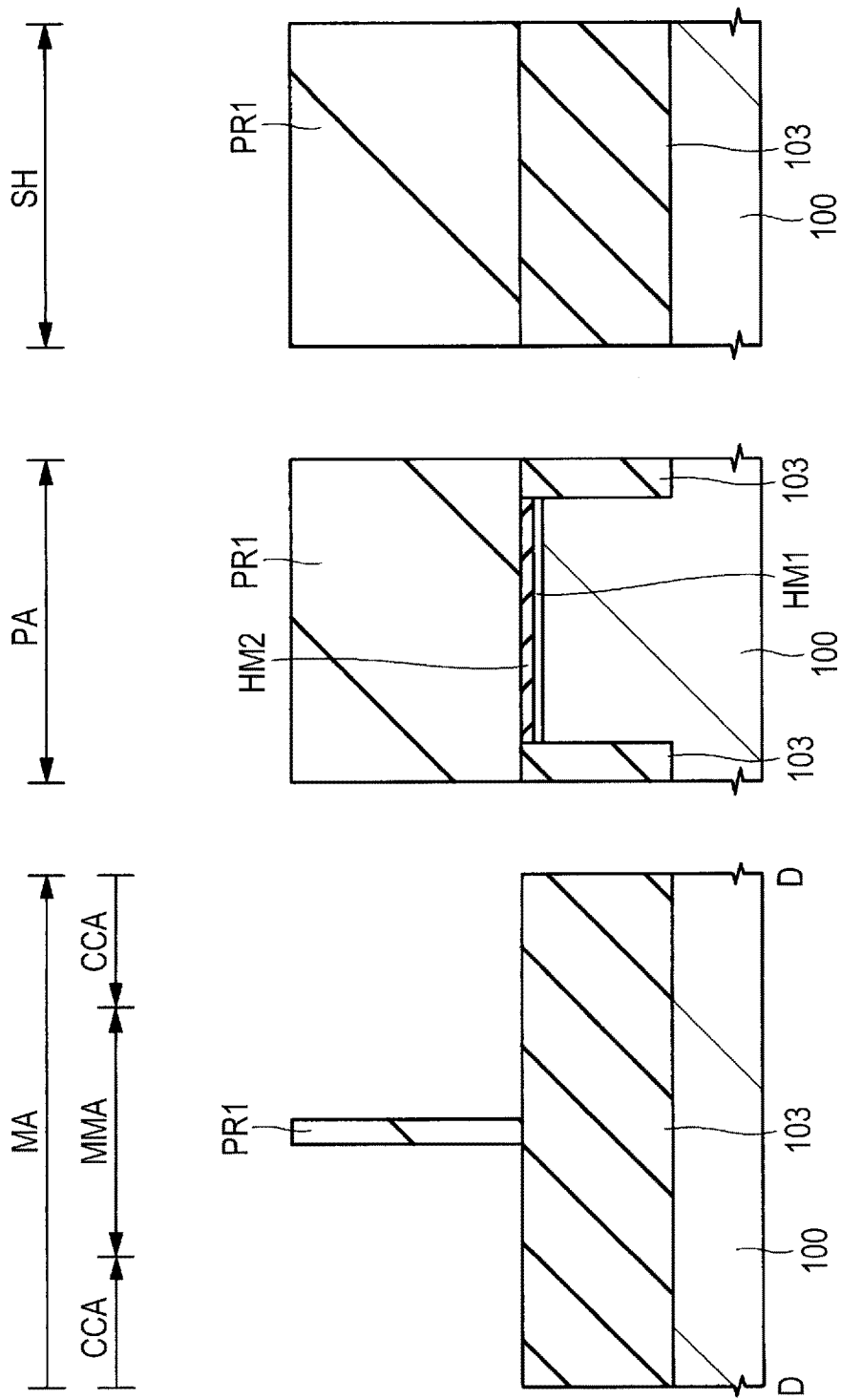
FIG. 42 is a cross-sectional view showing the manufacturing process of the semiconductor device in Embodiment 3.

The semiconductor device in Embodiment 3 can be formed by the same process steps as those for the semiconductor device in Embodiment 1. In the step of lowering the top surface of the element isolation region 103 in the memory block MB (memory cell region MA) described with reference to FIGS. 11 to 15 in Embodiment 1, the photoresist PR1 is provided at positions to be located later between the adjacent memory gate electrodes MG, while being formed also in the shunt region HS (FIGS. 41 and 42). By this step, in the shunt region SH, the protruding portion (non-lowered portion) h is formed. Subsequently, the individual components can be formed, e.g., in the same manner as in the case of Embodiment 1. FIGS. 41 to 51 are cross-sectional views showing the manufacturing process of the semiconductor device in Embodiment 3. Note that the portions corresponding to those in Embodiment 1 are designated by the same reference numerals and a description of the same process steps as those in Embodiment 1 is omitted. In FIGS. 41 to 51, a cross section of the E-E portion corresponding to that in Embodiment 1 is omitted, while a cross section of the shunt region SH is added thereto.

Figure 43:
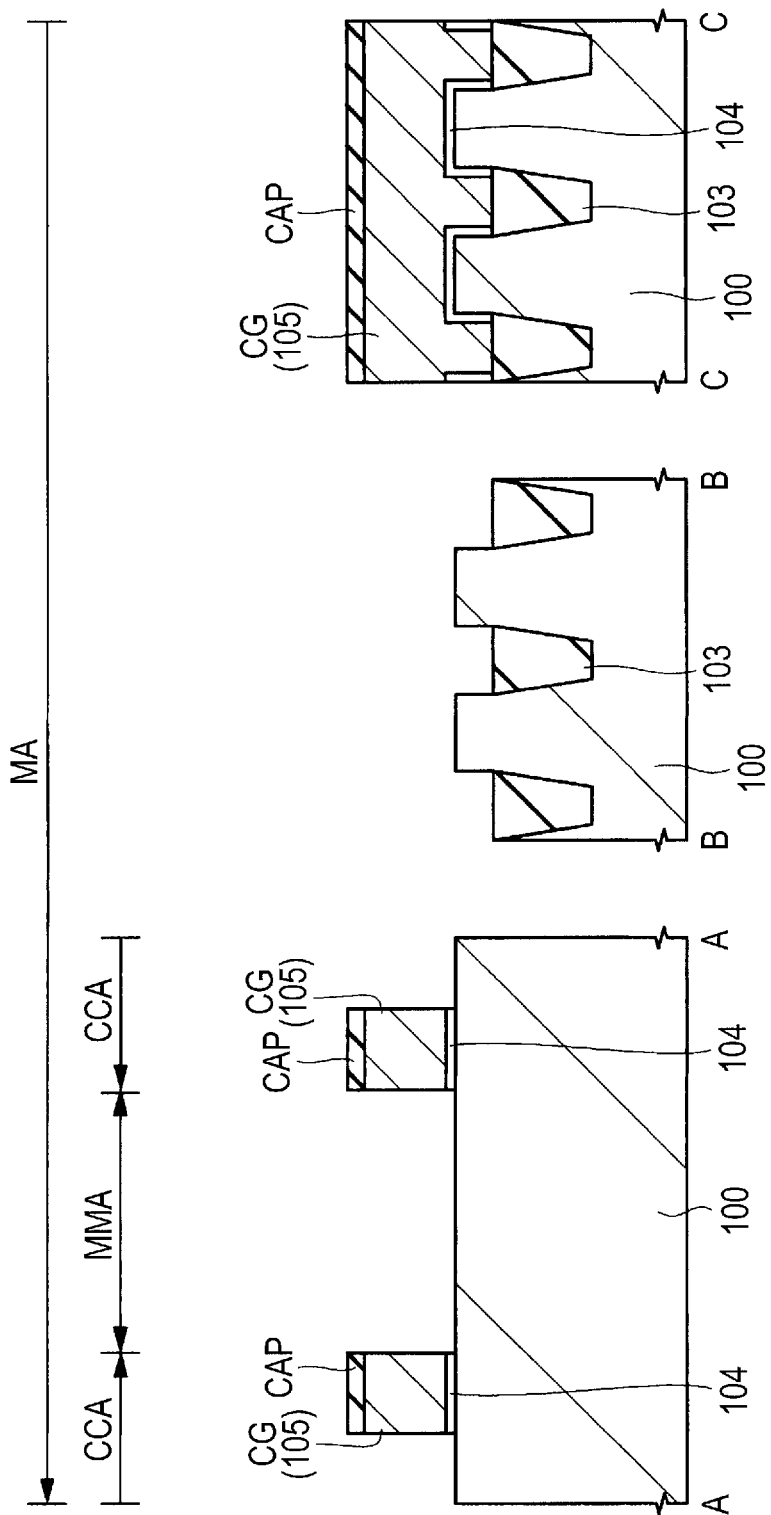
FIG. 43 is a cross-sectional view showing the manufacturing process of the semiconductor device in Embodiment 3.
Figure 44:
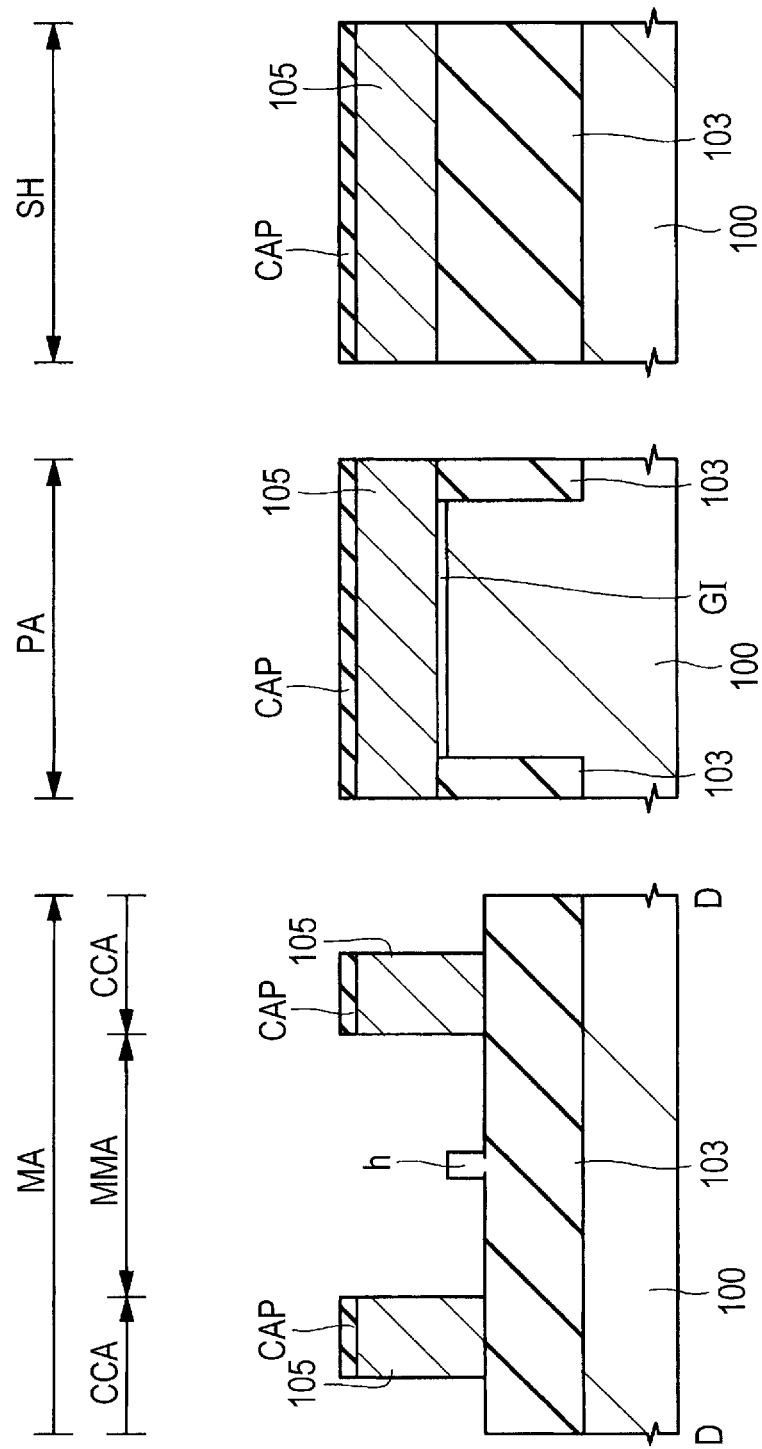
FIG. 44 is a cross-sectional view showing the manufacturing process of the semiconductor device in Embodiment 3.

Next, a multi-layer film including the insulating film 104 and the polysilicon film 105 is deposited and patterned to form the control gate electrodes CG (FIGS. 43 and 44). At this time, the patterning is performed such that the control gate electrode CG extends also in the shunt region SH and has the wider portion CGW (FIG. 36). In addition, in the vicinity of the area of the shunt region SH where the memory gate electrode MG is to be formed, the island electrode CGi is provided (FIG. 36).

Figure 45:
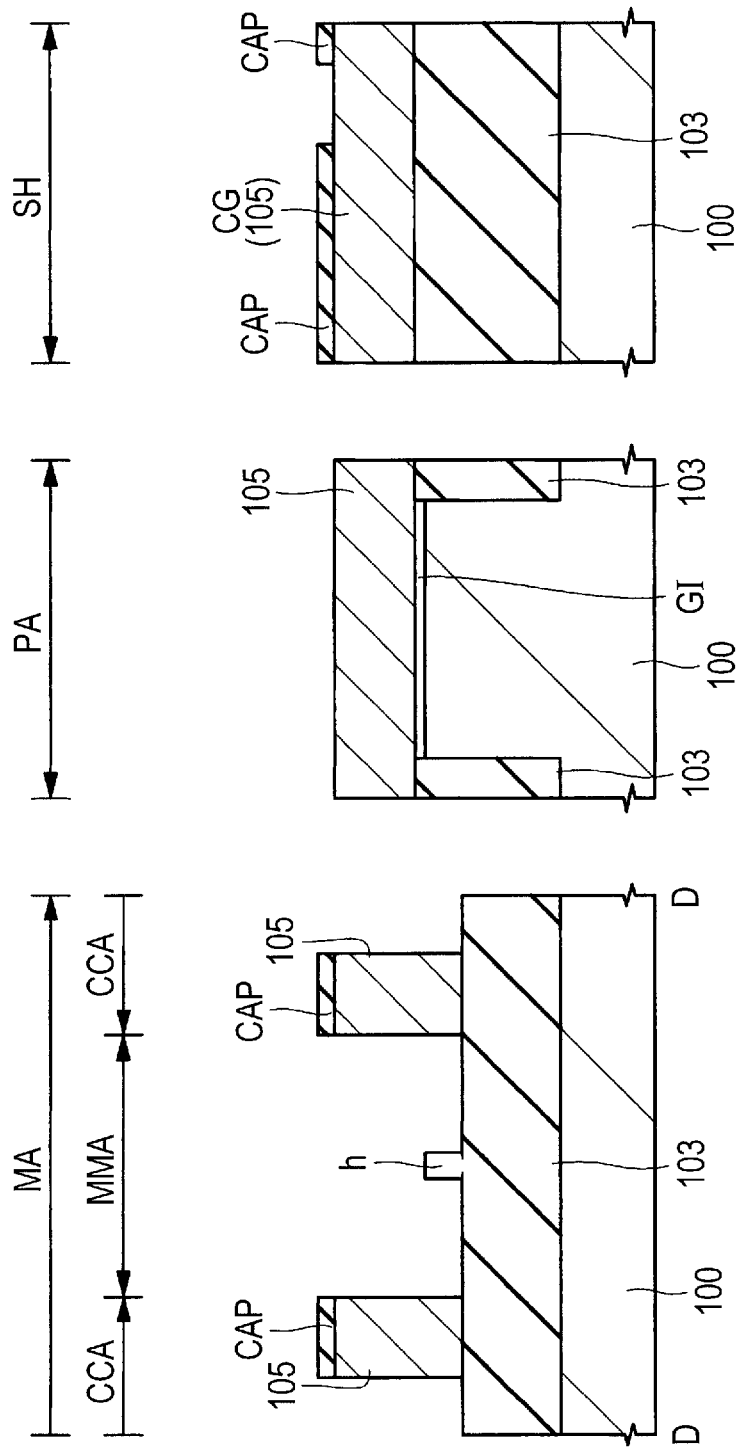
FIG. 45 is a cross-sectional view showing the manufacturing process of the semiconductor device in Embodiment 3.
Figure 46:
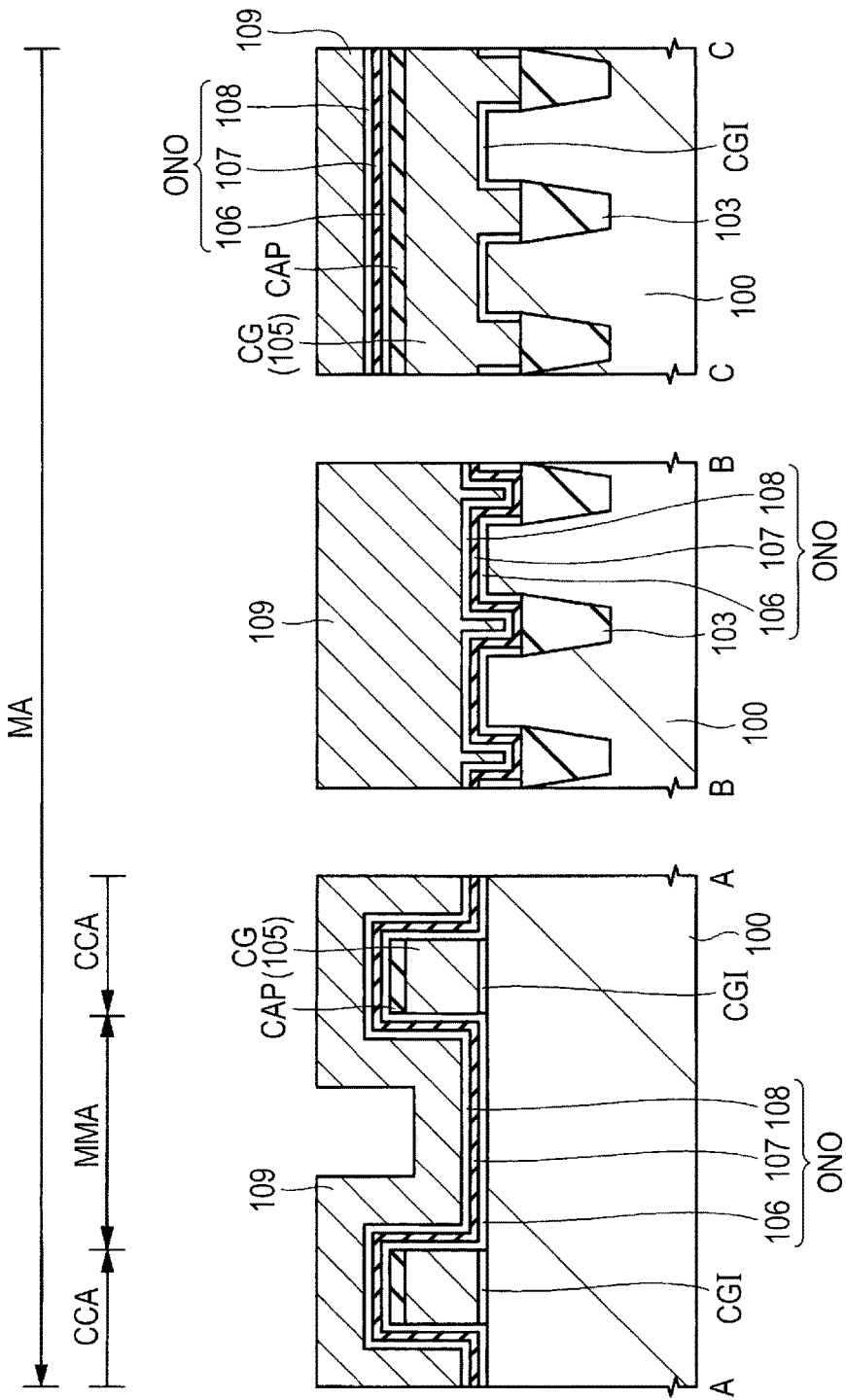
FIG. 46 is a cross-sectional view showing the manufacturing process of the semiconductor device in Embodiment 3.
Figure 47:
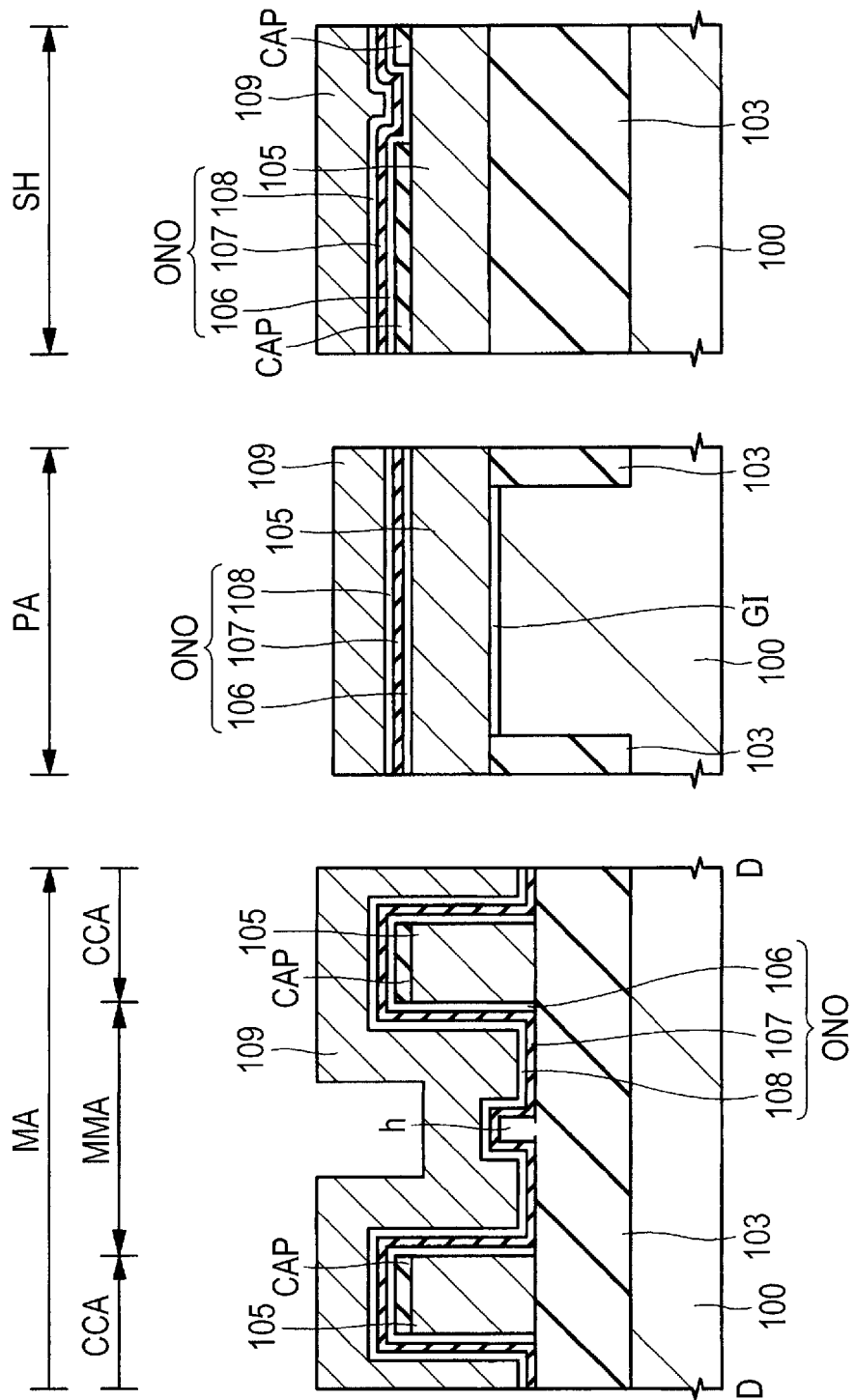
FIG. 47 is a cross-sectional view showing the manufacturing process of the semiconductor device in Embodiment 3.

Next, as shown in FIG. 45, using a photolithographic technique and a dry etching technique, the cap insulating film CAP over the polysilicon film 105 in the peripheral circuit region PA is removed, while the cap insulating film CPA over the control gate electrode CG extending in the shunt region SH is removed. In each of the areas from which the cap insulating film CAP has been removed, the metal silicide film SIL described later is formed. Also, in the area of the shunt region SH from which the cap insulating film CAP has been removed, the plug P1 is disposed via the foregoing metal silicide film SIL. That is, the area of the shunt region SH from which the cap insulating film CAP has been removed serves as each of the region where the metal silicide film SIL is to be formed and the region where the plug P1 (contact hole C1) is to be formed.

Figure 48:
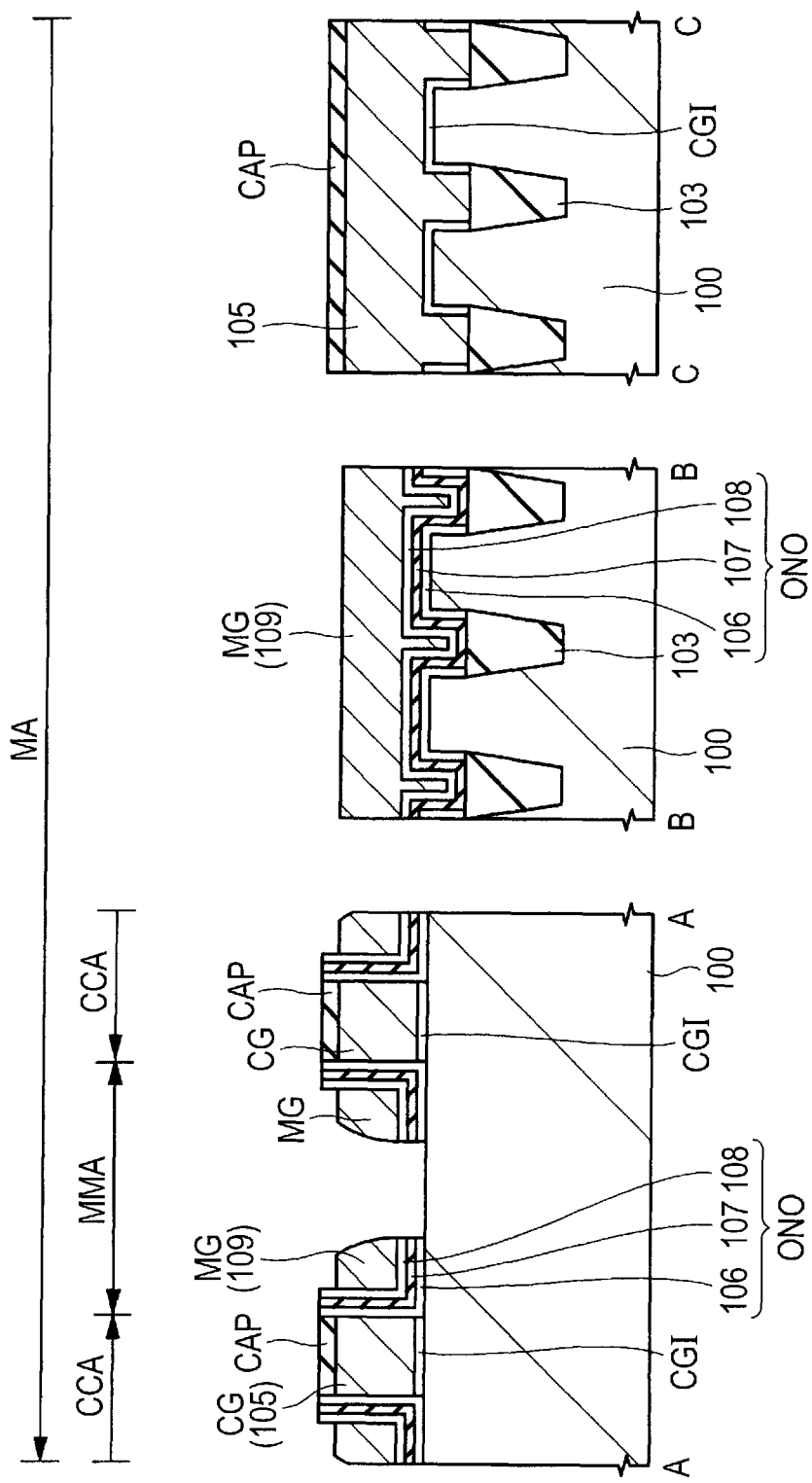
FIG. 48 is a cross-sectional view showing the manufacturing process of the semiconductor device in Embodiment 3.
Figure 49:
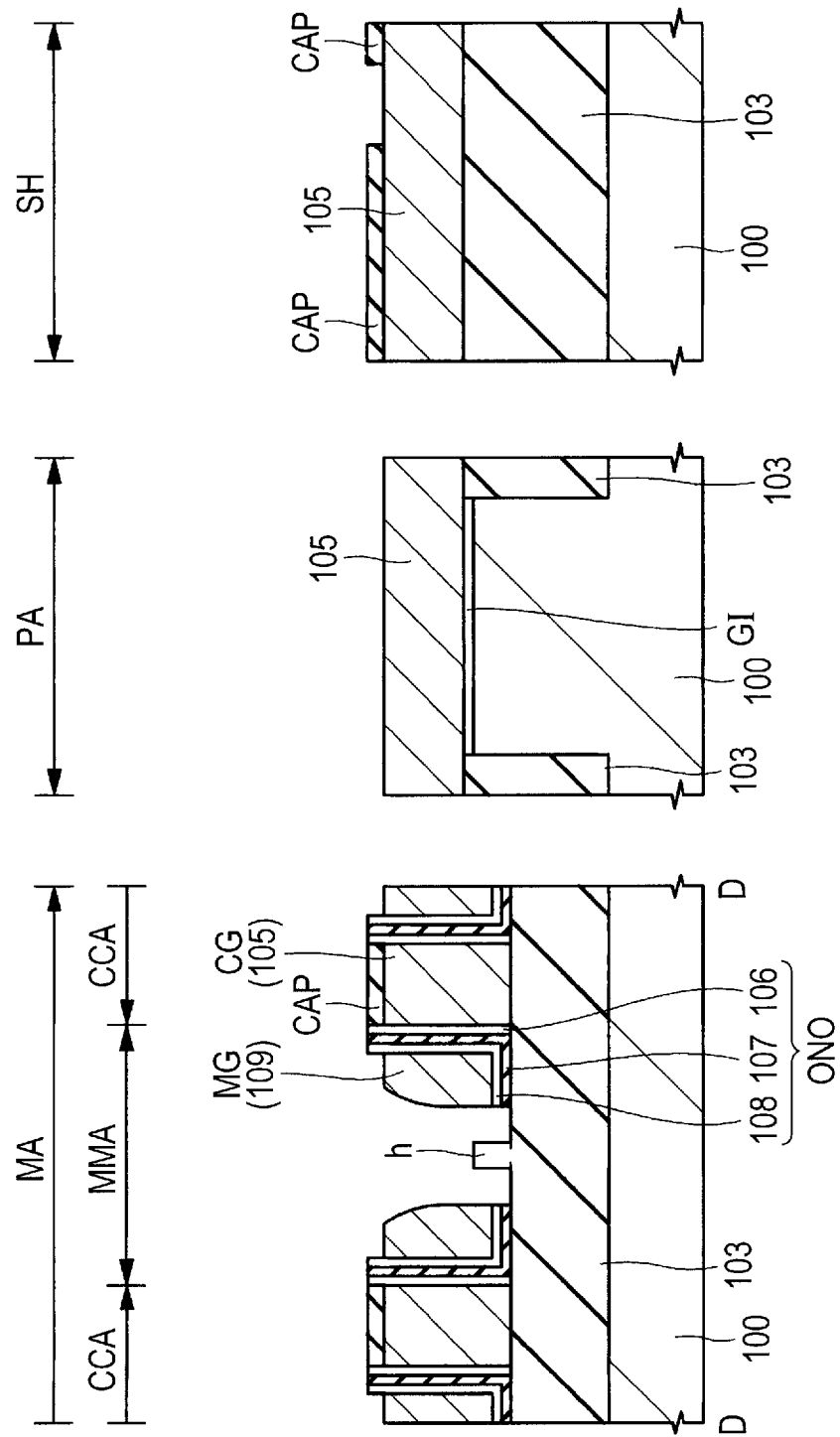
FIG. 49 is a cross-sectional view showing the manufacturing process of the semiconductor device in Embodiment 3.

Next, the polysilicon film 105 is etched back to form the sidewall-shaped memory gate electrodes MG over the sidewall portions of the control gate electrodes CG (FIGS. 48 and 49). At this time, over the side-wall portion of the control gate electrode CG in the shunt region SH also, the sidewall-shaped memory gate electrode MG extends. At this time, the memory gate electrode MG is also formed so as to surround the foregoing island electrode CGi, resulting in the wider portion MGW (FIG. 36).

Figure 50:
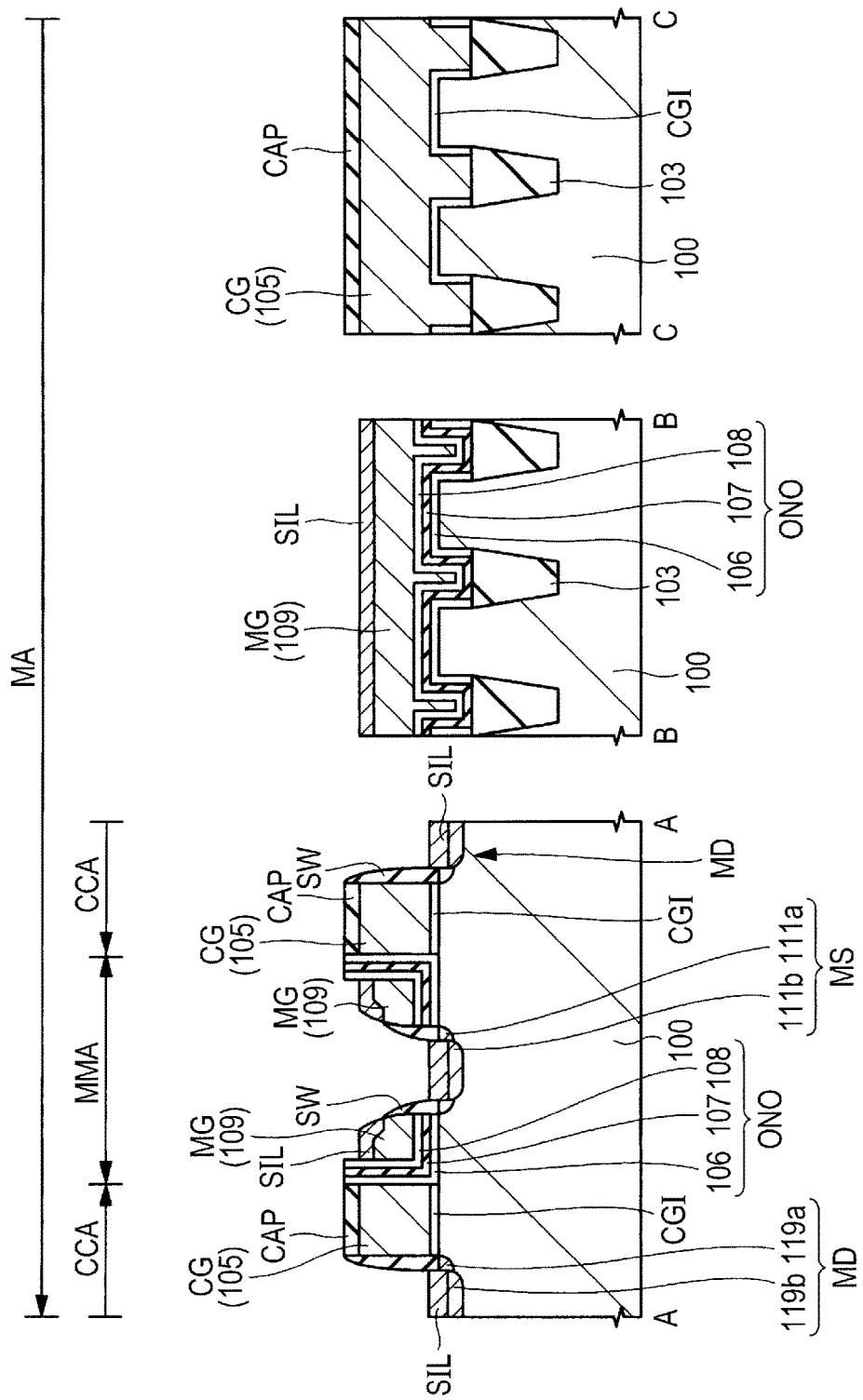
FIG. 50 is a cross-sectional view showing the manufacturing process of the semiconductor device in Embodiment 3.
Figure 51:
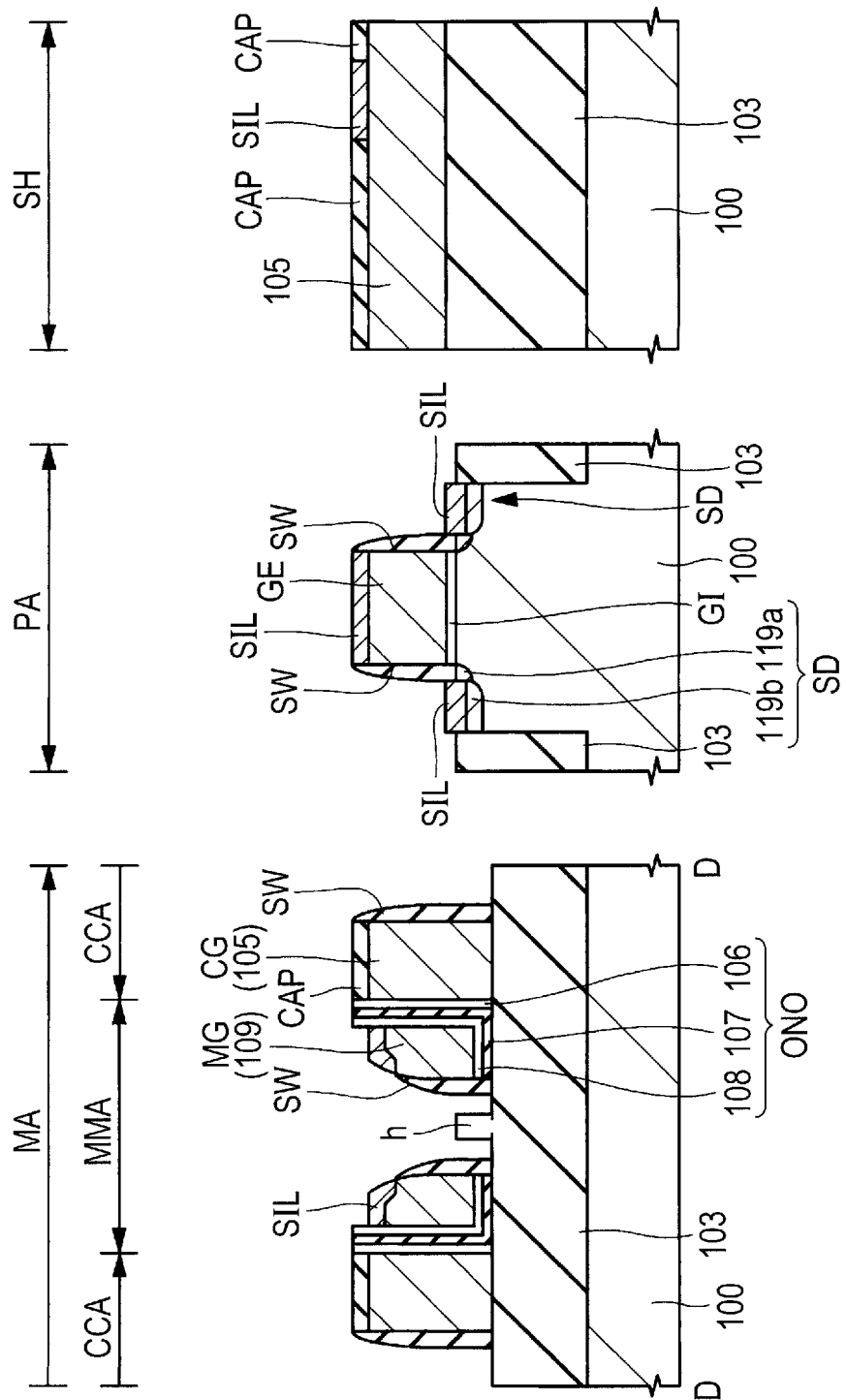
FIG. 51 is a cross-sectional view showing the manufacturing process of the semiconductor device in Embodiment 3.
Figure 52:
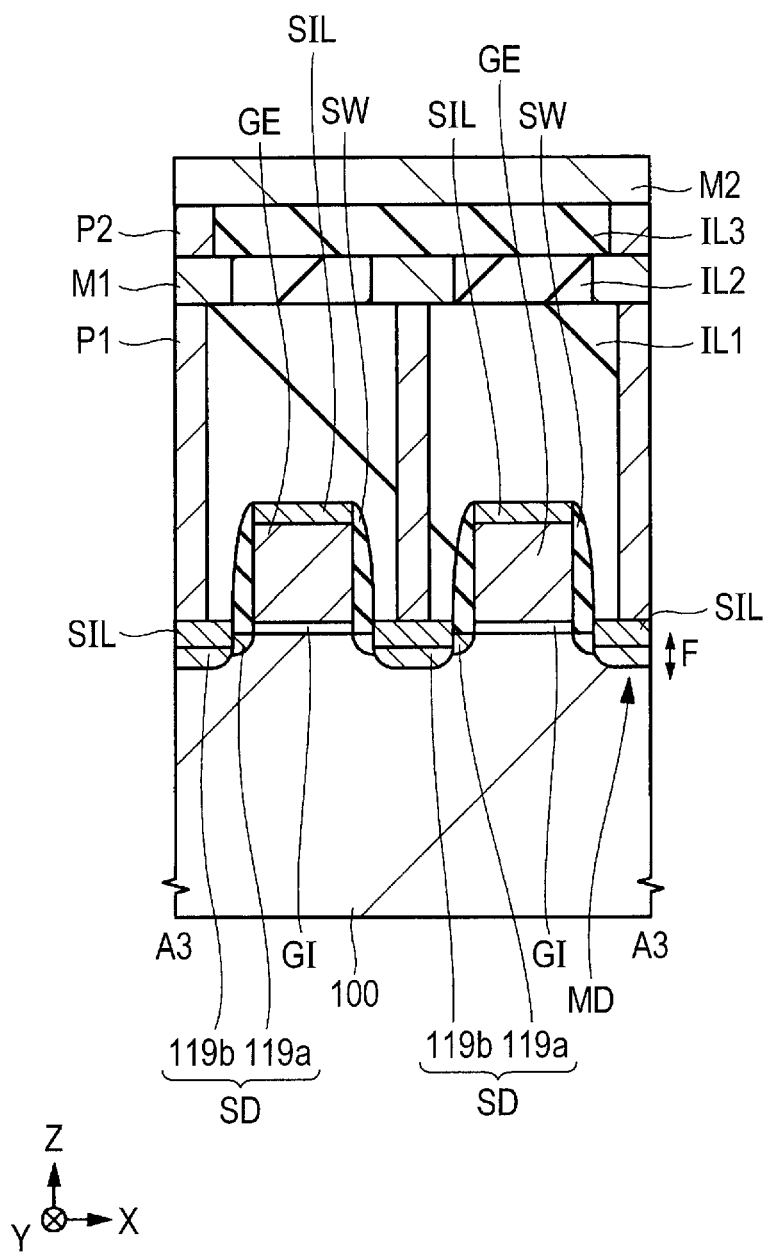
FIG. 52 is a cross-sectional view showing a configuration of a semiconductor device in Embodiment 4.

Next, the source region MS, the drain region MD, and the source/drain regions SD are formed in the same manner as in the case of Embodiment 1. Then, over the memory gate electrodes MG, the source regions MS, the drain regions MD, the source/drain regions SD, and the gate electrode GE in the peripheral circuit region PA, the metal silicide films SIL are formed using a salicide technique in the same manner as in the case of Embodiment 1. At this time, in the area of the shunt region SH from which the cap insulating film CAP over the control gate electrode CG has been removed also, the metal silicide film SIL is formed (FIGS. 50 and 51).

Subsequently, in the same manner as in the case of Embodiment 1, the interlayer insulating film IL1 and the like, the plugs P1 and P2, and the wires M1 and M2 are formed. At this time, over the wider portions (CGW and MGW) of the shunt region SH, the plug P1 and the like can be formed (see FIGS. 38 and 36).

Embodiment 4

In each of the semiconductor devices in Embodiment 1 and 2, the protruding portions (non-lowered portions) h are provided between the adjacent gate electrodes (between the memory gate electrodes MG or between the control gate electrodes CG) of the memory transistors or the control transistors included in the memory cells. However, the protruding portions (non-lowered portions) h may also be provided between the adjacent gate electrodes GE in a semiconductor device having two MISFETs.

The following will describe a structure of a semiconductor device in Embodiment 4 with reference to the drawings.

[Description of Structure]

Figure 53:
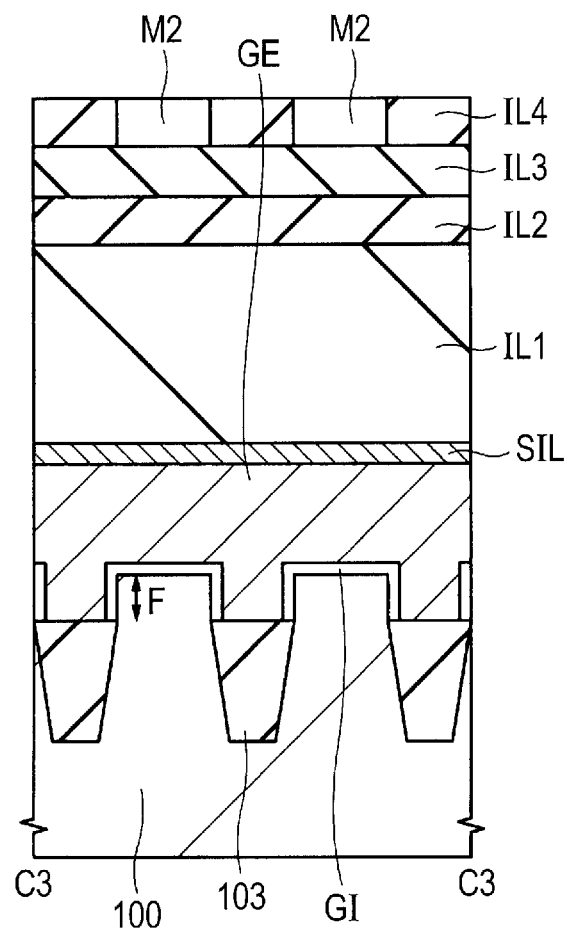
FIG. 53 is a cross-sectional view showing the configuration of the semiconductor device in Embodiment 4.
Figure 54:
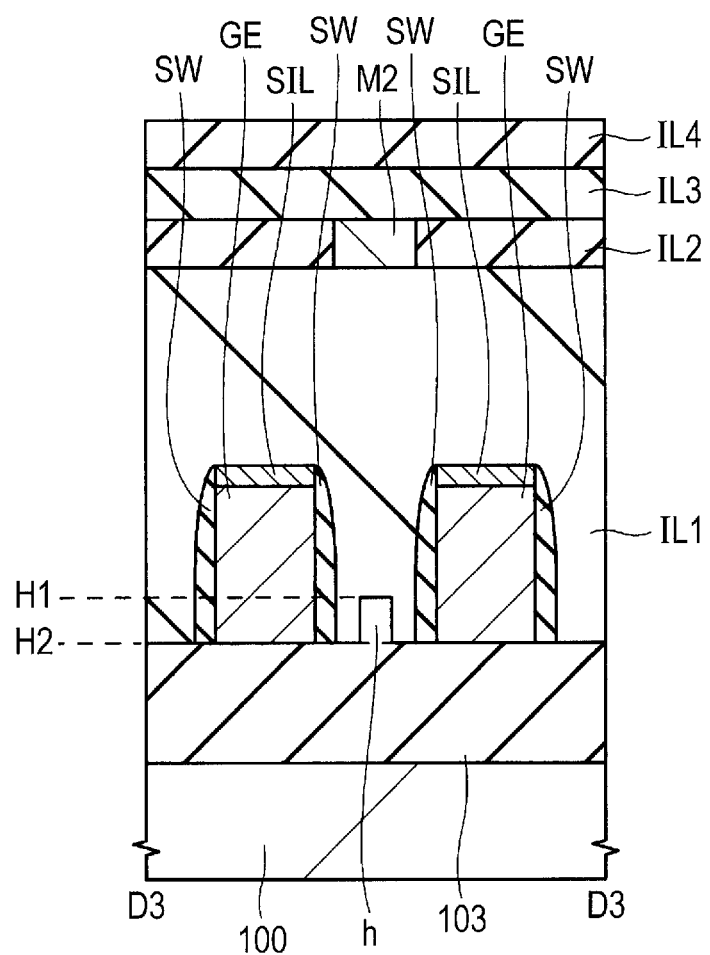
FIG. 54 is a cross-sectional view showing the configuration of the semiconductor device in Embodiment 4.
Figure 55:
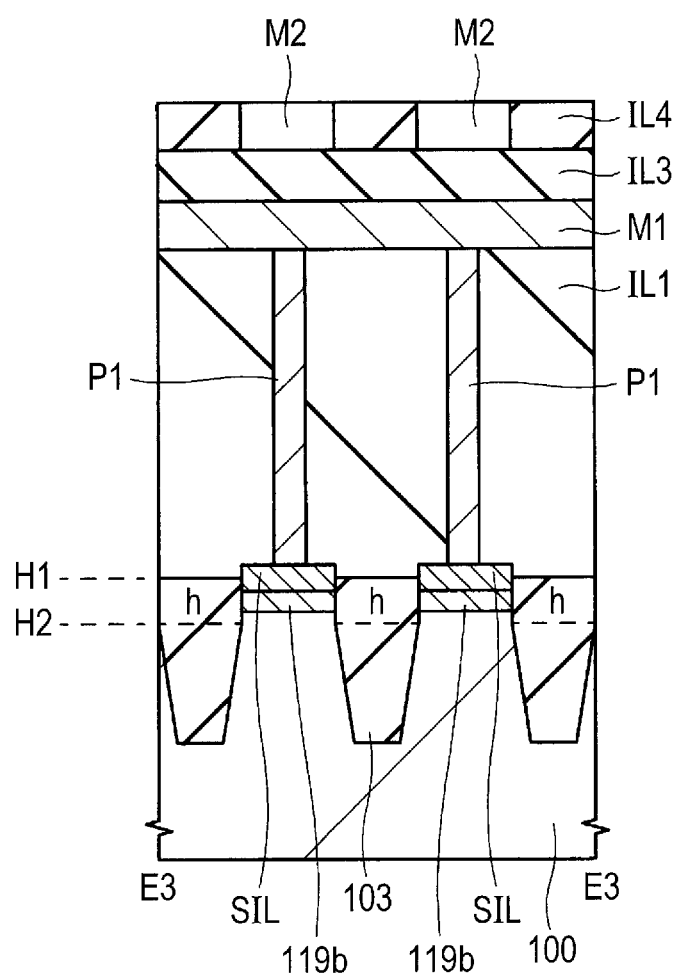
FIG. 55 is a cross-sectional view showing the configuration of the semiconductor device in Embodiment 4.
Figure 56:
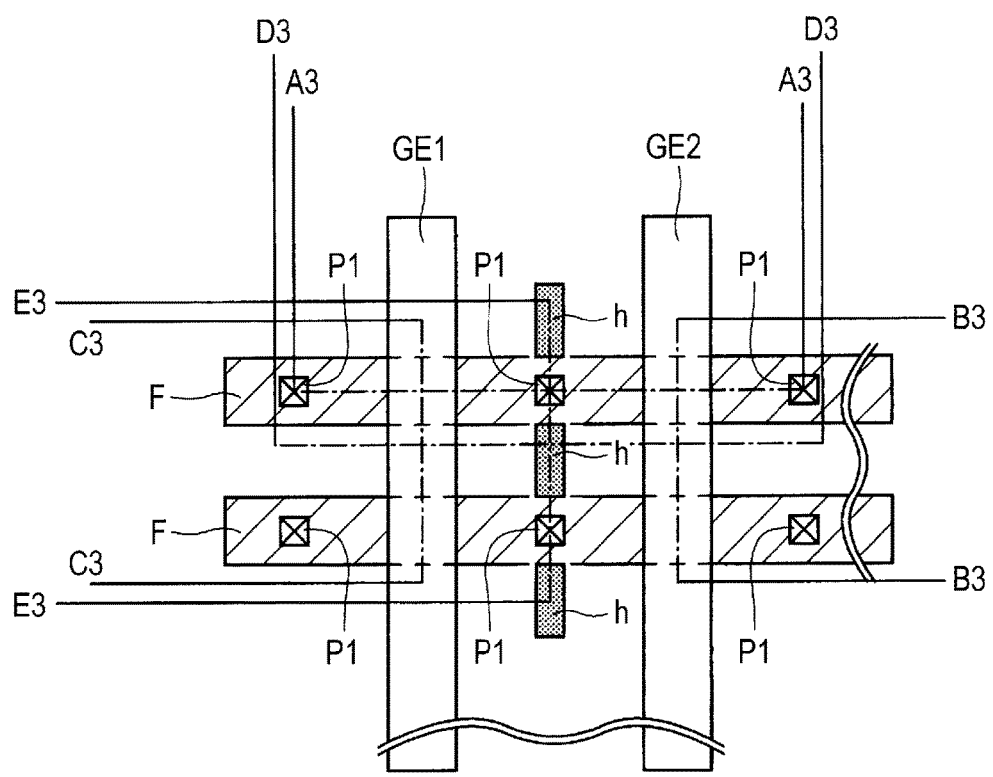
FIG. 56 is a plan view showing the configuration of the semiconductor device in Embodiment 4.

FIGS. 52 to 55 are cross-sectional views each showing a configuration of a semiconductor device in Embodiment 4. FIG. 56 is a plan view showing the configuration of the semiconductor device in Embodiment 4. For example, FIG. 52 corresponds to a cross section along the line A3-A3 in FIG. 56. FIG. 53 corresponds to a cross section along the line C3-C3 in FIG. 56. FIG. 54 corresponds to a cross section along the line D3-D3 in FIG. 56. FIG. 55 corresponds to a cross section along the line E3-E3 in FIG. 56.

As shown in FIGS. 52 to 56, the semiconductor device in Embodiment 4 has two gate electrodes GE1 and GE2 traversing the two fins F. Each of the gate electrodes GE1 and GE2 is made of a silicon film.

In Embodiment 4, the two gate electrodes GE1 and GE2 are disposed over the cuboid-shaped fins F via the gate insulating films GI. Each of the fins F is made of an upper portion of the semiconductor substrate 100. In other words, the semiconductor substrate 100 has depressions/projections, and the fins F correspond to the projecting portions of the semiconductor substrate 100. As will be described later, each of the fins F has a two-dimensional shape in the form of a line (rectangle having long sides in the X-direction) having a given width (length in the Y-direction). In FIG. 56, the two fins F are arranged to be spaced apart at regular intervals (a given pitch) in the Y-direction.

Each of the gate insulating films GI between the gate electrodes GE and the semiconductor substrate 100 (fins F) is made of, e.g., a silicon dioxide film.

The semiconductor device in Embodiment 4 also has the source/drain regions SD formed in the fins F of the semiconductor substrate 100. Over the side-wall portions of the gate electrodes GE, the side-wall insulating films (sidewalls or sidewall spacers) SW each made of an insulating film are formed.

Each of the source/drain regions SD includes the $n^+$-type semiconductor region 119b and the $n^-$-type semiconductor region 119a. The $n^-$-type semiconductor region 119a is formed by self-alignment with the side wall of each of the gate electrodes GE. The $n^+$-type semiconductor region 119b is formed by self-alignment with the side surface of the side-wall insulating film SW closer to each of the gate electrodes GE and has a junction depth deeper than that of the $n^-$-type semiconductor region 119a and an impurity concentration higher than that thereof.

Over the source/drain regions SD ($n^+$-type semiconductor regions 119b) and the gate electrodes GE, the metal silicide films SIL are formed.

Over the MISFETs, the interlayer insulating films IL1, IL2, IL3, and IL4 are formed. Each of these films is made of, e.g., a silicon dioxide film. In the interlayer insulating film IL1, the plugs P1 are formed and, over the plugs P1, the wires M1 are formed. In the interlayer insulating film IL3, the plugs P2 are formed and, over the plugs P2, the wires M2 are formed. Each of the wires M1 and M2 is, e.g., an embedded wire and made of a conductive material such as metal. The wires M1 and M2 are embedded herein in the interlayer insulating films IL2 and IL4.

<About Protruding Portion (Non-Lowered Portion) h>

In Embodiment 4, as shown in FIG. 56, each of the protruding portions (non-lowered portions) h is provided in the element isolation region (103) located between the plurality of fins F provided in the form of the lines extending in the X-direction. As is also obvious from FIG. 54, the protruding portion (non-lowered portion) h is located between the gate electrodes GE.

Normally, the top surface of each of the element isolation regions 103 between the fins F is lowered from the top surface (upper surface or top) of each of the fins F. The side surfaces of the fins F are exposed to a depth corresponding to the level difference between the top surface of the fin F and the element isolation region 103 to allow an improvement in effective channel width (see FIG. 53). For example, the element isolation region 103 is formed by forming an isolation trench in the semiconductor substrate 100 located between the regions where the fins F are formed and embedding an insulating film in the isolation trench. By lowering the top surface of the embedded insulating film, the fins F are allowed to protrude.

In Embodiment 4, in the element isolation region 103 between the fins F, the protruding portions (non-lowered portions) h in which the top surfaces of the embedded insulating films are not lowered are provided between the gate electrodes GE.

By thus providing the protruding portions (non-lowered portions) h, during etching (processing) for the gate electrodes GE, it is possible to prevent a short circuit between the gate electrodes GE due to a residue resulting from gate processing in the same manner as in the case of Embodiment 1.

<About Region where Protruding Portion (Non-Lowered Portion) h is Formed>

For example, it may also be possible to form the protruding portion (non-lowered portion) h in the entire element isolation region 103 between the gate electrodes GE (inter-gate isolation region). In other words, it may also be possible to provide the protruding portion (non-lowered portion) h in the entire inter-gate isolation region. The inter-gate isolation region is a generally rectangular element isolation region (103) surrounded by, e.g., the two fins F2 and the gate electrodes GE1 and GE2 in plan view (see FIG. 56).

However, it is appropriate to provide the protruding portion (non-lowered portion) h only at the middle portion of the inter-gate isolation region in the patterning step for the gate electrodes GE in consideration of the misalignment thereof. More specifically, it is appropriate to provide the protruding portion (non-lowered portion) h at the foregoing middle portion of the inter-gate isolation region such that the protruding portion (non-lowered portion) h extends in the Y-direction. In this case, the portions (isolation portions) on both sides of the protruding portion (non-lowered portion) h serve as the "lowered portions".

The width (length) of the protruding portion (non-lowered portion) h in the X-direction is, e.g., about 40 nm to 50 nm. The width (length) of the protruding portion (non-lowered portion) h in the X-direction can be set to a value close to that obtained by, e.g., adding or subtracting 10 nm to or from the width (length) of the plug P1 in the X-direction. The length of the protruding portion (non-lowered portion) h in the Y-direction is preferably set to a value corresponding to the distance between the fins F. Since a residue resulting from gate processing is left along the side wall of the fin F extending in the X-direction, the protruding portion (non-lowered portion) h is preferably provided in contact relation with the side wall of the fin F.

By thus providing the protruding portion (non-lowered portion) h in at least a part of the inter-gate isolation region, it is possible to prevent a short circuit due to a residue resulting from gate processing. In addition, since the protruding portion (non-lowered portion) h is provided in a part of the inter-gate isolation region and the element isolation region (103) along the gate electrode GE is provided as the "lowered portion", even when the gate electrodes GE are formed in misaligned relation due to the misalignment of a mask or the like, the side surfaces of the fins F are in contact with the gate electrodes GE. This can improve the effective channel widths thereof.

<About Height of Element Isolation Region>

In plan view, the protruding portions (non-lowered portions) h of the element isolation regions (103) correspond to the dotted portions of FIG. 56. On the other hand, the "lowered portions" of the isolation regions (103) correspond to the portions of the generally rectangular linear regions between the fins F (hatched portions) of FIG. 56 which are other than the dotted portions. The "lowered portions" also correspond to the areas of the inter-gate isolation region which are located on both sides of each of the protruding portions (non-lowered portions) h. The "lowered portions" also correspond to the "under-gate isolation regions" where the gate electrodes GE and the element isolation region (103) overlap each other.

The heights of the protruding portion (non-lowered portion) h are higher than the heights of the "lowered portions".

The height of each of the protruding portions (non-lowered portions) h is about the same as the height (H1) of the top surface (upper surface or top) of each of the fins F. It can be said that the height (H1) of the top surface (upper surface or top) of each of the fins F is the height of the top surface of the fin under the gate electrode GE. The height (H2) of each of the "lowered portions" is lower than the height (H1) of the top surface (upper surface or top) of each of the fins F.

The height (H1) of the top surface (upper surface or top) of each of the foregoing fins F need not necessarily be about the same as the height of each of the protruding portions (non-lowered portions) h. The protruding portion (non-lowered portion) h may also be lower in level than the top surface (upper surface or top) of the fin F. The difference (first height difference) between the height (H1) of the top surface (upper surface or top) of the foregoing fin F and the height of the protruding portion (non-lowered portion) h may also be, e.g., not less than 10 nm as a result of a film reduction in the protruding portion (non-lowered portion) h or the like.

The difference (second height difference) between the height (H1) of the top surface (upper surface or top) of the foregoing fin F and the height (H2) of the "lowered portion" is, e.g., about 50 nm. The second height difference is preferably not less than 50 nm.

The foregoing second height difference is larger than the foregoing first height difference.

To prevent a short circuit due to a residue resulting from gate processing, the height of the protruding portion (non-lowered portion) h is preferably 10 nm or more larger than the height of the "lowered portion".

[Description of Manufacturing Method]

The semiconductor device in Embodiment 4 can be formed by, e.g., the process steps similar to those for the semiconductor device in Embodiment 1. For example, after the fins F and the protruding portions (non-linear portions) h are formed, the semiconductor device in Embodiment 4 can be formed by the same process steps as those of forming the MISFETs in the peripheral circuit region PA in Embodiment 1.

Figure 57:
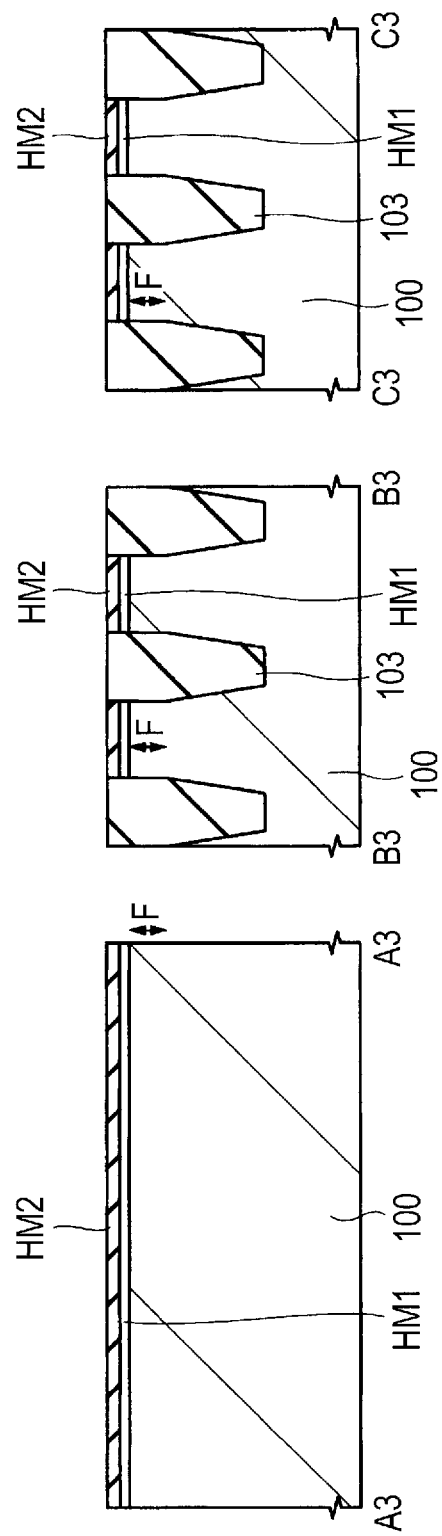
FIG. 57 is a cross-sectional view showing the manufacturing process of the semiconductor device in Embodiment 4.
Figure 58:
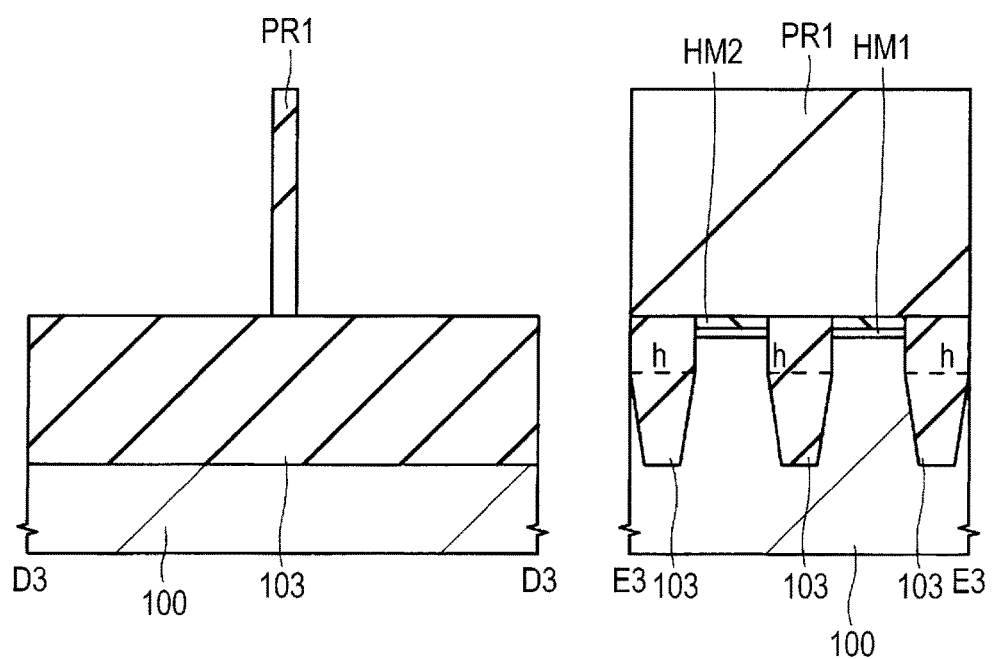
FIG. 58 is a cross-sectional view showing the manufacturing process of the semiconductor device in Embodiment 4.

In the step of lowering the top surface of the element isolation region 103 in the memory cell region MA described with reference to FIGS. 11 to 15, the photoresist PR1 is provided as positions to be located later between the adjacent gate electrodes GE (FIGS. 57 and 58). FIGS. 57 and 58 are cross-sectional views showing the manufacturing process of the semiconductor device in Embodiment 4.

As a result, the protruding portions (non-lowered portions) h are formed between the regions where the gate electrodes GE are to be formed.

Subsequently, in the same manner as in the case of Embodiment 1, the individual components can be formed.

For example, over the semiconductor substrate 100 (fins F), the gate insulating film GI made of a silicon dioxide film is formed by thermal oxidation. Then, over the gate insulating film GI, a polysilicon film for the gate electrodes GE is formed, and a silicon nitride film is further formed thereover. Subsequently, using a photolithographic technique and a dry etching technique, a multi-layer film including the polysilicon film and the silicon nitride film is processed, and then the silicon nitride film is removed by, e.g., wet etching. Note that, when the MISFETs are not mounted in mixed relation with the memory cells, the formation of the foregoing silicon nitride film over the polysilicon film can be omitted. Then, the source/drain regions SD are formed.

For example, using the gate electrodes GE as a mask, an n-type impurity such as arsenic (As) or phosphorus (P) is implanted into the semiconductor substrate 100 (fins F) to form the n⁻-type semiconductor regions 119a. Then, over the side-wall portions of the gate electrodes GE, the side-wall insulating films SW are formed. Then, using the gate electrodes GE and the side-wall insulating films SW as a mask, an n-type impurity such as arsenic (As) or phosphorus (P) is implanted into the semiconductor substrate 100 (fins F) to form the n$^+$-type semiconductor regions 119b. Then, over the source/drain regions SD and the gate electrodes GE, using a salicide technique, the meal silicide films SIL are formed (see FIG. 52).

Then, over the gate electrodes GE, a silicon dioxide film is deposited as the interlayer insulating film IL1 using a CVD method or the like. Then, in the silicon dioxide film, the plugs P1 are formed and, over the plugs P1, the wires M1 are formed. The plugs P1 can be formed by, e.g., embedding a conductive film in contact holes in the interlayer insulating film IL1. The wires M1 can be formed by, e.g., embedding a conductive film in wire trenches in the interlayer insulating film IL2. Then, the steps of forming the interlayer insulating film, the plugs, and the wires are repeated to be able to form the interlayer insulating films IL3 and IL4, the plugs P2, and the wires M2 (see FIGS. 52 to 56).

By the foregoing steps, the semiconductor device in Embodiment 4 can be formed.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

For example, the configuration of the shunt region in Embodiment 3 may also be applied to that in Embodiment 2. Instead of the MISFETs in the peripheral circuit region PA in Embodiment 1, the MISFETs in Embodiment 4 may also be formed. When the gate electrodes GE in Embodiment 4 are extended to the shunt region (over to the element isolation region 103 between the active regions), the configuration of the shunt region in Embodiment 3 may also be used appropriately.

(Note 1)
A method of manufacturing a semiconductor device, comprising the steps of:
(a) forming an isolation trench in a region between a first fin formation region and a second fin formation region, of a semiconductor substrate having the first fin formation region extending in a first direction and the second fin formation region extending in the first direction and located to be spaced apart from a first fin;
(b) embedding a first insulating film in the isolation trench to form an element isolation region;
(c) covering a part of the element isolation region with a mask film and lowering a top surface of the element isolation region to form a first isolation region having a non-lowered surface and second isolation regions located on both sides of the first isolation region and each having a lowered surface; and
(d) forming a conductive film over the semiconductor substrate and processing the conductive film to form, over the first fin, one of the second isolation regions, and the second fin, a gate electrode extending in a second direction crossing the first direction and form, over the first fin, the other second isolation region, and the second fin, another gate electrode extending in the second direction along the gate electrode.

(Note 2)
The method of manufacturing the semiconductor device according to Note 1,
wherein, prior to the step (d), the non-lowered surface is higher in level than the lowered surface.

(Note 3)
The method of manufacturing the semiconductor device according to Note 1,
wherein the mask film in the step (c) extends in the second direction over the first fin, the element isolation region, and the second fin.

(Note 4)
A method of manufacturing a semiconductor device, comprising the steps of:
(a) forming an isolation trench in a region between a first fin formation region and a second fin formation region, of a semiconductor substrate having the first fin formation region extending in a first direction and the second fin formation region extending in the first direction and located to be spaced apart from a first fin;
(b) embedding an isolation insulating film in the isolation trench to form an element isolation region;
(c) covering a part of the element isolation region with a mask film and lowering a top surface of the element isolation region to form a first isolation region having a non-lowered surface and second isolation regions located on both sides of the first isolation region and each having a lowered surface; and
(d) forming a first conductive film over the semiconductor substrate via a first insulating film and processing the first conductive film to form, over the first fin, one of the second isolation regions, and the second fin, a first gate electrode extending in a second direction and form, over the first fin, the other second isolation region, and the second fin, another first gate electrode extending in the second direction along the first gate electrode.

(Note 5)
The method of manufacturing the semiconductor device according to Note 4,
wherein, by the step (d), the first isolation region having the non-lowered surface is disposed between the first gate electrode and the other first gate electrode.

(Note 6)
A method of manufacturing a semiconductor device, comprising the steps of:
(a) forming an isolation trench in a region between a first fin formation region and a second fin formation region, of a semiconductor substrate having the first fin formation region extending in a first direction and the second fin formation region extending in the first direction and located to be spaced apart from a first fin;
(b) embedding an isolation insulating film in the isolation trench to form an element isolation region;
(c) covering a part of the element isolation region with a mask film and lowering a top surface of the element isolation region to form a first isolation region having a non-lowered surface and second isolation regions located on both sides of the first isolation region and each having a lowered surface;
(d) forming a first conductive film over the semiconductor substrate via a first insulating film and processing the first conductive film to form, over the first fin, one of the second isolation regions, and the second fin, a first gate electrode extending in a second direction and form, over the first fin, the other second isolation region, and the second fin, another first gate electrode extending in the second direction along the first gate electrode; and
(e) forming a second conductive film over the semiconductor substrate via a second insulating film and processing the second conductive film to form a second gate electrode extending in the second direction along the first gate electrode and form another second gate electrode extending in the second direction along the other first gate electrode.

(Note 7)

The method of manufacturing the semiconductor device according to Note 6, wherein, in the step (e), the second gate electrode is formed into a sidewall shape over a side wall of the first gate electrode via the second insulating film.

(Note 8)

The method of manufacturing the semiconductor device according to Note 7, wherein, by the step (e), the first isolation region having the non-lowered surface is disposed between the second gate electrode and the other second gate electrode.

What is claimed is:

1. A semiconductor device, comprising:
a first fin having a cuboid shape and extending in a first direction;
a second fin having a cuboid shape and disposed to be spaced apart from the first fin and extend in the first direction;
an element isolation region disposed between the first and second fins;
a first gate electrode disposed over the first fin, the element isolation region, and the second fin via a first gate insulating film to extend in a second direction crossing the first direction; and
a second gate electrode disposed over the first fin, the element isolation region, and the second fin via a second gate insulating film to be spaced apart from the first gate electrode and extend in the second direction crossing the first direction,
wherein, in a first isolation region which is the element isolation region surrounded by the first and second fins and the first and second gate electrodes in plan view, a first isolation portion is provided,
wherein, in a second isolation region which is the element isolation region overlapping the first gate electrode in plan view, a second isolation portion is provided, and
wherein the first isolation portion is higher in level than the second isolation portion.

2. The semiconductor device according to claim 1,
wherein the first isolation portion extends in the second direction at a middle portion of the first isolation region.

3. The semiconductor device according to claim 2,
wherein the first isolation region has a third isolation portion on each of both sides of the first isolation portion, and
wherein the first isolation portion is higher in level than the third isolation portion.

4. The semiconductor device according to claim 1,
wherein a top surface of the first isolation portion is lower in level than a top surface of the first fin under the first gate electrode, and
wherein a level difference therebetween is a first height difference.

5. The semiconductor device according to claim 4,
wherein a top surface of the second isolation portion is lower in level than the top surface of the first fin under the first gate electrode, and
wherein a level difference therebetween is a second height difference.

6. The semiconductor device according to claim 5,
wherein the first height difference is smaller than the second height difference.

7. A semiconductor device, comprising:
a first fin having a cuboid shape and extending in a first direction;
a second fin having a cuboid shape and disposed to be spaced apart from the first fin and extend in the first direction;
an element isolation region disposed between the first and second fins;
a first gate electrode extending in a second direction crossing the first direction over the first fin, the element isolation region, and the second fin;
a second gate electrode extending in the second direction over the first fin, the element isolation region, and the second fin so as to be adjacent to the first gate electrode;
a first insulating film formed between the first gate electrode and the first fin;
a second insulating film formed between the second gate electrode and the first fin and between the first and second gate electrodes and having an internal charge storage portion; and
another second gate electrode extending in the second direction along the second gate electrode over the first fin, the element isolation region, and the second fin,
wherein, in a first isolation region which is the element isolation region surrounded by the first and second fins, the second gate electrode, and the other second gate electrode in plan view, a first isolation portion is provided,
wherein, in a second isolation region which is the element isolation region overlapping the second gate electrode in plan view, a second isolation portion is provided, and
wherein the first isolation portion is higher in level than the second isolation portion.

8. The semiconductor device according to claim 7,
wherein the first isolation portion extends in the second direction at a middle portion of the first isolation region.

9. The semiconductor device according to claim 8,
wherein the first isolation region has a third isolation portion on each of both sides of the first isolation portion, and
wherein the first isolation portion is higher in level than the third isolation portion.

10. The semiconductor device according to claim 7,
wherein a top surface of the first isolation portion is lower in level than a top surface of the first fin under the second gate electrode, and
wherein a level difference therebetween is a first height difference.

11. The semiconductor device according to claim 10,
wherein a top surface of the second isolation portion is lower in level than the top surface of the first fin under the first gate electrode, and
wherein a level difference therebetween is a second height difference.

12. The semiconductor device according to claim 11,
wherein the first height difference is smaller than the second height difference.

13. The semiconductor device according to claim 7, further comprising:
another first gate electrode extending in the second direction along the first gate electrode over the first fin, the element isolation region, and the second fin,
wherein, in a fourth isolation region which is the element isolation region surrounded by the first and second fins, the first gate electrode, and the other first gate electrode in plan view, a fourth isolation portion is provided, wherein, in a fifth isolation region which is the element isolation region overlapping the first gate electrode in plan view, a fifth isolation portion is provided, and wherein the fourth isolation portion is higher in level than the fifth isolation portion.

14. The semiconductor device according to claim 7, further comprising:
a first memory block region;
a second memory block region; and
a shunt region which is an isolation region between the first and second memory block regions,
wherein the first and second gate electrodes extend over the first memory block region, the shunt region, and the second memory block region, and
wherein a sixth isolation portion in the shunt region is higher in level than the second isolation portion.

15. A semiconductor device, comprising:
a first fin having a cuboid shape and extending in a first direction;
a second fin having a cuboid shape and disposed to be spaced apart from the first fin and extend in the first direction;
an element isolation region disposed between the first and second fins;
a first gate electrode extending in a second direction crossing the first direction over the first fin, the element isolation region, and the second fin;
a second gate electrode extending in the second direction over the first fin, the element isolation region, and the second fin so as to be adjacent to the first gate electrode;
a first insulating film formed between the first gate electrode and the first fin;
a second insulating film formed between the second gate electrode and the first fin and between the first and second gate electrodes and having an internal charge storage portion; and
another first gate electrode extending in the second direction along the first gate electrode over the first fin, the element isolation region, and the second fin,
wherein, in a first isolation region which is the element isolation region surrounded by the first and second fins, the first gate electrode, and the other first gate electrode in plan view, a first isolation portion is provided,
wherein, in a second isolation region which is the element isolation region overlapping the first gate electrode in plan view, a second isolation portion is provided, and
wherein the first isolation portion is higher in level than the second isolation portion.

16. The semiconductor device according to claim 15,
wherein the first isolation portion extends in the second direction at a middle portion of the first isolation region.

17. The semiconductor device according to claim 16,
wherein the first isolation region has a third isolation portion on each of both sides of the first isolation portion, and
wherein the first isolation portion is higher in level than the third isolation portion.

18. The semiconductor device according to claim 17,
wherein a top surface of the first isolation portion is lower in level than a top surface of the first fin under the first gate electrode, and
wherein a level difference therebetween is a first height difference.

19. The semiconductor device according to claim 18,
wherein a top surface of the second isolation portion is lower in level than the top surface of the first fin under the first gate electrode, and
wherein a level difference therebetween is a second height difference.

20. The semiconductor device according to claim 19,
wherein the first height difference is smaller than the second height difference.

* * * * *